United States Patent
Hwang et al.

(10) Patent No.: US 10,622,568 B2
(45) Date of Patent: Apr. 14, 2020

(54) CONDENSED CYCLIC COMPOUND AND ORGANIC LIGHT-EMITTING DEVICE INCLUDING THE SAME

(71) Applicants: Samsung Electronics Co., Ltd., Suwon-si, Gyeonggi-do (KR); CHEIL INDUSTRIES INC., Gumi-si, Gyeongsangbuk-do (KR)

(72) Inventors: Kyu-young Hwang, Ansan-si (KR); O-hyun Kwon, Yongin-si (KR); Byoung-ki Choi, Hwaseong-si (KR)

(73) Assignees: SAMSUNG ELECTRONICS CO., LTD., Gyeonggi-Do (KR); CHEIL INDUSTRIES INC., Gumi-si (KR)

( * ) Notice: Subject to any disclaimer, the term of this patent is extended or adjusted under 35 U.S.C. 154(b) by 553 days.

(21) Appl. No.: 14/460,396

(22) Filed: Aug. 15, 2014

(65) Prior Publication Data
US 2015/0194610 A1  Jul. 9, 2015

(30) Foreign Application Priority Data
Jan. 6, 2014 (KR) .................... 10-2014-0001510

(51) Int. Cl.
*H01L 51/00* (2006.01)
*H01L 51/50* (2006.01)

(52) U.S. Cl.
CPC ...... *H01L 51/0072* (2013.01); *H01L 51/0067* (2013.01); *H01L 51/5016* (2013.01);
(Continued)

(58) Field of Classification Search
None
See application file for complete search history.

(56) References Cited

U.S. PATENT DOCUMENTS 5,929,235 A   7/1999 Sato
6,310,231 B1  10/2001 Igarashi et al.
(Continued)

FOREIGN PATENT DOCUMENTS

JP  2000-178273 A    6/2000
JP  2000268975 A  *  9/2000
(Continued)

OTHER PUBLICATIONS

Machine English translation of Igarashi (JP 2002-235075 A). Dec. 31, 2016.*
(Continued)

*Primary Examiner* — Jay Yang
(74) *Attorney, Agent, or Firm* — Cantor Colburn LLP

(57) ABSTRACT

A condensed cyclic compound represented by one of Formulae 1A to 1D:

Formula 1A (Continued)

-continued

Formula 1B

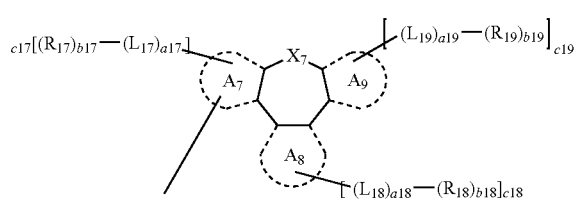

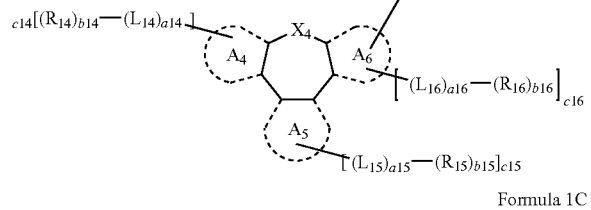

Formula 1C

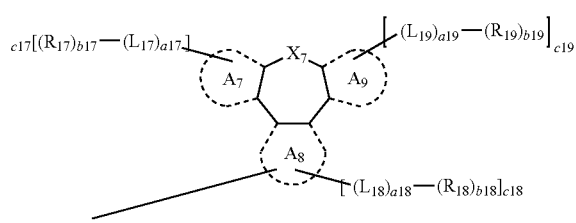

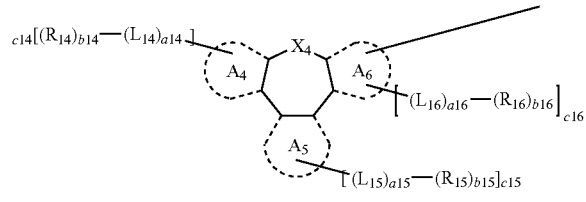

Formula 1D

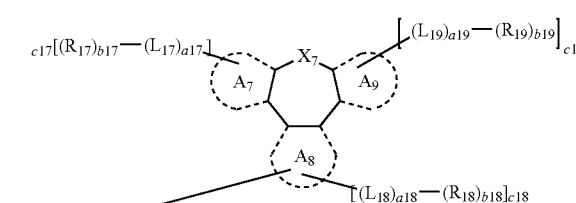

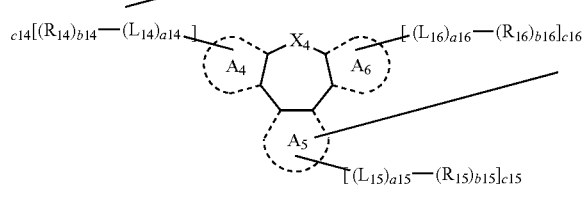

wherein in Formulae 1A to 1D, groups, substituents, and variables are as defined in the specification.

16 Claims, 1 Drawing Sheet

(52) U.S. Cl.
CPC ...... *H01L 51/5056* (2013.01); *H01L 51/5064* (2013.01); *H01L 51/5096* (2013.01); *H01L 2251/552* (2013.01)

(56) References Cited

U.S. PATENT DOCUMENTS

| | | | |
|---|---|---|---|
| 6,476,221 B1 * | 11/2002 | Sato | C07D 223/14 |
| | | | 540/576 |
| 6,824,891 B2 | 11/2004 | Okada et al. | |
| 6,878,822 B2 | 4/2005 | Sato | |
| 7,118,811 B2 | 10/2006 | Ise et al. | |
| 7,456,567 B2 | 11/2008 | Ogasawara | |
| 7,527,878 B2 | 5/2009 | Ogasawara et al. | |
| 7,727,640 B2 | 6/2010 | Tada et al. | |
| 7,803,468 B2 | 9/2010 | Nariyuki et al. | |
| 7,976,739 B2 | 7/2011 | Izumi et al. | |
| 8,349,827 B2 | 1/2013 | Tandon et al. | |
| 8,378,339 B2 | 2/2013 | Nomura et al. | |
| 2005/0158582 A1 | 7/2005 | Ise et al. | |
| 2008/0035965 A1 | 2/2008 | Hayashi et al. | |
| 2008/0191618 A1 | 8/2008 | Mishima | |
| 2010/0108997 A1 | 5/2010 | Kim et al. | |
| 2012/0080585 A1 | 4/2012 | Fukuzaki et al. | |
| 2012/0080675 A1 | 4/2012 | Nakatani et al. | |
| 2013/0119355 A1 | 5/2013 | Han et al. | |
| 2016/0308146 A1 * | 10/2016 | Parham | C07D 313/06 |
| 2016/0322583 A1 * | 11/2016 | Kim | H01L 51/0067 |

FOREIGN PATENT DOCUMENTS

| | | | |
|---|---|---|---|
| JP | 2002235075 A | * | 8/2002 |
| JP | 2012-094810 A | | 5/2012 |
| KR | 1020100041043 A | | 4/2010 |
| KR | 10-2011-0008 | * | 1/2011 |
| KR | 1020110008629 A | | 1/2011 |
| KR | 1020120034053 A | | 4/2012 |
| KR | 1020120081539 A | | 7/2012 |
| KR | 10-2013-0051807 A | | 5/2013 |
| WO | 2008-023828 A1 | | 2/2008 |
| WO | 2011055912 A1 | | 5/2011 |
| WO | 2013020631 A1 | | 2/2013 |
| WO | WO-2015082046 A2 | * | 6/2015 |
| WO | WO-2015099481 A1 | * | 7/2015 |

OTHER PUBLICATIONS

Machine English translation of Kim et al. (KR 10-2011-0008619). Dec. 31, 2016.*
Machine English translation of Sato et al. (JP 2000-268975 A). Jun. 2, 2017.*
Luo et al. (J. Am. Chem. Soc. 2012, 134, p. 13796).*

* cited by examiner

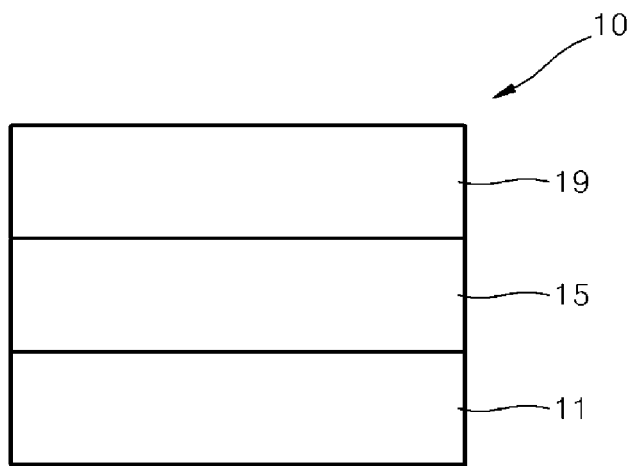

CONDENSED CYCLIC COMPOUND AND ORGANIC LIGHT-EMITTING DEVICE INCLUDING THE SAME

CROSS-REFERENCE TO RELATED APPLICATIONS

This application claims priority to Korean Patent Application No. 10-2014-0001510, filed on Jan. 6, 2014, and all the benefits accruing therefrom under 35 U.S.C. § 119, the content of which is incorporated herein in its entirety by reference.

BACKGROUND

1. Field

The present disclosure relates to condensed cyclic compounds and organic light-emitting devices including the same.

2. Description of the Related Art

Organic light emitting devices (OLEDs) are self-emission devices that have wide viewing angles, high contrast ratios, and short response time. In addition, OLEDs have excellent brightness, driving voltage, and response speed characteristics, and produce full-color images.

As an example, a typical organic light-emitting device includes an anode, a cathode, and an emission layer that is disposed between the anode and the cathode. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons are recombined in the emission layer to produce excitons. These excitons change from an excited state to a ground state, thereby generating light.

Different types of organic light emitting devices are known. However, there still remains a need in OLEDs having low driving voltage, high efficiency, high brightness, and long lifespan.

SUMMARY

Provided are novel condensed cyclic compounds and organic light-emitting devices including the same.

Additional aspects will be set forth in part in the description which follows and, in part, will be apparent from the description, or may be learned by practice of the presented embodiments.

According to an aspect, a condensed cyclic compound is represented by one of Formulae 1A to 1D below:

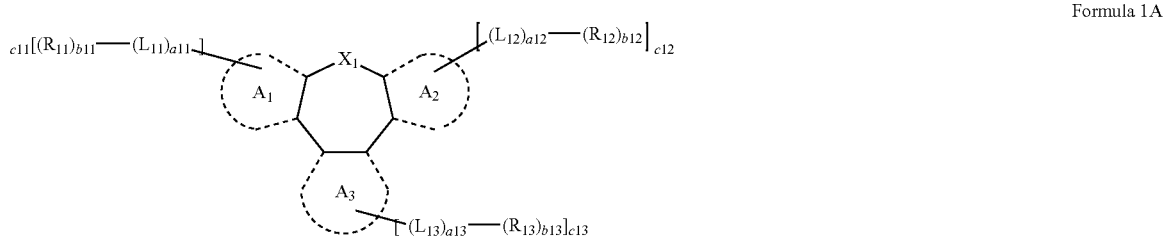

Formula 1A

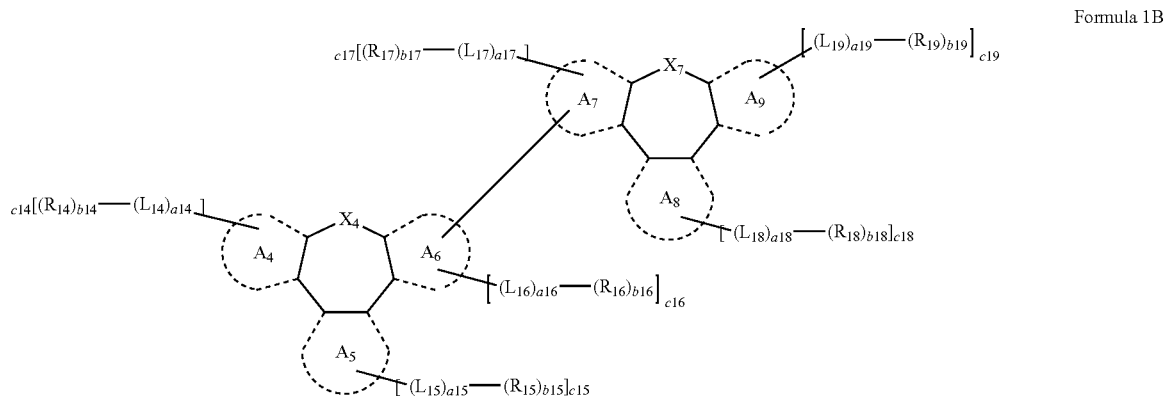

Formula 1B

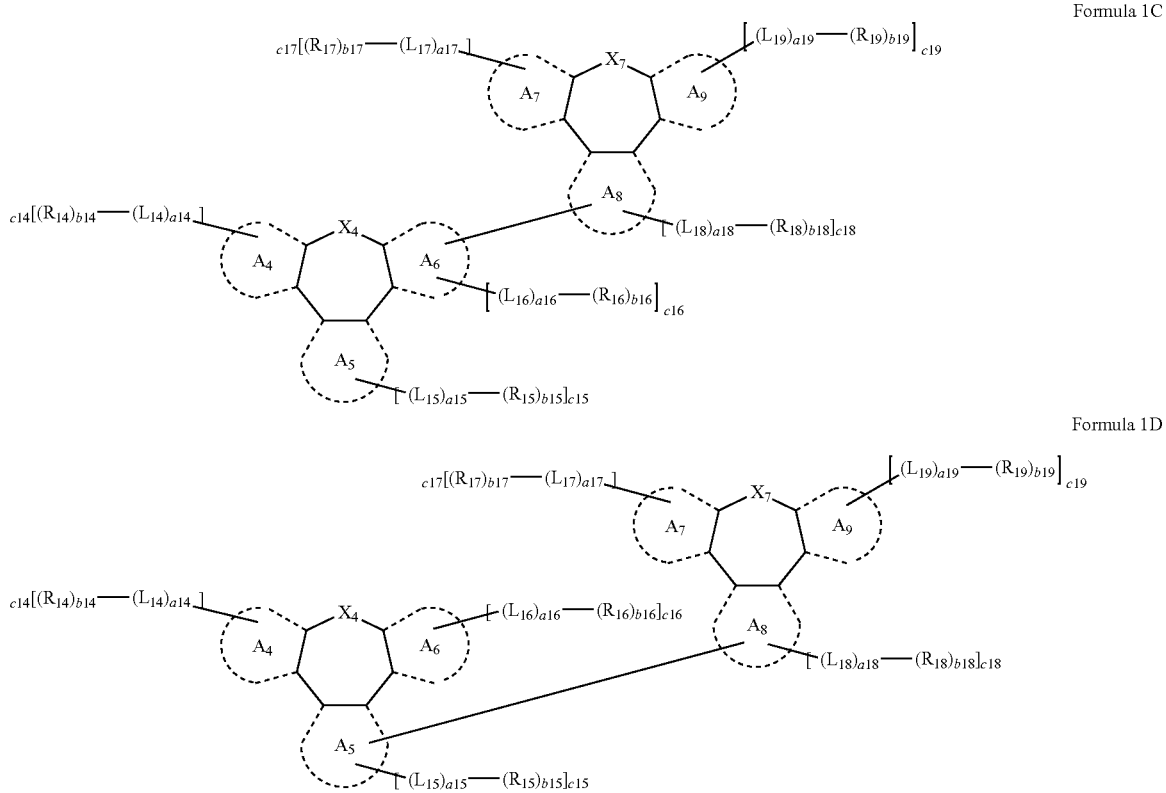

Formula 1C

Formula 1D wherein in Formulae 1A to 1D, $A_1$ to $A_9$ may be each independently a group derived from a benzene, a naphthalene, a pyrene, a fluorene, a pyridine, a pyrimidine, a pyrazine, or a carbazole;

$X_1$ may be N-$[(L_1)_{a1}$-$(R_1)_{b1}]$, C$[(L_2)_{a2}$-$(R_2)_{b2}][(L_3)_{a3}$-$(R_3)_{b3}]$, Si$[(L_2)_{a2}$-$(R_2)_{b2}][(L_3)_{a3}$-$(R_2)_{b3}]$, S, O, S(=O), or S(=O)$_2$;

$X_4$ may be N-$[(L_4)_{a4}$-$(R_4)_{b4}]$, C$[(L_5)_{a5}$-$(R_5)_{b5}][(L_6)_{a6}$-$(R_6)_{b6}]$, Si$[(L_5)_{a5}$-$(R_5)_{b5}][(L_6)_{a6}$-$(R_6)_{b6}]$, S, O, S(=O), or S(=O)$_2$;

$X_7$ may be N-$[(L_7)_{a7}$-$(R_7)_{b7}]$, C$[(L_8)_{a8}$-$(R_8)_{b8}][(L_9)_{a9}$-$(R_9)_{b9}]$, Si$[(L_8)_{a8}$-$(R_8)_{b8}][(L_9)_{a9}$-$(R_9)_{b9}]$, S, O, S(=O), or S(=O)$_2$;

$L_1$ to $L_9$ and $L_{11}$ to $L_{19}$ may be each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted $C_2$-$C_{60}$ heteroarylene group, a substituted or unsubstituted divalent non-aromatic condensed polycyclic group, or a substituted or unsubstituted divalent non-aromatic hetero-condensed polycyclic group;

a1 to a9 and a11 to a19 may be each independently an integer of 0 to 5;

$R_1$ to $R_9$ and $R_{11}$ to $R_{19}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, a substituted or unsubstituted monovalent non-aromatic hetero-condensed polycyclic group, —N($Q_1$)($Q_2$), —Si($Q_3$)($Q_4$)($Q_5$), or —B($Q_6$)($Q_7$);

provided that when each of $A_1$ to $A_3$ in Formula 1A is a group derived from a benzene, at least one of $R_{11}$ to $R_{13}$ may be a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group;

b1 to b9 and b11 to b19 may be each independently an integer of 1 to 5;

c11 to c19 may be each independently 1, 2, 3, or 4;

at least one of substituents of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic hetero-condensed polycyclic group may be a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —N($Q_{21}$)($Q_{22}$), —Si($Q_{23}$)($Q_{24}$)($Q_{25}$) and —B($Q_{26}$)($Q_{27}$); or —N($Q_{31}$)($Q_{32}$), —Si($Q_{33}$)($Q_{34}$)($Q_{35}$), or —B($Q_{36}$)($Q_{37}$); wherein $Q_1$ to $Q_7$, $Q_{11}$ to $Q_{17}$, $Q_{21}$ to $Q_{27}$, and $Q_{31}$ to $Q_{37}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group.

Another aspect provides an organic light-emitting device including:

a first electrode;

a second electrode; and an organic layer disposed between the first electrode and the second electrode, wherein the organic layer includes an emission layer, and at least one of the condensed cyclic compound represented by one of Formulae 1A to 1D.

BRIEF DESCRIPTION OF THE DRAWINGS

These and/or other aspects will become apparent and more readily appreciated from the following description of the embodiments, taken in conjunction with the FIGURE that is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a condensed cyclic compound is represented by one of Formula 1A to 1D:

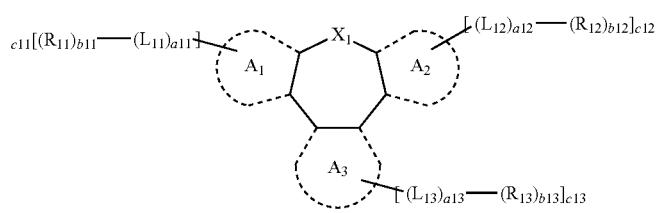

Formula 1A

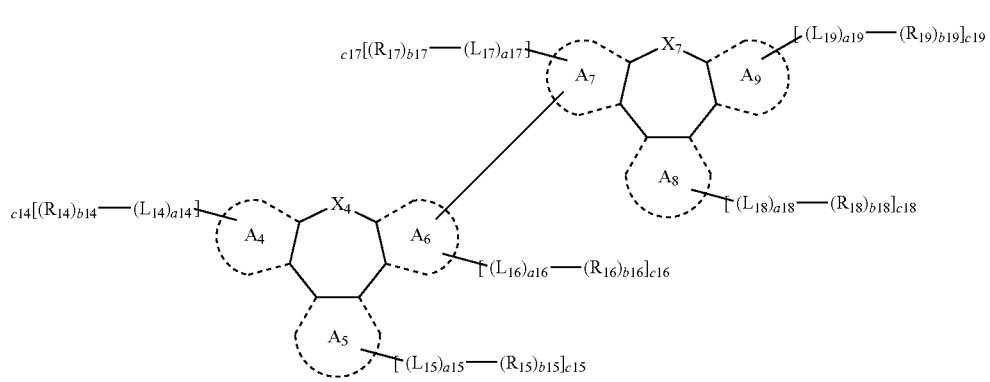

Formula 1B

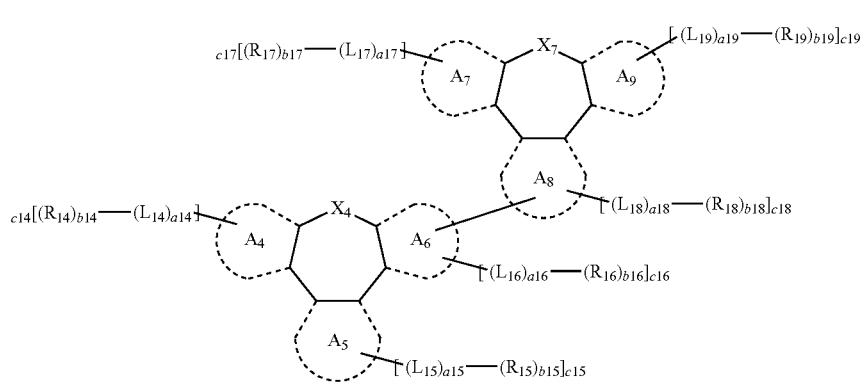

Formula 1C

Formula 1D

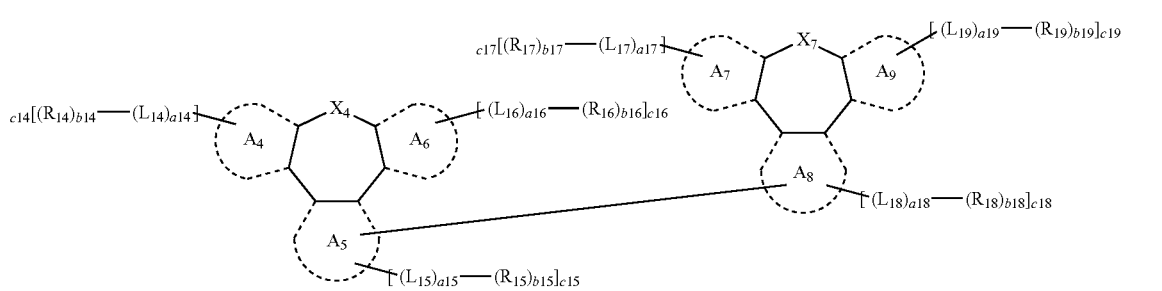

A₁ to A₉ in Formulae 1A to 1D may be each independently a group derived from a benzene, a naphthalene, a pyrene, a fluorene, a pyridine, a pyrimidine, a pyrazine, or a carbazole.

According to an embodiment, $A_1$ to $A_9$ in Formulae 1A to 1D may be each independently a group derived from a benzene, a naphthalene, or a carbazole, but are not limited thereto.

According to other embodiments, $A_1$ to $A_9$ in Formulae 1A to 1D may be each independently a group derived from a benzene or a carbazole, but are not limited thereto.

$A_1$ to $A_9$ in Formulae 1A to 1D indicate rings that are condensed with adjacent 7-membered cycles in cores of Formula 1A to 1D sharing carbon atoms.

$A_1$ in Formulae 1A to 1D is substituted with groups $-(L_{11})a_{11}-(R_{11})b_{11}$ in which the number of $-(L_{11})a_{11}-(R_{11})b_{11}$ is indicated as c11. Substituents of $A_2$ to $A_9$ may also be understood in the same manner as described above.

In Formulae 1A to 1D, $X_1$ may be $N-[(L_1)_{a1}-(R_1)_{b1}]$, $C[(L_2)_{a2}-(R_2)_{b2}][(L_3)_{a3}-(R_3)_{b3}]$, $Si[(L_2)_{a2}-(R_2)_{b2}][(L_3)_{a3}-(R_3)_{b3}]$, S, O, S(=O), or $S(=O)_2$;

$X_4$ may be $N-[(L_4)_{a4}-(R_4)_{b4}]$, $C[(L_5)_{a5}-(R_5)_{b5}][(L_6)_{a6}-(R_6)_{b6}]$, $Si[(L_5)_{a5}-(R_5)_{b5}][(L_6)_{a6}-(R_6)_{b6}]$, S, O, S(=O), or $S(=O)_2$;

$X_7$ may be $N-[(L_7)_{a7}-(R_7)_{b7}]$, $C[(L_8)_{a8}-(R_8)_{b8}][(L_9)_{a9}-(R_9)_{b9}]$, $Si[(L_8)_{a8}-(R_8)_{b8}][(L_9)_{a9}-(R_9)_{b9}]$, S, O, S(=O), or $S(=O)_2$;

According to an embodiment, in Formulae 1A to 1D, $X_1$ may be $N-[(L_1)_{a1}-(R_1)_{b1}]$, $X_4$ may be $N-[(L_4)_{a4}-(R_4)_{b4}]$, and $X_7$ may be $N-[(L_7)_{a7}-(R_7)_{b7}]$, but they are not limited thereto.

According to an embodiment, $L_1$ to $L_9$ and $L_{11}$ to $L_{19}$ in Formulae 1A to 1D may be each independently a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolyl group, a dibenzocarbazolyl group, an imidazopyrimidinylene group, or an imidazopyridinylene group; or a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolyl group, a dibenzocarbazolyl group, an imidazopyrimidinylene group, or an imidazopyridinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, an imidazopyridinyl group, and —Si($Q_{33}$)($Q_{34}$)($Q_{35}$), wherein $Q_{33}$ to $Q_{35}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a pyrenyl group, a pyridinyl group, a pyrazinyl group, a pyrimidinyl group, a pyridazinyl group, a quinolinyl group, an isoquinolinyl group, a quinazolinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, or an imidazopyridinyl group.

According to other embodiments, $L_1$ to $L_9$ and $L_{11}$ to $L_{19}$ in Formulae 1A to 1D may be each independently selected from Formulae 2-1 to 2-34 illustrated below:

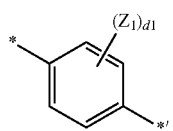

Formula 2-1

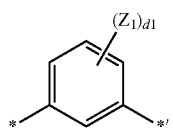

Formula 2-2

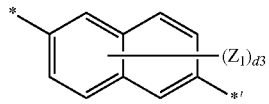

Formula 2-3

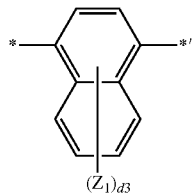

Formula 2-4

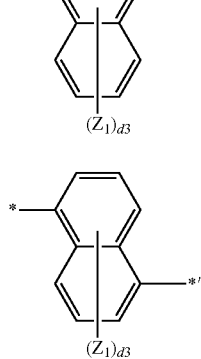

Formula 2-5

-continued

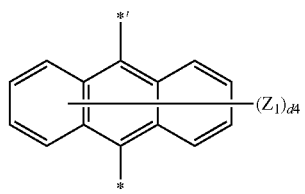

Formula 2-6

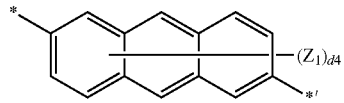

Formula 2-7

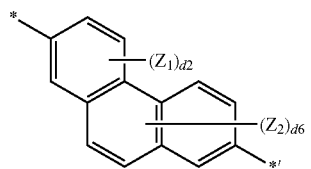

Formula 2-8

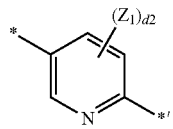

Formula 2-9

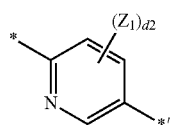

Formula 2-10

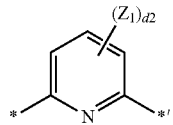

Formula 2-11

Formula 2-12

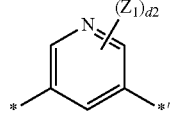

Formula 2-13

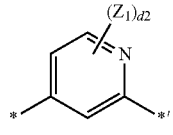

Formula 2-14

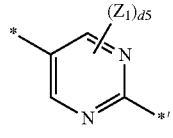

Formula 2-15

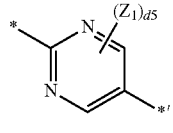

Formula 2-16

-continued

Formula 2-17 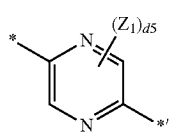

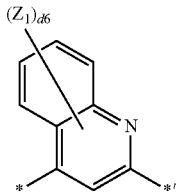

Formula 2-18 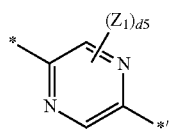

Formula 2-28 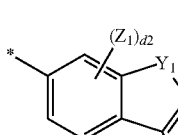

Formula 2-19 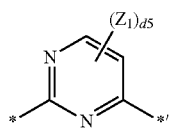

Formula 2-29 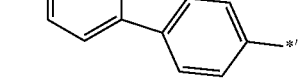

Formula 2-20 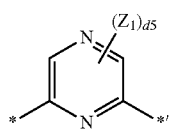

Formula 2-30 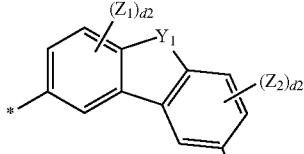

Formula 2-21 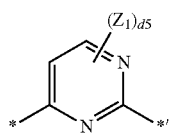

Formula 2-22 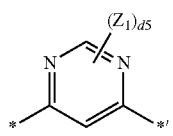

Formula 2-31 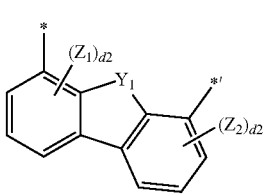

Formula 2-23 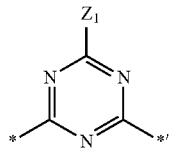

Formula 2-32 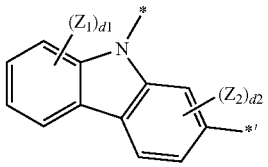

Formula 2-24 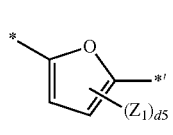

Formula 2-25 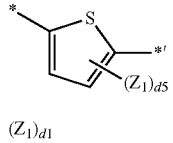

Formula 2-33 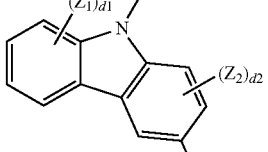

Formula 2-26 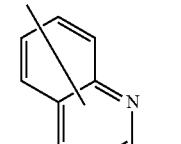

Formula 2-34 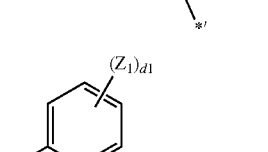

Formula 2-27 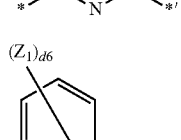

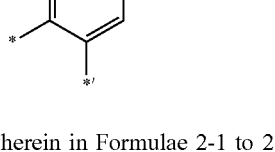

wherein in Formulae 2-1 to 2-34, $Y_1$ may be O, S, S(=O), S(=O)$_2$, C($Z_3$)($Z_4$), N($Z_5$), or Si($Z_6$)($Z_7$);

$Z_1$ to $Z_7$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, an imidazopyridinyl group, or —Si($Q_{33}$)($Q_{34}$)($Q_{35}$);

wherein $Q_{33}$ to $Q_{35}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a pyrenyl group, a pyridinyl group, a pyrazinyl group, a pyrimidinyl group, a pyridazinyl group, a quinolinyl group, an isoquinolinyl group, a quinazolinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, or an imidazopyridinyl group;

d1 may be an integer of 1 to 4;
d2 may be an integer of 1 to 3;
d3 may be an integer of 1 to 6;
d4 may be an integer of 1 to 8;
d5 may be an integer of 1 or 2;
d6 may be an integer of 1 to 5; and
* and *' may each indicate a binding site to a neighboring atom.

For example,
* in Formulae 2-1 to 2-34 indicates a binding site to either a core of Formulae 1A to 1D or each of neighboring $L_1$ to $L_9$ and $L_{11}$ to $L_{19}$, and

*' in Formulae 2-1 to 2-34 indicates a binding site to either each of neighboring $L_1$ to $L_9$ and $L_{11}$ to $L_{19}$ or each of $R_1$ to $R_9$ and $R_{11}$ to $R_{19}$.

According to other embodiments, $L_1$ to $L_9$ and $L_{11}$ to $L_{19}$ in Formulae 1A to 1D may be each independently represented by one of Formulae 3-1 to 3-39 illustrated below, but formulae representing them are not limited thereto:

Formula 3-1

Formula 3-2

Formula 3-3

Formula 3-4

Formula 3-5
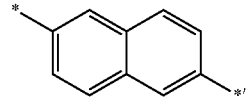

Formula 3-6
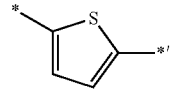

Formula 3-7
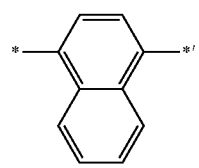

Formula 3-8
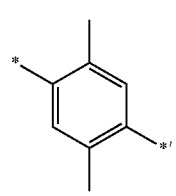

Formula 3-9
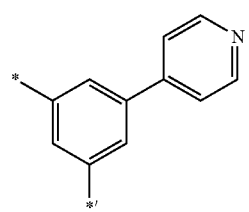

Formula 3-10
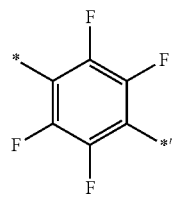

Formula 3-11
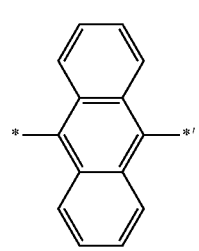

Formula 3-12
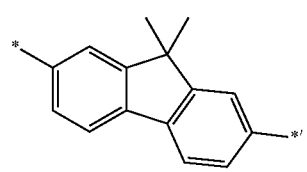

Formula 3-13
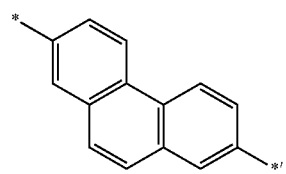

-continued
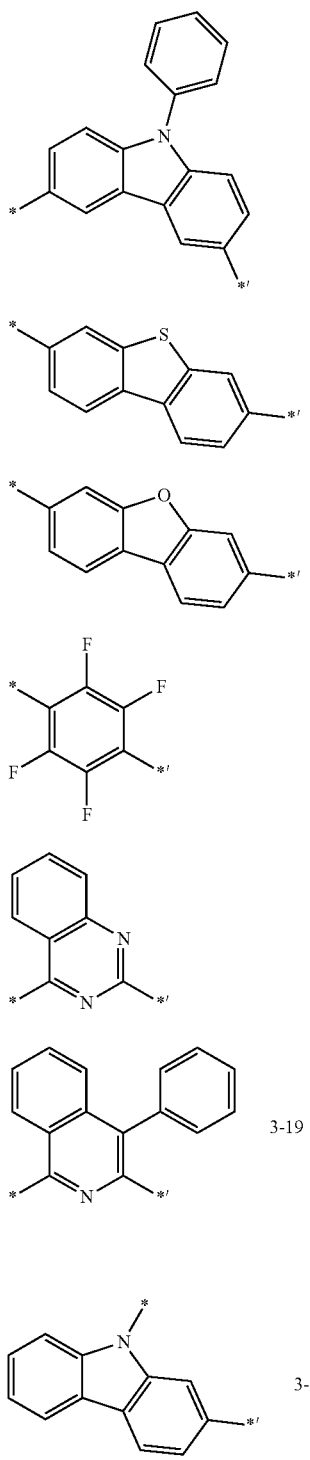
3-19
3-20
Formula 3-14
Formula 3-15
Formula 3-16
Formula 3-17
Formula 3-18
Formula 3-19
Formula 3-20
Formula 3-21
-continued
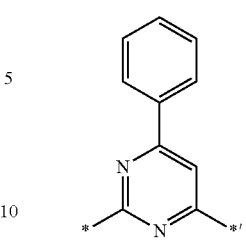
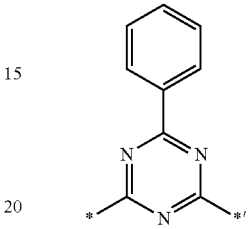
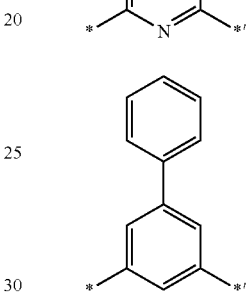
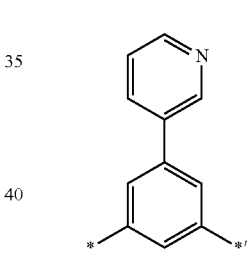
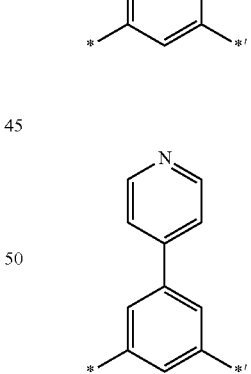
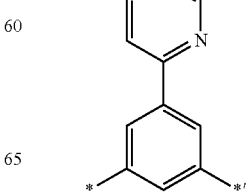
Formula 3-22
Formula 3-23
Formula 3-24
Formula 3-25
Formula 3-26
Formula 3-27

Formula 3-28
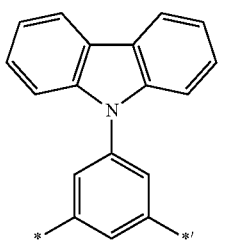

Formula 3-29
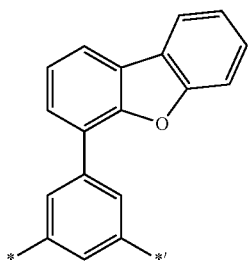

Formula 3-30
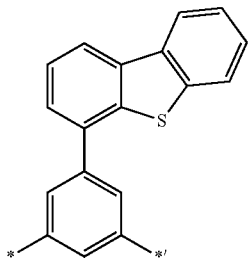

Formula 3-31
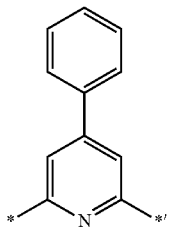

Formula 3-32
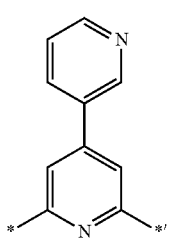

Formula 3-33
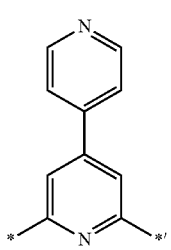

Formula 3-34
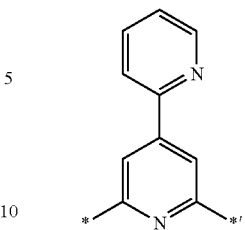

Formula 3-35
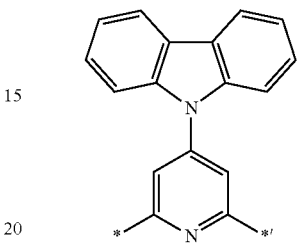

Formula 3-36
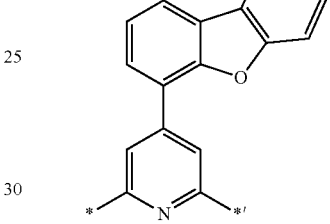

Formula 3-37
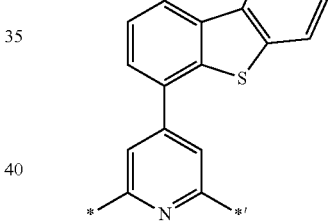

Formula 3-38
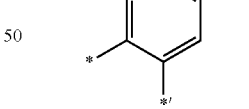

Formula 3-39

Symbols * and *' in Formulae 3-1 to 3-39 each indicates a binding site to a neighboring atom.

Variable a1 in Formula 1A indicates the number of $L_1$, and may be 0, 1, 2, 3, 4 or 5, for example, 0, 1 or 2, or for example, 0 or 1. When a1 is 0, $*\text{-}(L_1)_{a1}\text{-}*'$ is a single bond. When a1 is 2 or more, groups $L_1$ may be identical or different. Variables a4 and a7 in Formulae 1B to 1D may be understood by referring to the description made in connection with a1 and Formulae 1B to 1D.

Variable a2 in Formula 1A indicates the number of $L_2$, and may be 0, 1, 2, 3, 4 or 5, for example, 0, 1 or 2, or for example, 0 or 1. When a2 is 0, $*\text{-}(L_2)_{a2}\text{-}*'$ is a single bond. When a2 is 2 or more, groups $L_2$ may be identical or different. Variables a3, a5, a6, a8, and a9 in Formulae 1A to 1D may be understood by referring to the description provided in connection with a2 and Formulae 1A to 1D.

Variable a11 in Formula 1A indicates the number of $L_{11}$, and may be 0, 1, 2, 3, 4 or 5, for example, 0, 1 or 2. When a11 is 0, *-$(L_{11})_{a11}$-*' is a single bond. When a11 is 2 or more, groups $L_{11}$ may be identical or different. Variables a12 to a19 in Formulae 1A to 1D may be understood by referring to the description made in connection with a11.

According to an embodiment, $L_1$ to $L_9$ and $L_{11}$ to $L_{19}$ in Formulae 1A to 1D may be each independently a phenylene group or a phenyl group-substituted phenylene group, and a1 to a9 and a11 to a19 may be each independently 0, 1, or 2.

According to other embodiments, *-$(L_1)_{a1}$-*', *-$(L_2)_{a2}$-*', *-$(L_3)_{a3}$-', *-$(L_4)_{a4}$-*', *-$(L_5)_{a5}$-*', *-$(L_6)_{a6}$-*', *-$(L_7)_{a7}$-', *-$(L_8)_{a8}$-*', *-$(L_9)_{a9}$-*', *-$(L_{11})_{a11}$-*', *-$(L_{12})_{a12}$-*', *-$(L_{13})_{a13}$-*', *-$(L_{14})_{a14}$-*', *-$(L_{15})_{a15}$-*', *-$(L_{16})_{a16}$-', *-$(L_{17})_{a17}$-*', *-$(L_{18})_{a18}$-*', and *-$(L_{19})_{a19}$-*' in Formulae 1A to 1D may be each independently selected from a single bond and the following structures, but are not limited thereto:

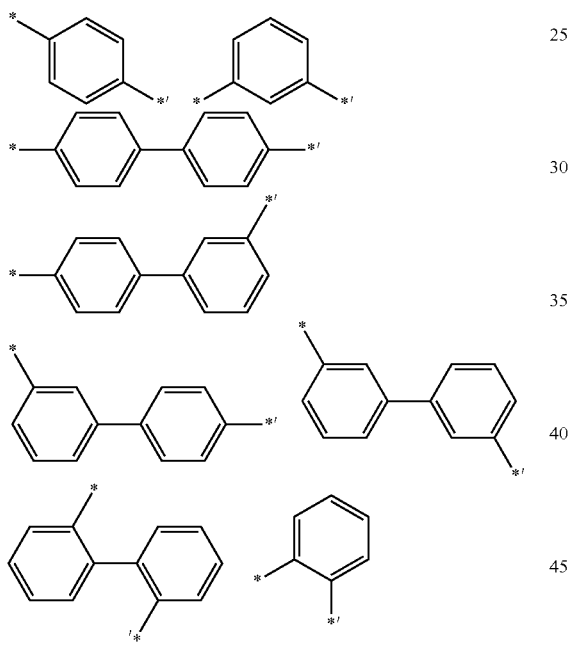

$R_1$, $R_4$, and $R_7$ in Formulae 1A to 1D may be each independently a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a anthracenyl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthroli-nyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

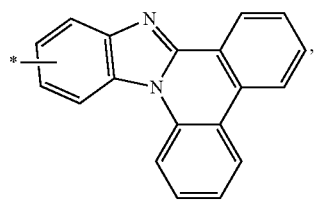

a group represented by

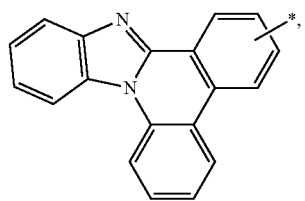

or a group represented by

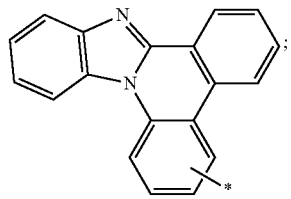

or a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a anthracenyl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthroli-nyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

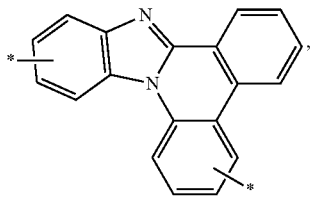

a group represented by

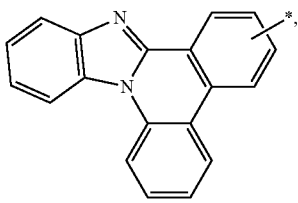

or a group represented by

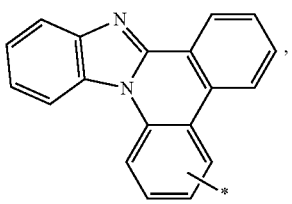

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group.

According to another embodiment, $R_2$, $R_3$, $R_5$, $R_6$, $R_8$, $R_9$, and $R_{11}$ to $R_{19}$ in Formulae 1A to 1D may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthrenyl group, a triphenylenyl group, a pyrenyl group, a chrysenyl group, a naphthacenyl group, a picenyl group, a perilenyl group, a pentaphenyl group, a hexacenyl group, a pyrrolyl group, an imidazolyl group, pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthridinyl group, a quinoxalinyl group, a quinazolinyl group, a cynolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

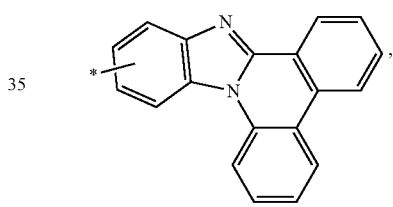

a group represented by

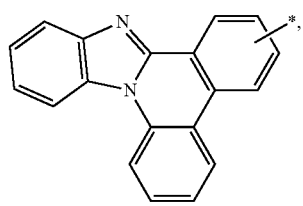

or a group represented by

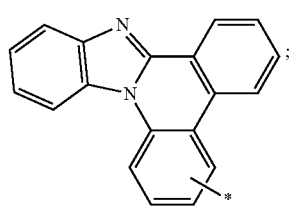

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a anthracenyl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

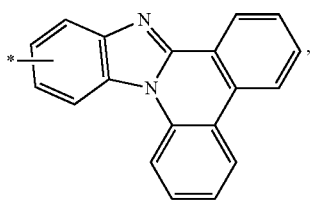

a group represented by

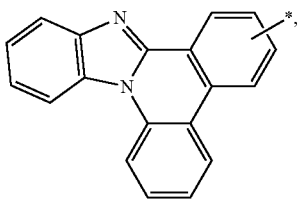

or a group represented by

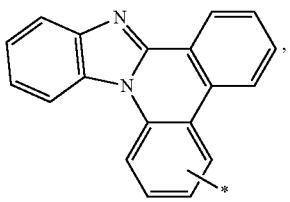

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group; or —N($Q_1$)($Q_2$), or —Si($Q_3$)($Q_4$)($Q_5$) (wherein, $Q_1$ to $Q_5$ are each independently a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group a phthalazinyl group, a quinoxalinyl group, a cynolinyl group, or a quinazolinyl group);

provided that when each of $A_1$ to $A_3$ in Formula 1 is a group derived from a benzene, at least one of $R_{11}$ to $R_{13}$ may be a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthridinyl group, a quinoxalinyl group, a quinazolinyl group, a cynolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

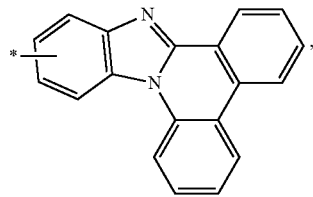

a group represented by

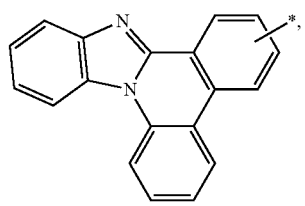

or a group represented by

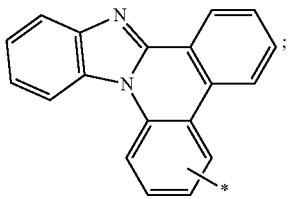

or a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

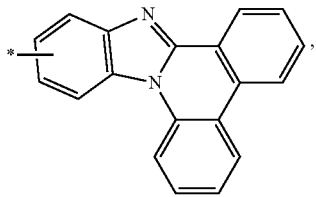

a group represented by

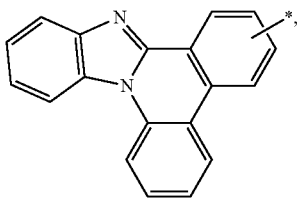

or a group represented by

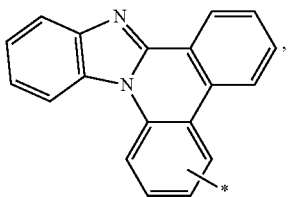

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group.

When each of $A_1$ to $A_3$ in Formula 1A is a group derived from a benzene, at least one of $R_{11}$ to $R_{13}$ may be a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group.

In other embodiments, regardless $A_1$ to $A_3$ in Formula 1A, at least one of $R_{11}$ to $R_{13}$ may be a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group.

According to another embodiment, in Formulae 1A and 1D, $R_1$, $R_4$, and $R_7$ may be each independently represented by one of Formulae 4-1 to 4-32 below;

$R_2$, $R_3$, $R_5$, $R_6$, $R_8$, $R_9$, $R_{11}$ to $R_{19}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

one of Formulae 4-1 to 4-32; or

—Si($Q_3$)($Q_4$)($Q_5$), wherein, $Q_3$ to $Q_5$ are each independently a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group a phthalazinyl group, a quinoxalinyl group, a cynolinyl group, or a quinazolinyl group;

provided that when each of $A_1$ to $A_3$ in Formula 1 is a group derived from a benzene, at least one of $R_{11}$ to $R_{13}$ may be represented by one of Formulae 4-5 to 4-32, and provided that when one of $R_{11}$ to $R_{13}$ is represented by Formula 4-5 to 4-8, $Y_{31}$ in the Formulae 4-5 to 4-8 may be O, S, or N($Z_{35}$):

Formula 4-1

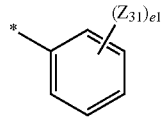

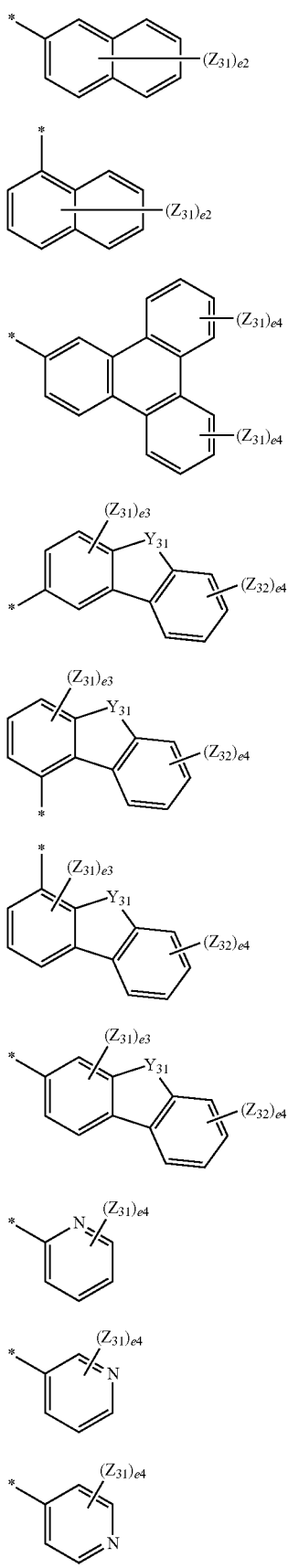
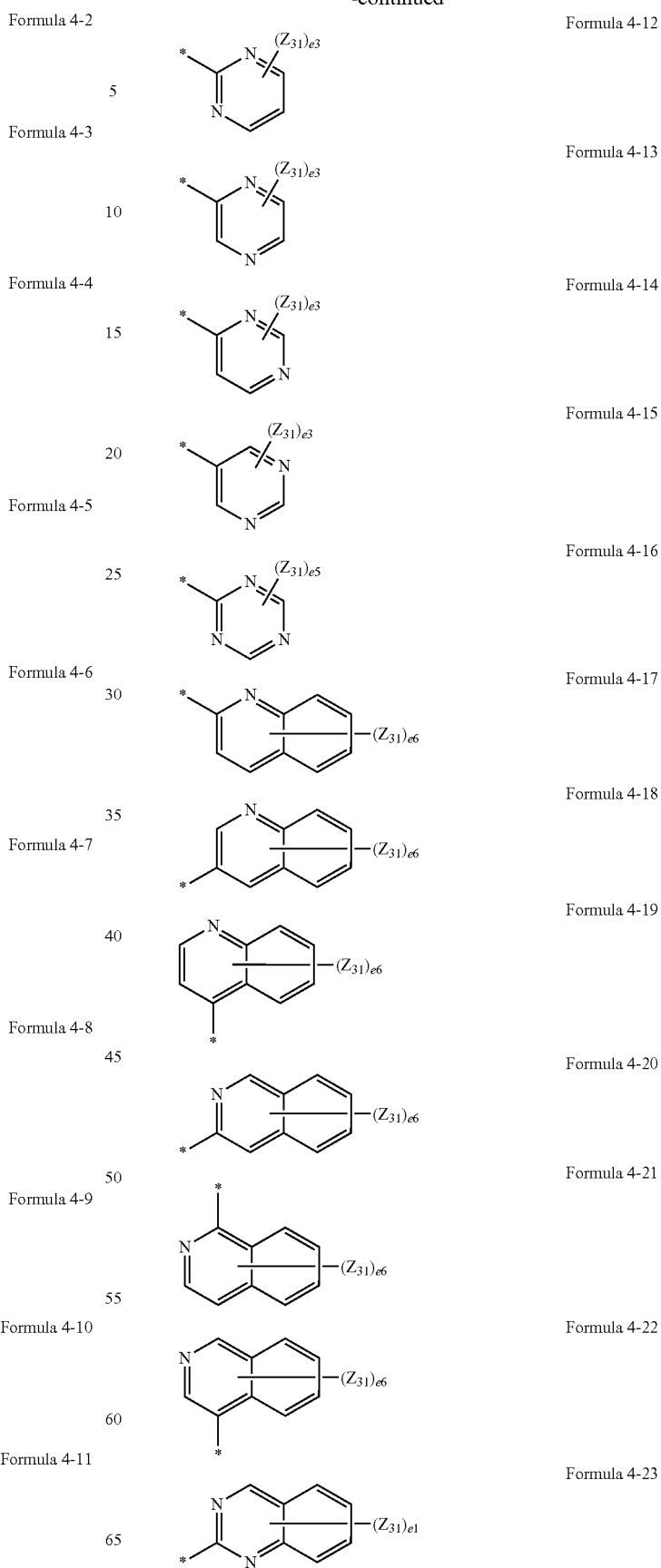

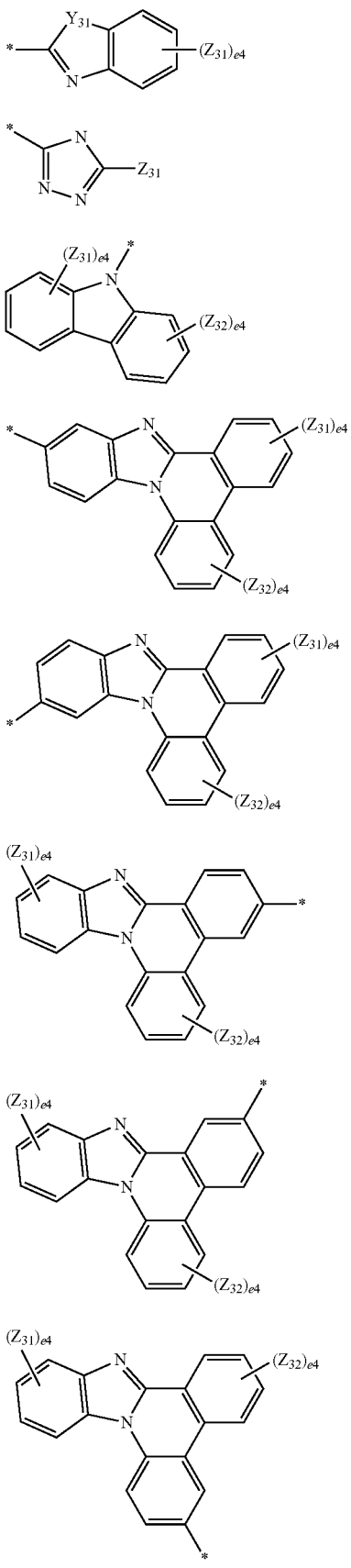

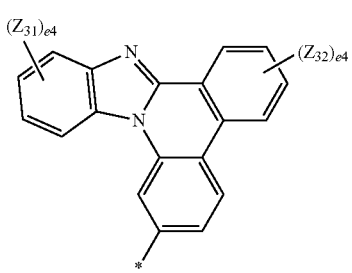

wherein in Formulae 4-1 to 4-32, $Y_{31}$ is O, S, $C(Z_{33})(Z_{34})$, $N(Z_{35})$, or $Si(Z_{36})(Z_{37})$; wherein $Z_{31}$ to $Z_{37}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, or an imidazopyridinyl group;

e1 may be an integer of 1 to 5;
e2 may be an integer of 1 to 7;
e3 may be an integer of 1 to 3;
e4 may be an integer of 1 to 4;
e5 may be an integer of 1 or 2;
e6 may be an integer of 1 to 6; and
* indicates a binding site to a neighboring atom.

For example, e1, e2, e3, e4, e5, and e6 in Formulae 4-1 to 4-32 may be each independently 1 or 2.

According to another embodiment, in Formulae 1A and 1D, $R_1$, $R_4$, and $R_7$ may be each independently represented by one of Formulae 5-1 to 5-60 below;

$R_2$, $R_3$, $R_5$, $R_6$, $R_8$, $R_9$, $R_{11}$ to $R_{19}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

one of Formulae 5-1 to 5-60; or

—$Si(Q_3)(Q_4)(Q_5)$, wherein, $Q_3$ to $Q_5$ are each independently a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group a phthalazinyl group, a quinoxalinyl group, a cynolinyl group, or a quinazolinyl group;

provided that when each of $A_1$ to $A_3$ in Formula 1 is a group derived from a benzene, at least one of $R_{11}$ to $R_{13}$ may be represented by one of Formulae 5-10 to 5-17 and 5-22 to 5-60:
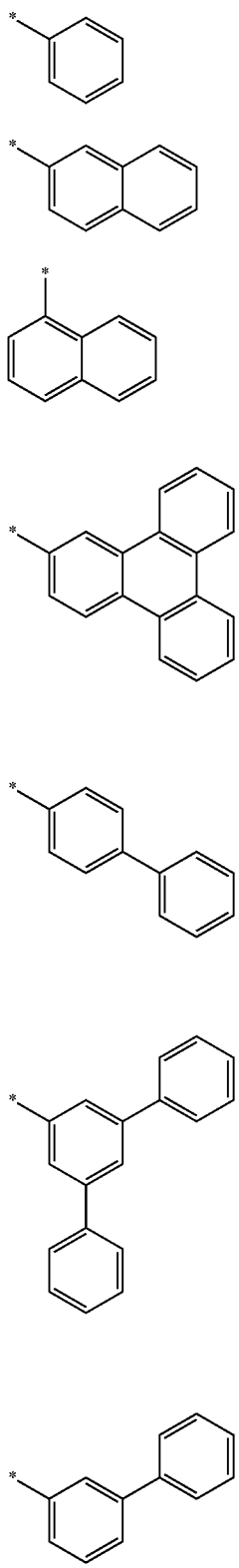
Formula 5-1
Formula 5-2
Formula 5-3
Formula 5-4
Formula 5-5
Formula 5-6
Formula 5-7
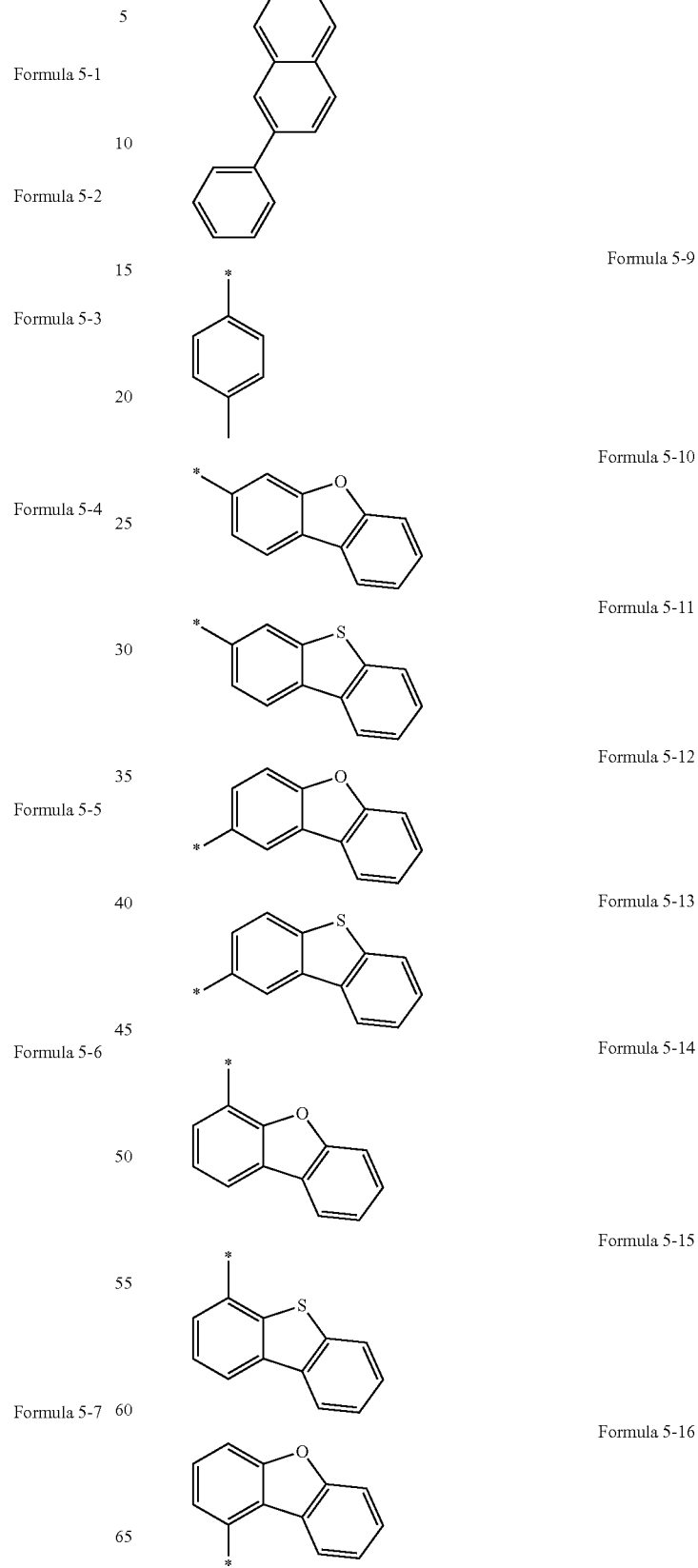
Formula 5-8
Formula 5-9
Formula 5-10
Formula 5-11
Formula 5-12
Formula 5-13
Formula 5-14
Formula 5-15
Formula 5-16

Formula 5-17

Formula 5-18

Formula 5-19

Formula 5-20

Formula 5-21

Formula 5-22

Formula 5-23

Formula 5-24

Formula 5-25

Formula 5-26

Formula 5-27

Formula 5-28

Formula 5-29

Formula 5-30

Formula 5-31

Formula 5-32

Formula 5-33
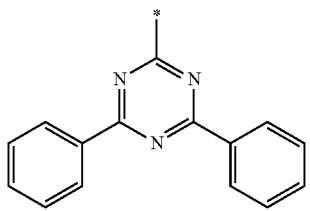
Formula 5-34
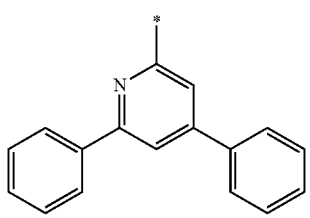
Formula 5-35
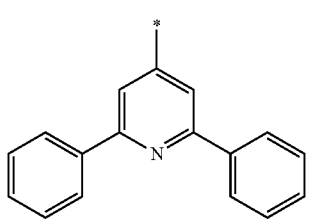
Formula 5-36
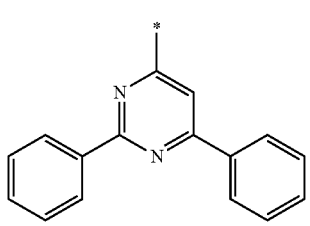
Formula 5-37
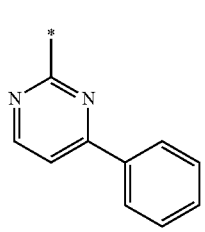
Formula 5-38
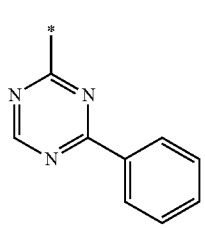
Formula 5-39
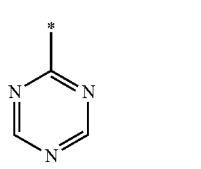
Formula 5-40
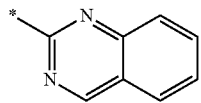
Formula 5-41
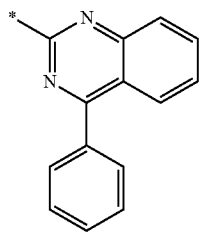
Formula 5-42
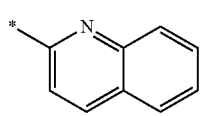
Formula 5-43
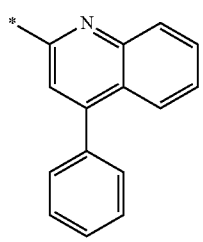
Formula 5-44
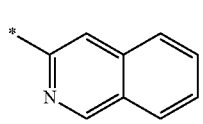
Formula 5-45
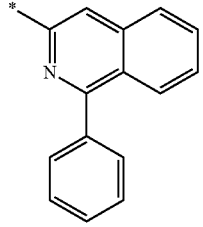
Formula 5-46
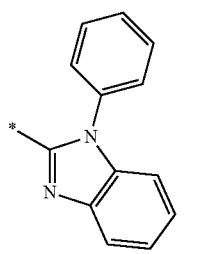
Formula 5-47
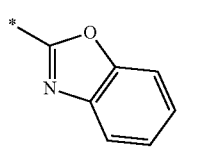
Formula 5-48
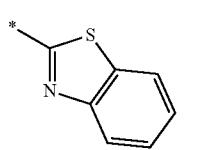

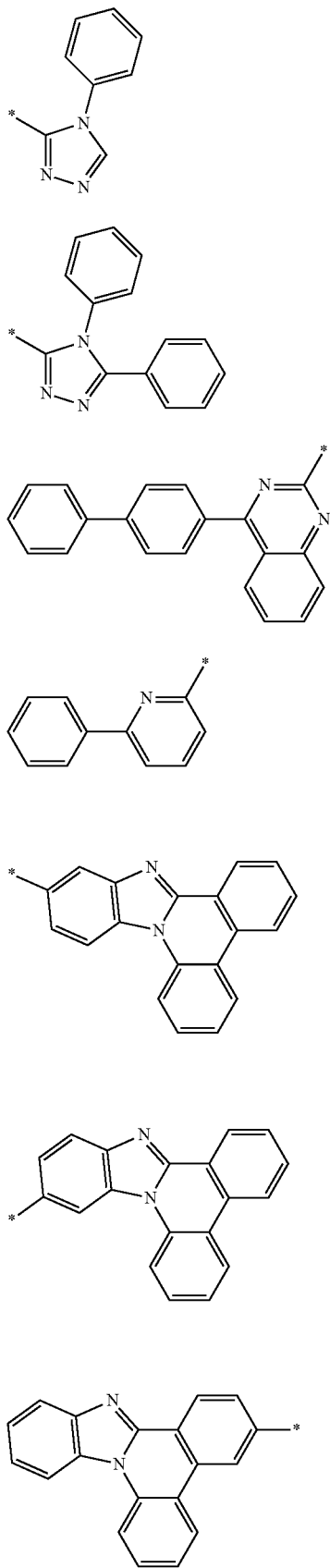

Formula 5-49

Formula 5-50

Formula 5-51

Formula 5-52

Formula 5-53

Formula 5-54

Formula 5-55

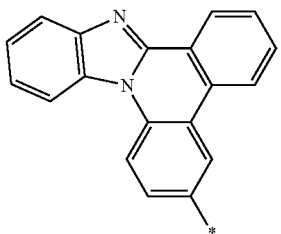

Formula 5-56

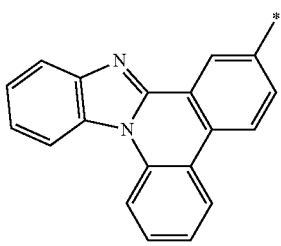

Formula 5-57

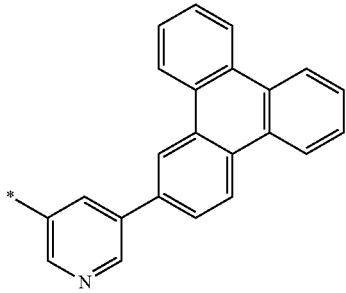

Formula 5-58

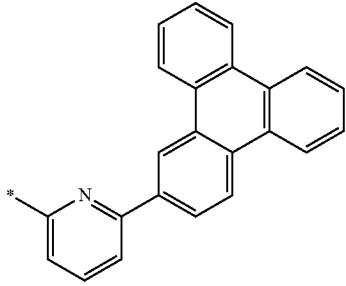

Formula 5-59

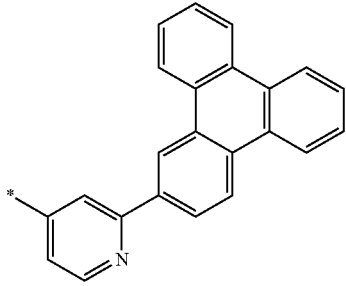

Formula 5-60

Variable b1 in Formula 1A indicates the number of $R_1$, and may be an integer of 1 to 5, for example, an integer of 1 to 3. Variable b1 may be 1 or 2, or 1. When b1 is 2 or more, groups $R_1$ may be identical or different. Variables b2 to b9 in Formulae 1A to 1D may be understood by referring to the description made in connection with b1 and Formulae 1A to 1D.

Variable b11 in Formula 1A indicates the number of $R_{11}$, and may be an integer of 1 to 5, for example, an integer of 1 to 3. Variable b11 may be 1 or 2, or 1. When b11 is 2 or more, groups $R_{11}$ may be identical or different. Variables b12 to b19 in Formulae 1A to 1D may be understood by referring to the description made in connection with b11 and Formulae 1A to 1D.

Variable c11 in Formula 1A indicates the number of moieties represented by $*-(L_{11})_{a11}-(R_{11})_{b11}$, and may be selected from an integer of 1 to 4. c11 may be 1 or 2. In the case that c11 is 2 or more, at least two $*-(L_{11})_{a11}-(R_{11})_{b11}$ may be identical or different. Variables c12 to c19 in Formulae 1A to 1D may be understood by referring to the description made in connection with c11 and Formulae 1A to 1D.

According to an embodiment, c11 to c19 in Formula 1 may be 1.

For example, in Formula 1A, $A_1$ to $A_3$ may be each independently a group derived from a benzene or a carbazole;

$X_1$ may be $N-[(L_1)_{a1}-(R_1)_{b1}]$, S, or O;

$L_1$ and $L_{11}$ to $L_{13}$ may be each independently a phenylene group, a naphthylene group, a pyridinylene group, a pyrimidinylene group, or a triazinylene group; or a phenylene group, a naphthylene group, a pyridinylene group, a pyrimidinylene group, or a triazinylene group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

a1 and a11 to a13 may be each independently 0, 1, or 2;

$R_1$ and $R_{11}$ to $R_{13}$ may be each independently a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

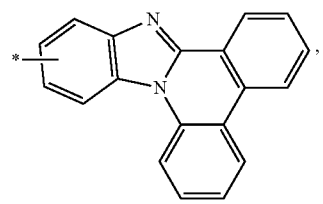

a group represented by

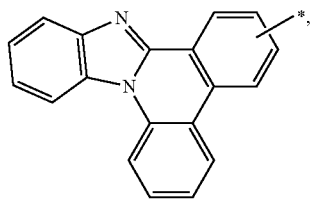

or a group represented by

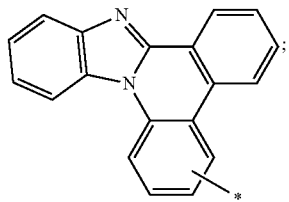

or a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

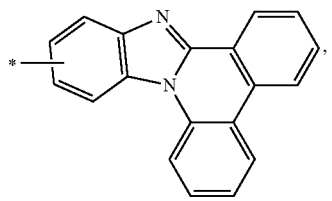

a group represented by

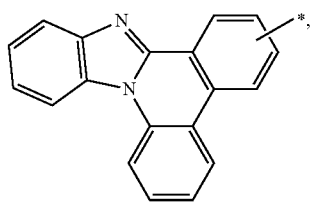

or a group represented by

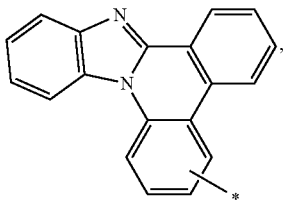

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

provided that when $A_1$ to $A_3$ is a group derived from a benzene, at least one of $R_{11}$ to $R_{13}$ may be a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

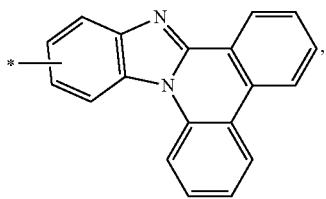

a group represented by

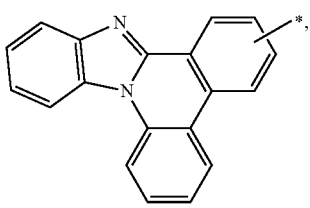

or a group represented by

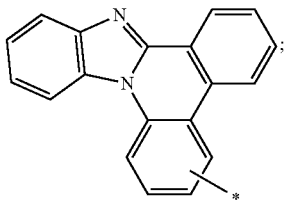

or
a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

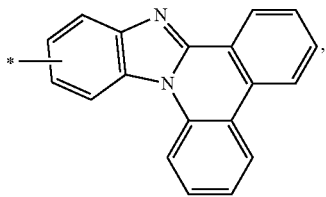

a group represented by

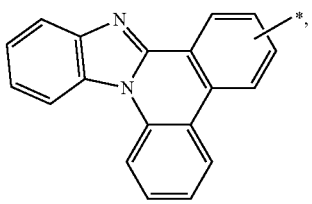

or a group represented by

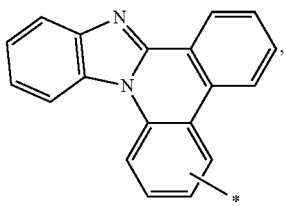

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

b1 and b11 to b13 may be each independently 1, or 2; and c11 to c13 may be 1 or 2, but are not limited thereto.

According some embodiments, in Formulae 1B to 1D, $A_4$ to $A_9$ may be each independently a group derived from a benzene or a carbazole;

$X_4$ may be N-[$(L_4)_{a4}$-$(R_4)_{b4}$], S, or O, $X_4$ may be N-[$(L_7)_{a7}$-$(R_7)_{b7}$], S, or O;

$L_4$, $L_9$, $L_{14}$ to $L_{19}$ may be each independently a phenylene group, a naphthylene group, a pyridinylene group, a pyrimidinylene group, or a triazinylene group; or a phenylene group, a naphthylene group, a pyridinylene group, a pyrimidinylene group, or a triazinylene group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

a4, a7, and a14 to a19 may be each independently 0, 1, or 2;

$R_4$ and $R_7$ may be each independently a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

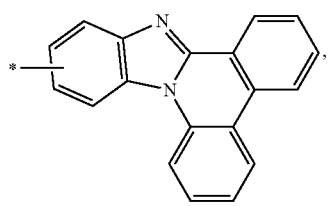

a group represented by

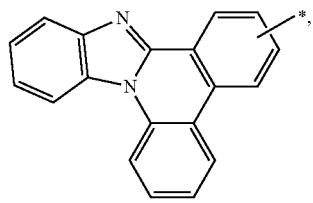

or a group represented by

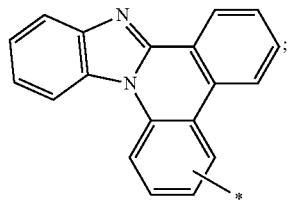

or a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

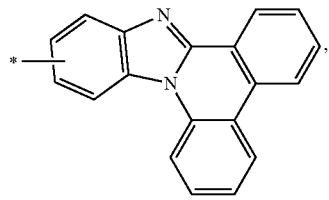

a group represented by

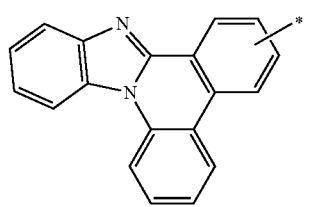

or a group represented by

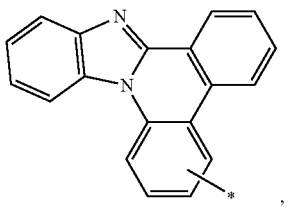, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

$R_{14}$ to $R_{19}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

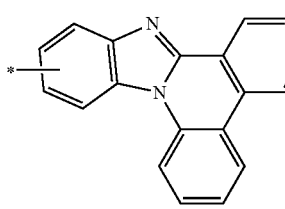, a group represented by

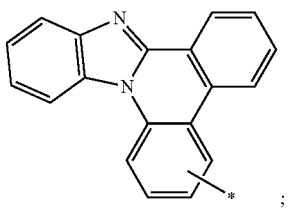;

or a group represented by

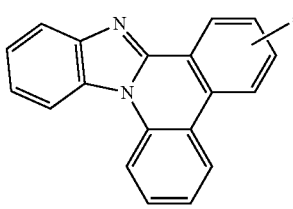, or a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by or a group represented by

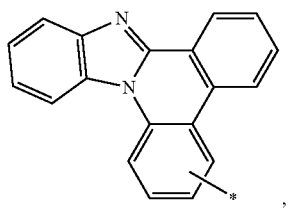

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

b4, b7, and b14 to b19 may each be independently 1 or 2; and c11 to c19 may be each independently 1 or 2, but are not limited thereto.

According to an embodiment, the condensed cyclic compound may be represented by Formula 1A, and at least one of $R_{11}$ to $R_{13}$ in Formula 1A may be a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group.

According to other embodiments, the condensed cyclic compound may be one of Formulae 1B to 1D below:

$X_4$ in Formulae 1B to 1D may be N-[$(L_4)_{a4}$-$(R_4)_{b4}$], at least one of $R_4$ and $R_{14}$ to $R_{19}$ in Formulae 1B to 1D may be a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group.

According to other embodiments, the condensed cyclic compound may be one of Formulae 1B to 1D below, wherein in Formulae 1B to 1D, $X_4$ may be N-[$(L_4)_{a4}$-$(R_4)_{b4}$], $X_7$ may be N-[$(L_7)_{a7}$-$(R_7)_{b7}$], $R_4$, $R_7$ and $R_{14}$ to $R_{19}$ may be a hydrogen, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_3$-$C_{10}$ cycloalkenyl group, a $C_6$-$C_{60}$ aryl group, and a monovalent non-aromatic condensed polycyclic group;

a $C_3$-$C_{10}$ cycloalkyl group, a $C_3$-$C_{10}$ cycloalkenyl group, a $C_6$-$C_{60}$ aryl group, or a monovalent non-aromatic condensed polycyclic group; or a $C_3$-$C_{10}$ cycloalkyl group, a $C_3$-$C_{10}$ cycloalkenyl group, a $C_6$-$C_{60}$ aryl group, or a monovalent non-aromatic condensed polycyclic group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_6$-$C_{60}$ aryl group, and a monovalent non-aromatic condensed polycyclic group.

According to an embodiment, the condensed cyclic compound represented by Formula 1 may be represented by one of Formulae 1A(1) to 1A(4) below:

Formula 1A(1)

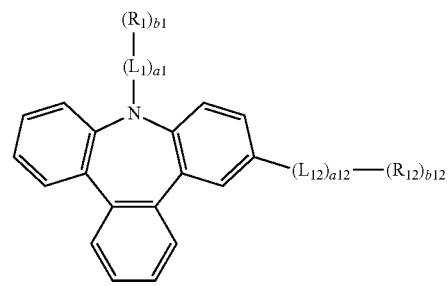

Formula 1A(2)

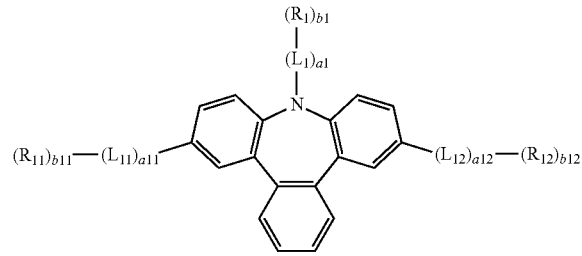

Formula 1A(3)

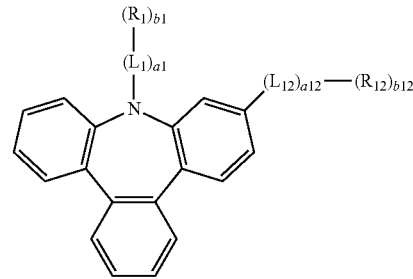

-continued

Formula 1A(4)

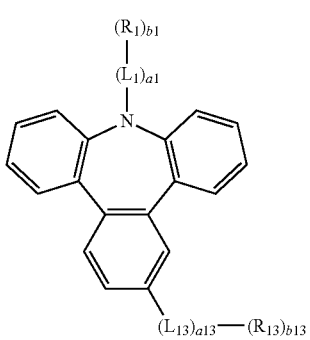

Substituents of Formulae 1A(1) to 1A(4) may be understood by referring to the description provided herein, and $R_{12}$ in Formula 1A(1), at least one of $R_{11}$ and $R_{12}$ in Formula 1A(2), $R_{12}$ in Formula 1A(3), and $R_{13}$ in Formula 1A(4) may be a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group.

For example, in Formulae 1A(1) to 1A(4), $L_1$ and $L_{11}$ to $L_{13}$ may be each independently a phenylene group, a naphthylene group, a pyridinylene group, a pyrimidinylene group, or a triazinylene group; or a phenylene group, a naphthylene group, a pyridinylene group, a pyrimidinylene group, or a triazinylene group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

a1 and a11 to a13 may be each independently 0, 1, or 2;

$R_1$ and $R_{11}$ may be each independently a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

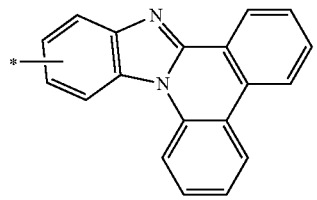

a group represented by

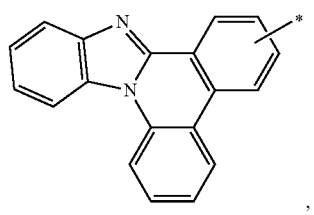

or a group represented by

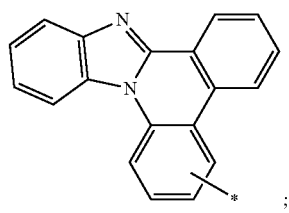

or a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

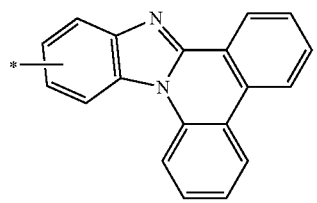

a group represented by

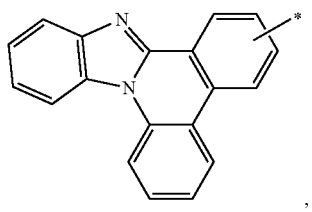

or a group represented by

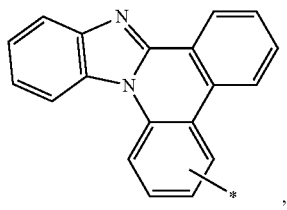

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

$R_{12}$ and $R_{13}$ may be each independently a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

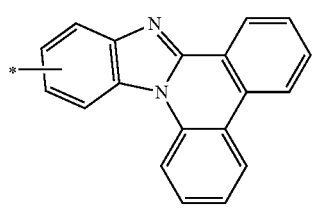

a group represented by

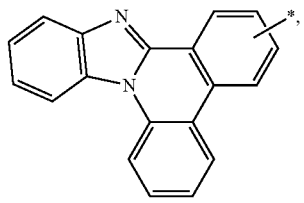

or a group represented by

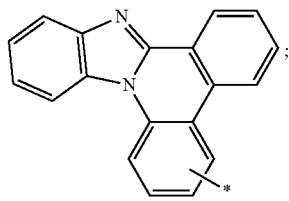

or a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

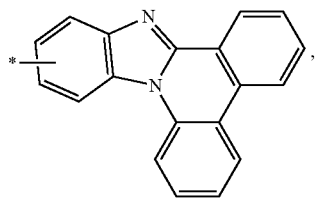

a group represented by

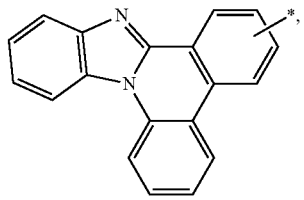

or a group represented by

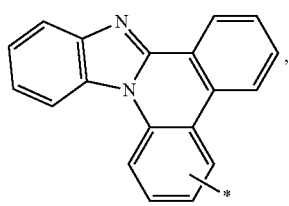

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group; and b1 and b11 to b13 may be each independently 1, or 2.

According to other embodiments, the condensed cyclic compound may be represented by one of Formulae 1A(1) to 1A(4) above, and in Formulae 1A(1) to 1A(4), $L_1$ and $L_{11}$ to $L_{13}$ may be each independently represented by one of Formulae 2-1 to 2-34 (for example, one of Formulae 3-1 to 3-39);

a1 and a11 to a13 may be each independently 0, 1, or 2;

$R_1$ and $R_{11}$ may be each independently represented by one of Formulae 4-1 to 4-32 (for example, one of Formulae 5-1 to 5-60);

$R_{12}$ and $R_{13}$ may be each independently represented by one of Formulae 4-5 to 4-32 (when $R_{12}$ and $R_{13}$ are represented by Formulae 4-5 to 4-8, $Y_{31}$ in the Formulae 4-5 to 4-8 is O, S, or N($Z_{35}$))(for example, one of Formulae 5-10 to 5-17 and 5-22 to 5-60); and b1 and b11 to b13 may be each independently 1, or 2.

According to another embodiment, the condensed cyclic compound may be represented by Formula 1A(5), 1A(6) or 1B(1) below:

For example, in Formulae 1A(5), 1A(6), and 1B(1), $L_1$, $L_4$, $L_7$, $L_{11}$, $L_{12}$, $L_{14}$, and $L_{19}$ are each independently a phenylene group, a naphthylene group, a pyridinylene group, a pyrimidinylene group, or a triazinylene group; or a phenylene group, a naphthylene group, a pyridinylene group, a pyrimidinylene group, or a triazinylene group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

a1, a4, a7, a11, a12, a14, and a19 may each be independently 0, 1, or 2;

$R_1$, $R_4$, $R_7$, and $R_{12}$ may each be independently a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an

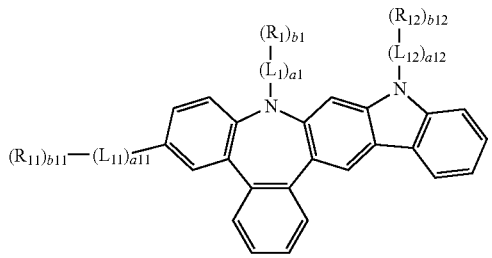

Formula 1A(5)

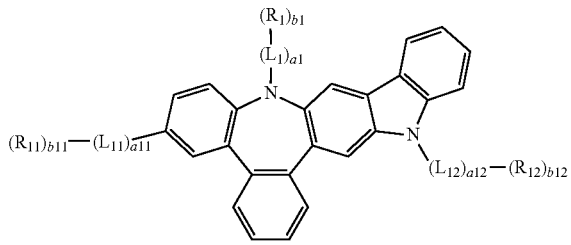

Formula 1A(6)

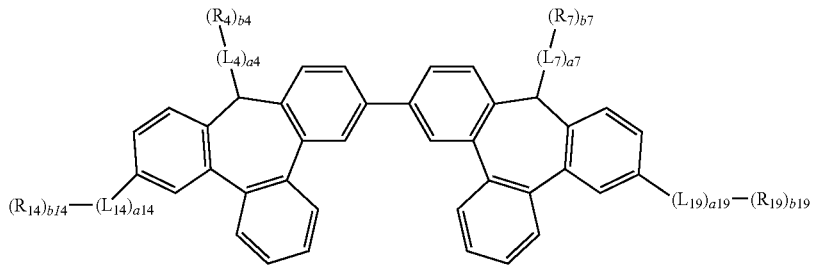

Formula 1B(1)

Substituents in Formulae 1A(5), 1A(6), and 1B(1) may be understood by referring to the description provided herein.

imidazopyrimidinyl group, an imidazopyridinyl group, a group represented by a group represented by

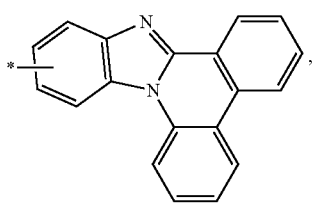

a group represented by

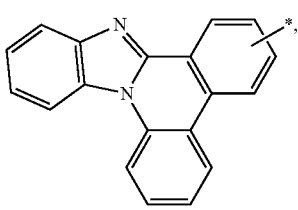

or a group represented by

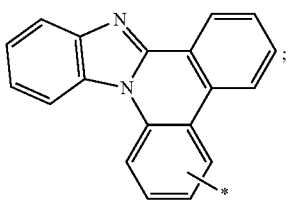

or a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

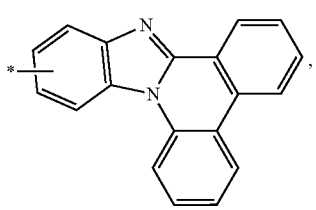

a group represented by

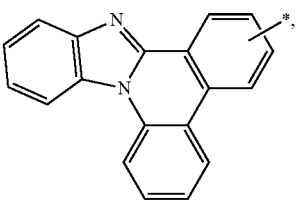

or a group represented by

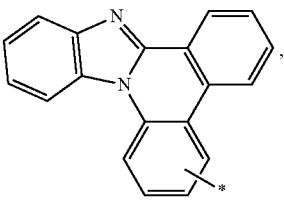

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

$R_{11}$, $R_{14}$, and $R_{19}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by a group represented by

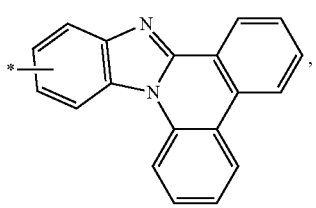

a group represented by

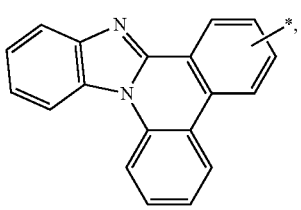

or a group represented by

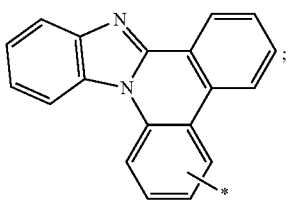

or a phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

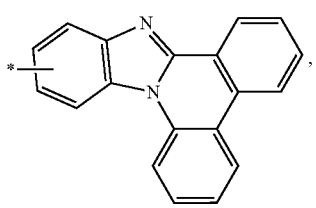

a group represented by

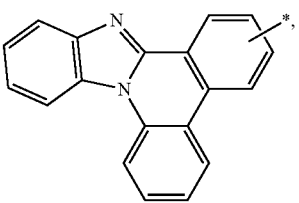

or a group represented by

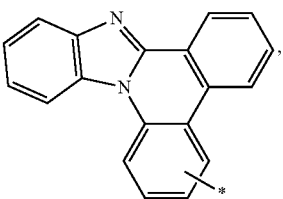

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group; and b1, b4, b7, b11, b12, b14, and b19 may be each independently 1 or 2.

In other embodiments, in Formulae 1A(5), 1A(6), and 1B(1), $L_1$, $L_4$, $L_7$, $L_{11}$, $L_{12}$, $L_{14}$, and $L_{19}$ are each independently represented by one of Formulae 2-1 to 2-34 above (for example, one of Formulae 3-1 to 3-39 above);

a1, a4, a7, a11, a12, a14, and a19 may each be independently 0, 1, or 2;

$R_1$, $R_4$, $R_7$, and $R_{12}$ may be each independently selected from Formulae 4-1 to 4-32 (for example, Formulae 5-1 to 5-60);

$R_{11}$, $R_{14}$, and $R_{19}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group; or represented by one of Formulae 4-1 to 4-32 (for example, one of Formulae 5-1 to 5-60); and b1, b4, b7, b11, b12, b14, and b19 may be each independently 1 or 2.

In other embodiments, at least one of $R_{11}$ and $R_{12}$ in Formulae 1A(5) and 1A(6) and at least one of $R_{14}$ and $R_{19}$ in Formulae 1B(1) may be each independently represented by one of Formulae 4-5 to 4-32 (provided, when $R_{12}$ and $R_{13}$ are represented by Formulae 4-5 to 4-8, $Y_{31}$ in the Formulae 4-5 to 4-8 may be O, S, or $N(Z_{35})$) (for example, one of Formulae 5-10 to 5-17 and 5-22 to 5-60), but they are not limited thereto.
The condensed cyclic compound may be one of Compounds 1 to 121 below, but is not limited thereto:
1
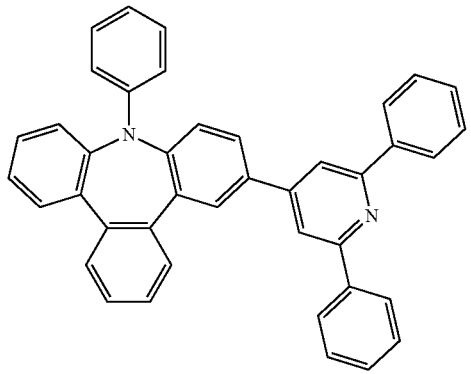
2
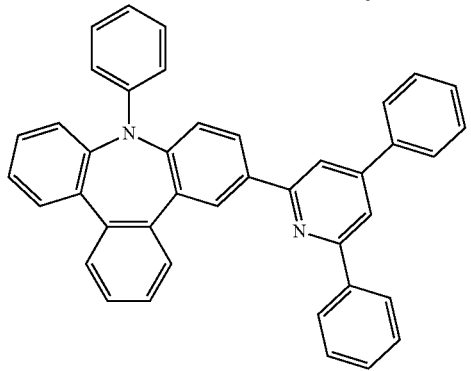
3
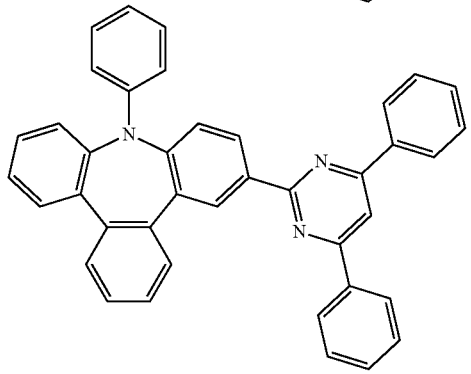
4
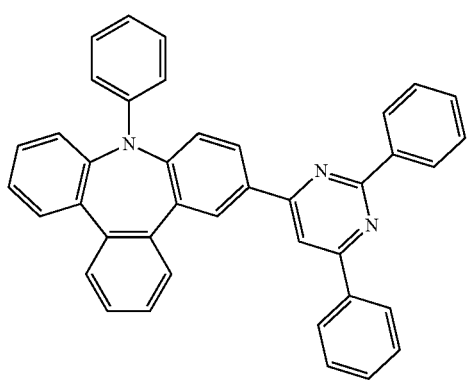
-continued
5
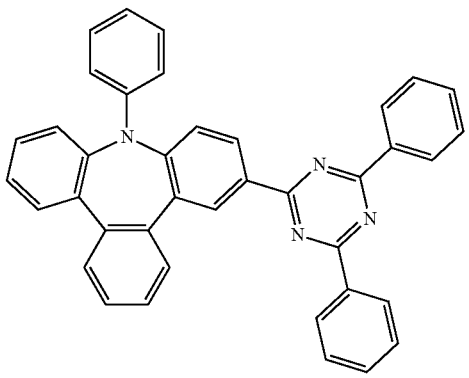
6
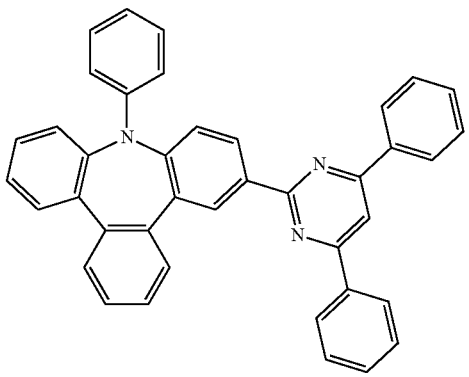
7
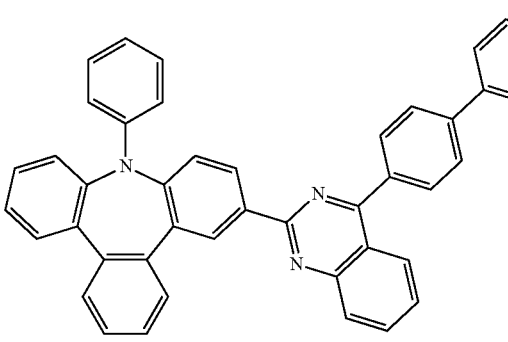
8
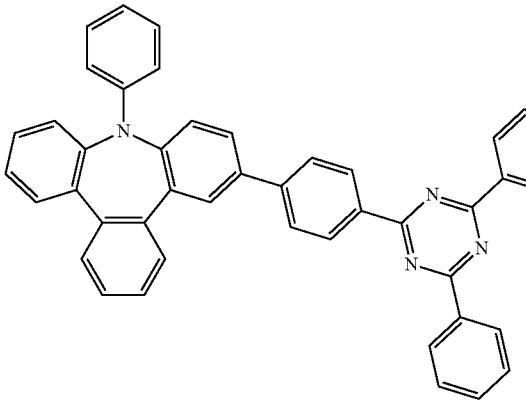

-continued
9
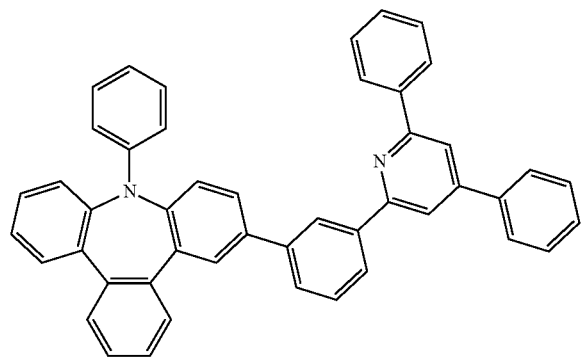
10
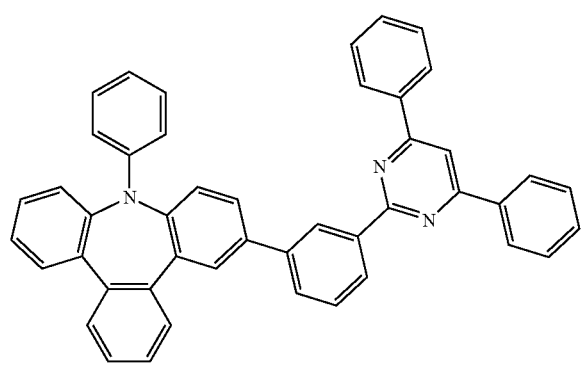
11
12
-continued
13
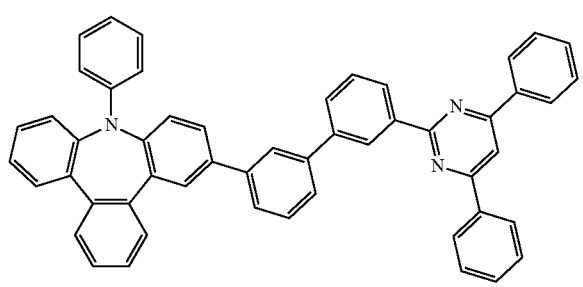
14
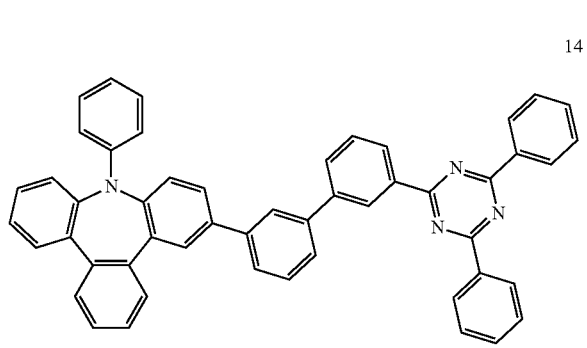
15
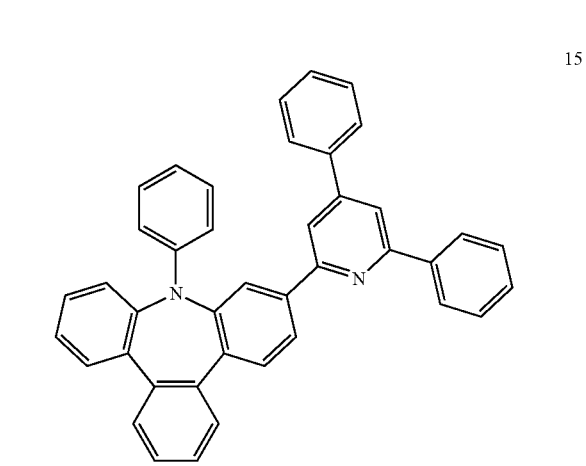
16
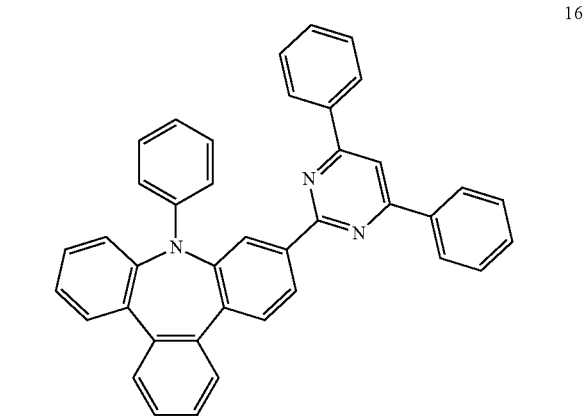

17
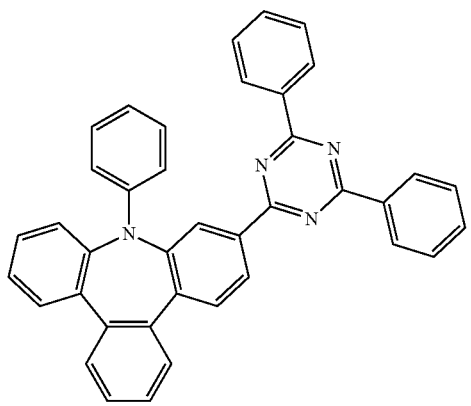
18
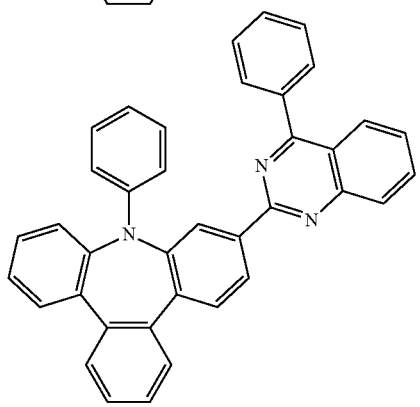
19
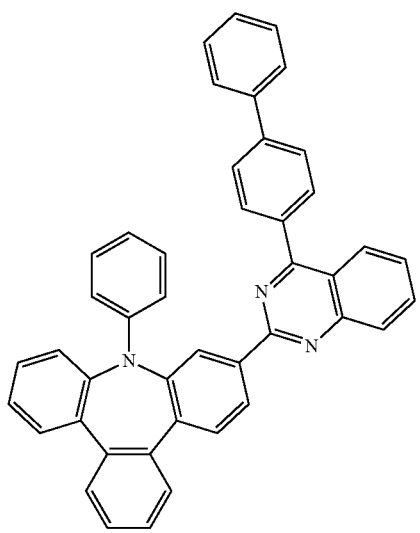
20
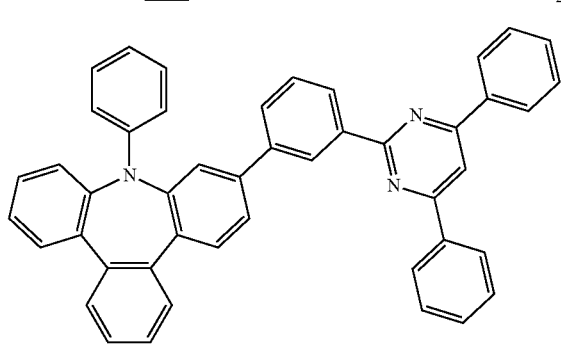
21
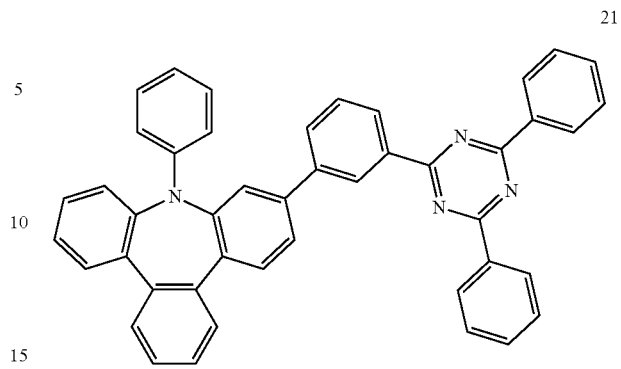
22
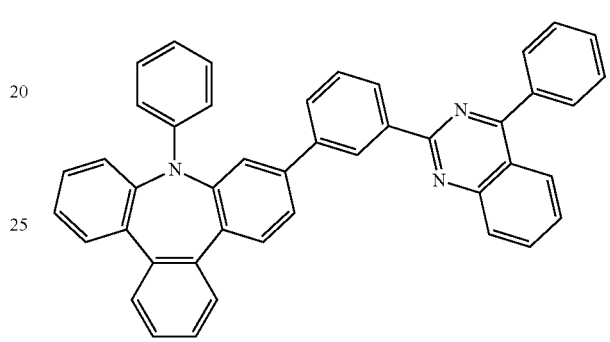
23
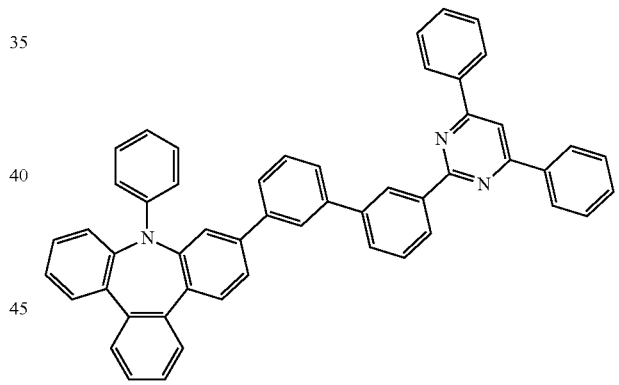
24
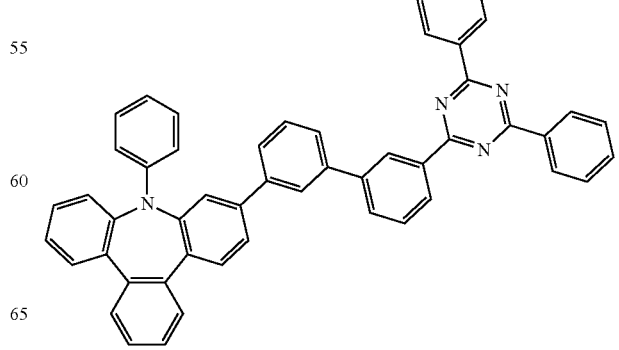

25
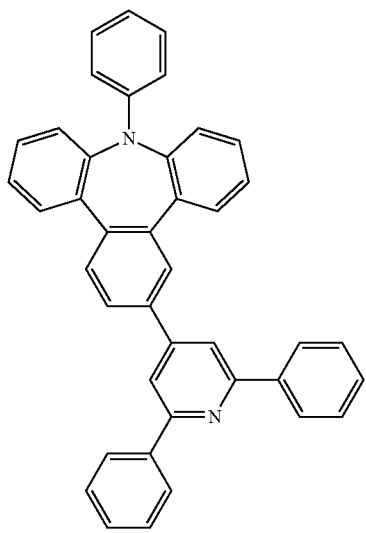
26
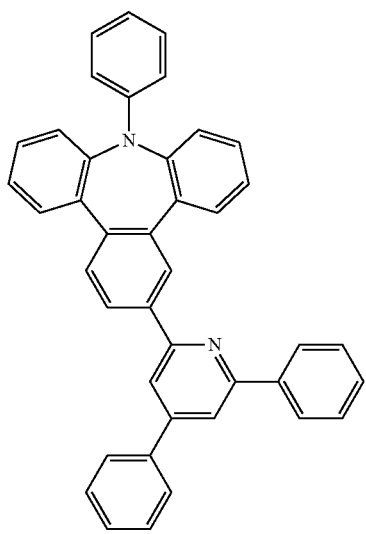
27
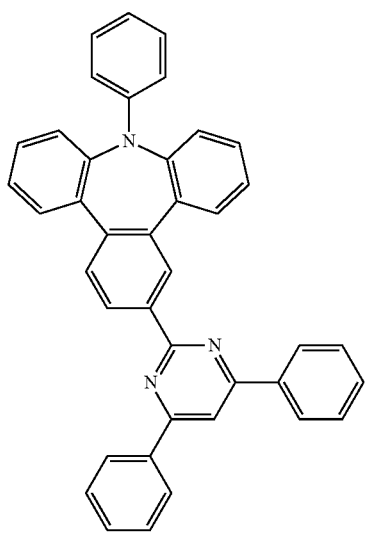
28
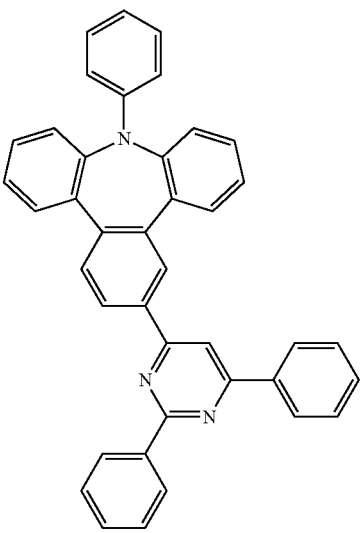
29
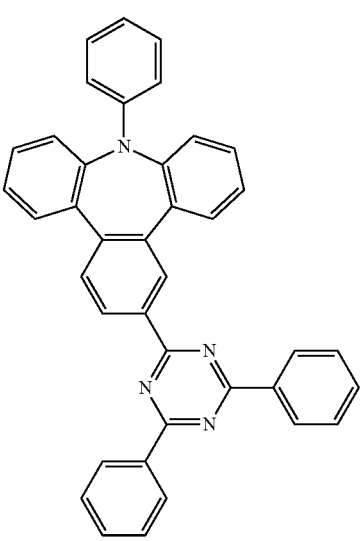
30
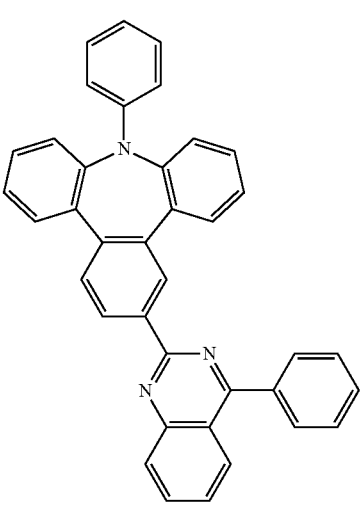

31
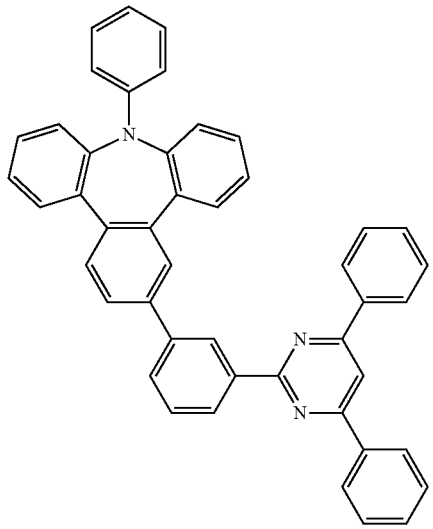
32
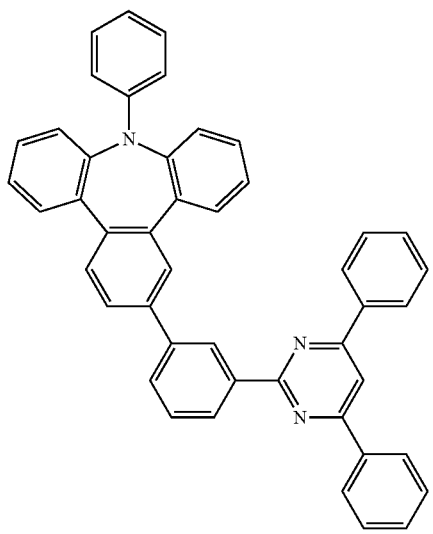
33
34
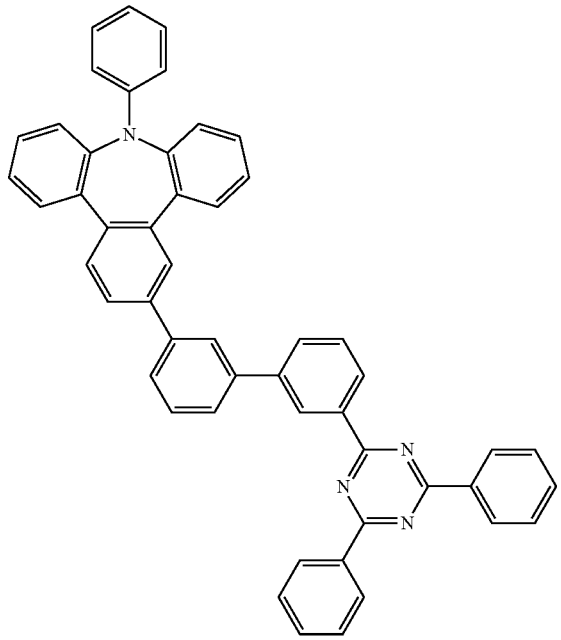
35
36
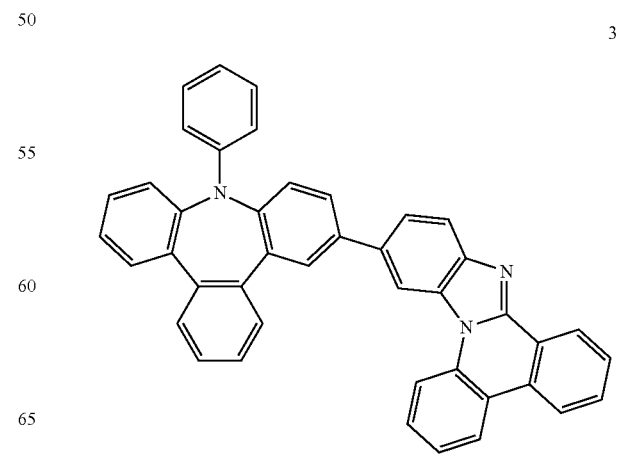

37
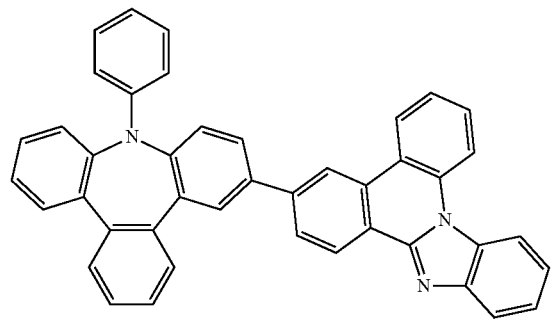
38
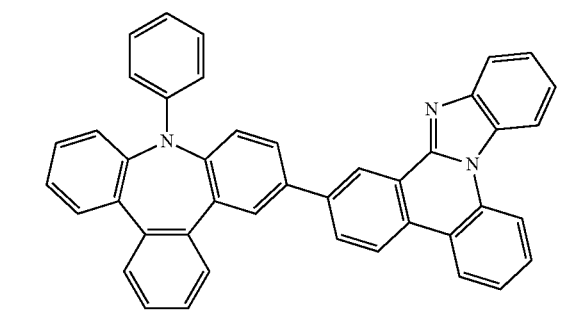
39
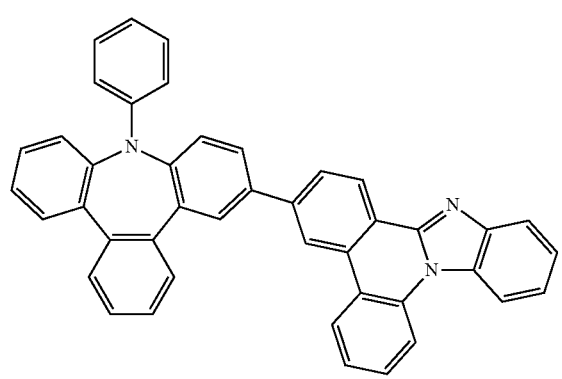
41
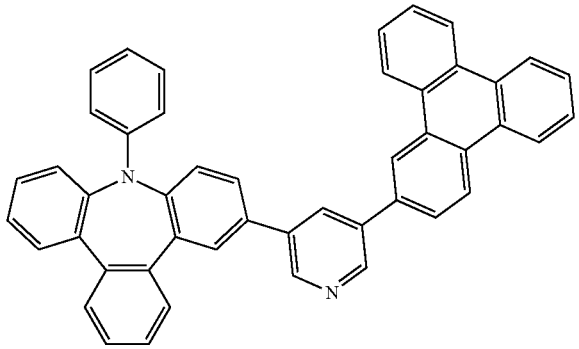
42
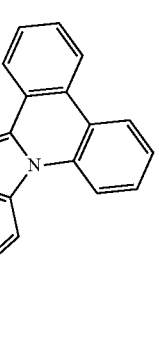
43
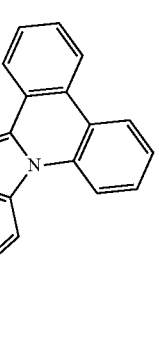
44
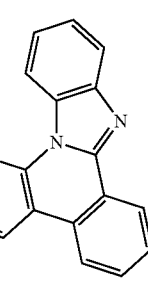

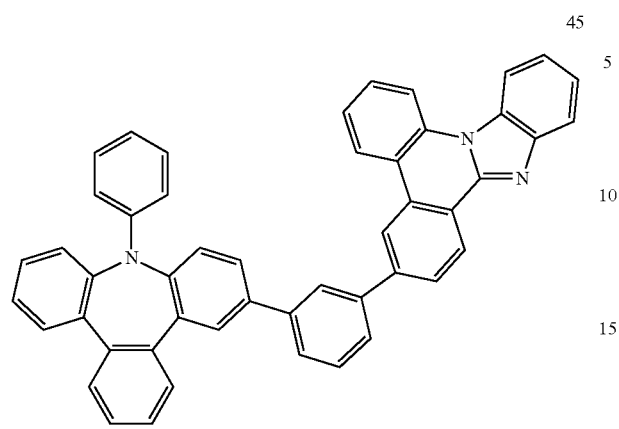
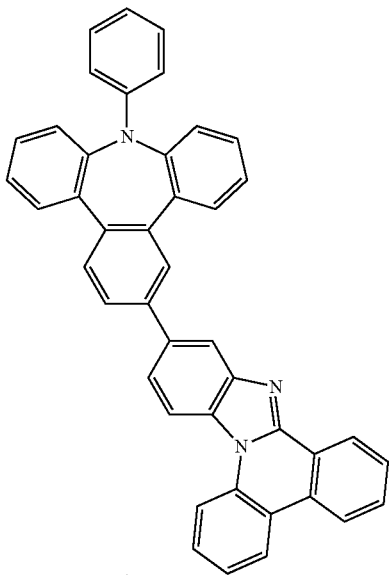
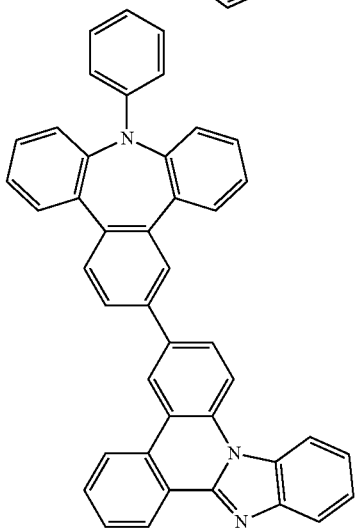
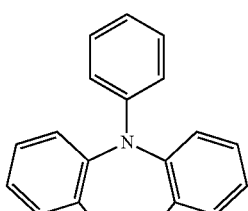
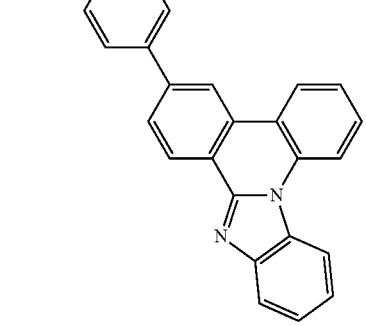

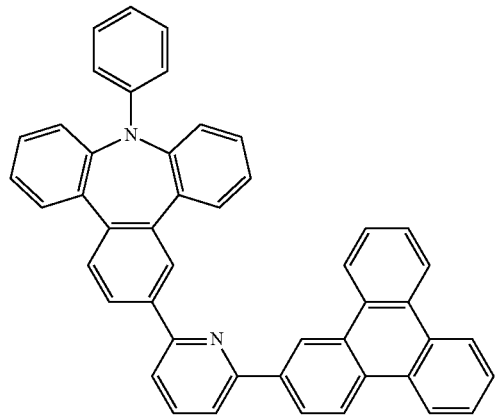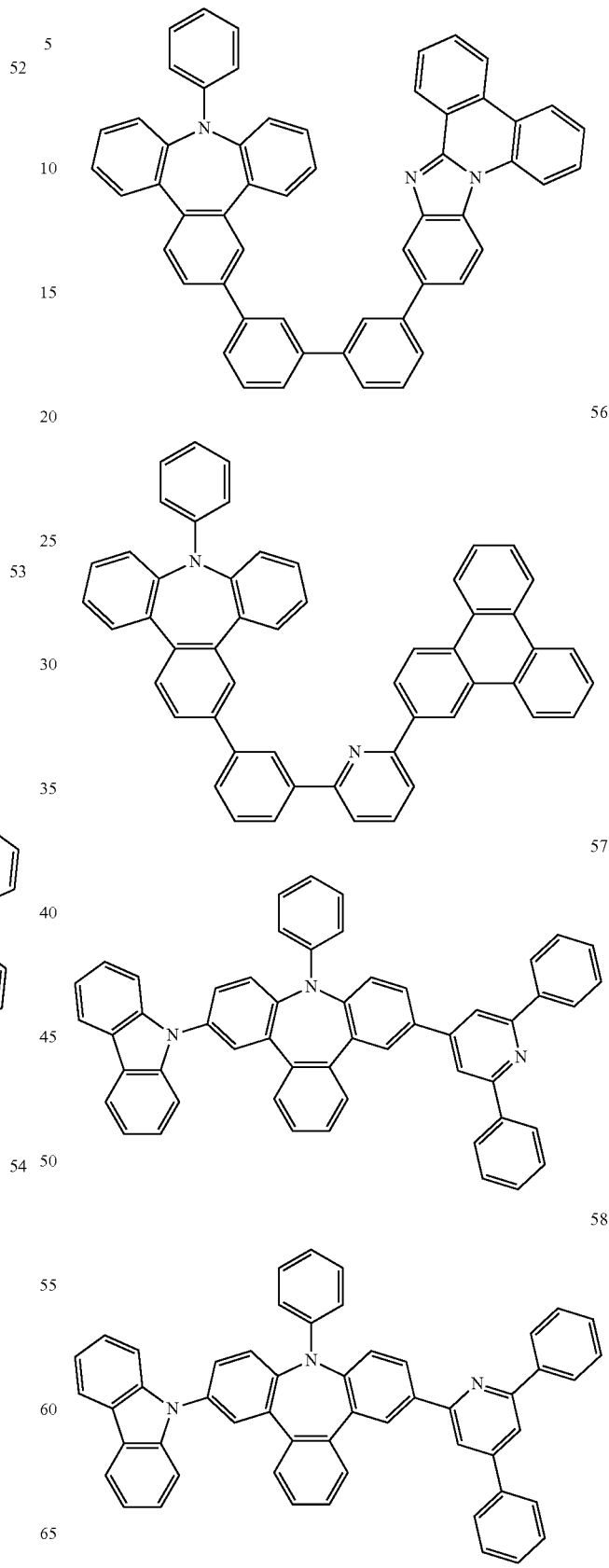

59
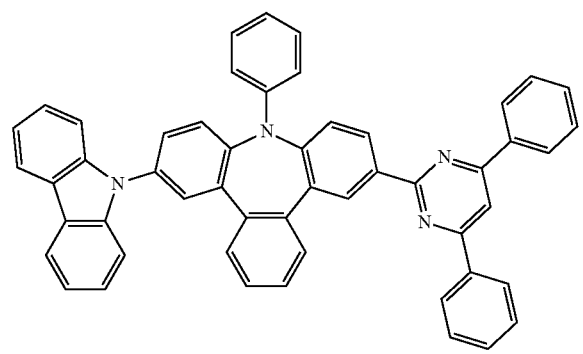
60
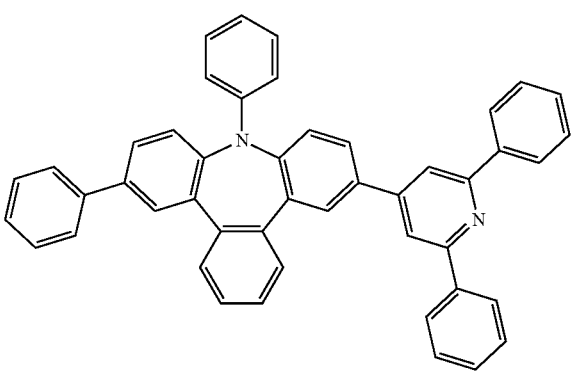
61
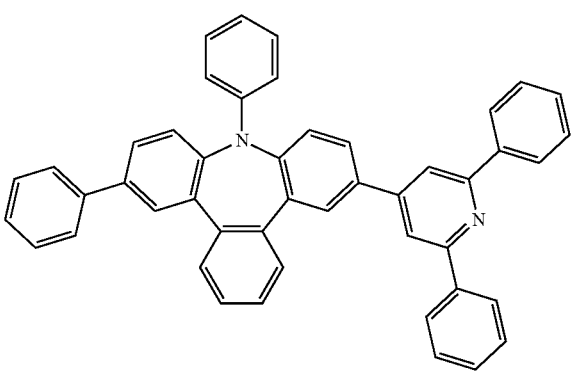
62
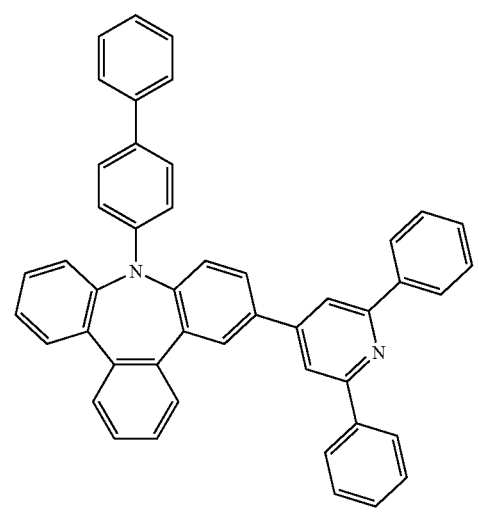
63
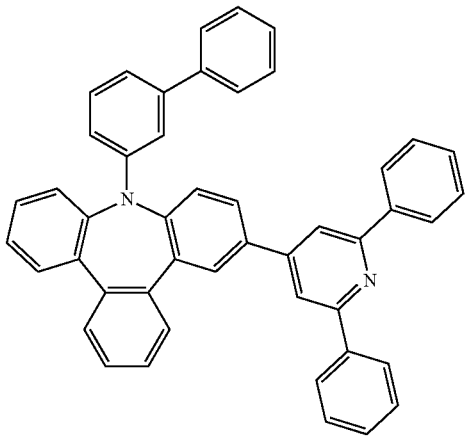
64
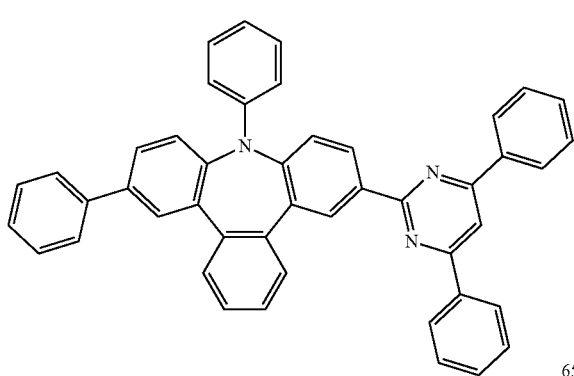
65
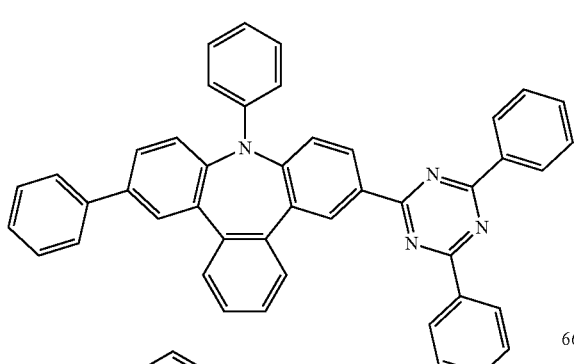
66
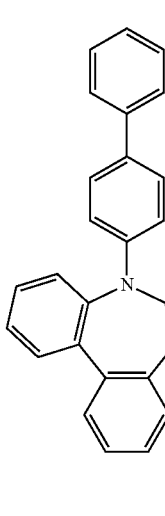

67
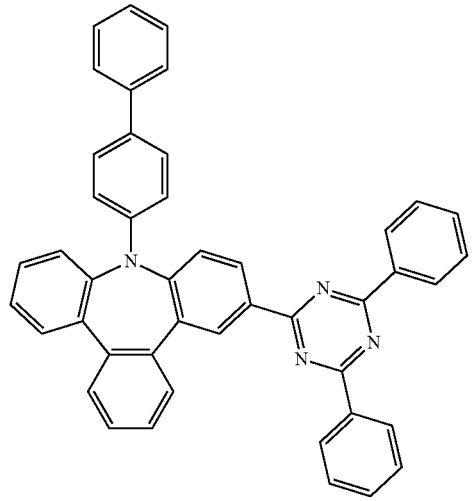
68
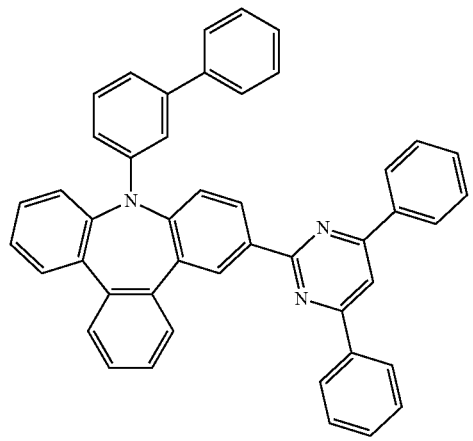
69
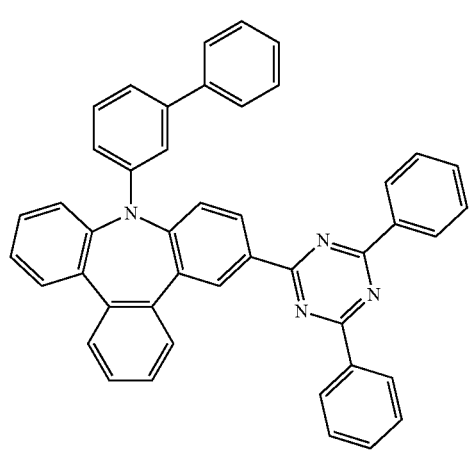
70
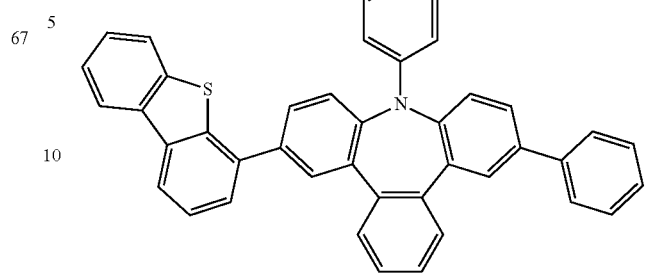
71
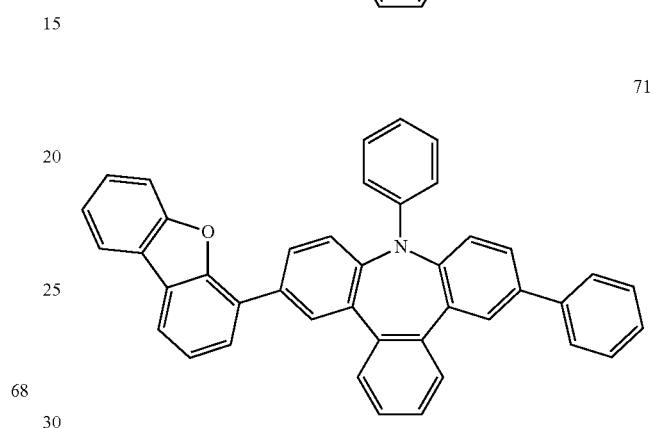
72
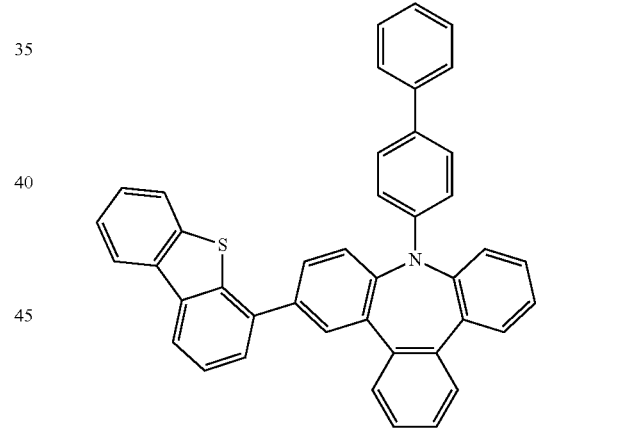
73
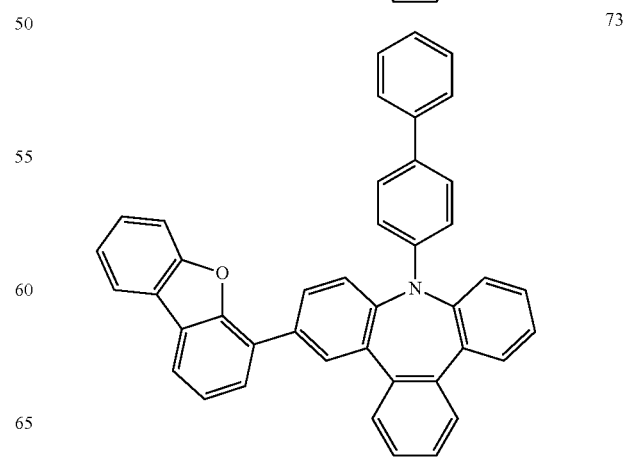

74
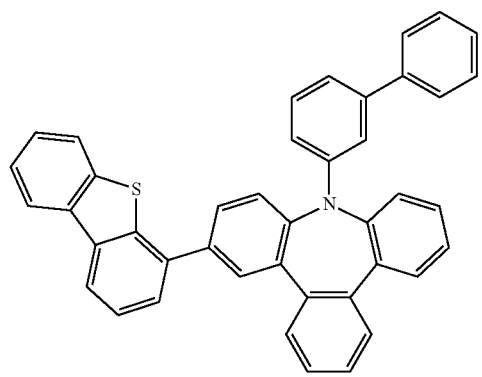
75
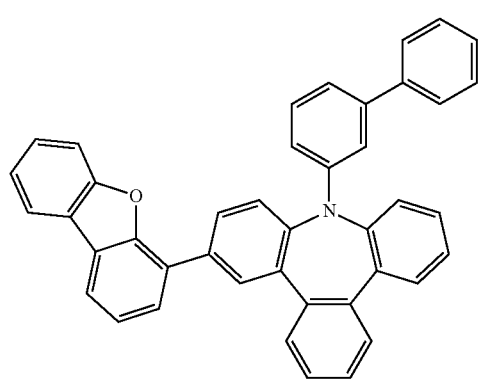
76
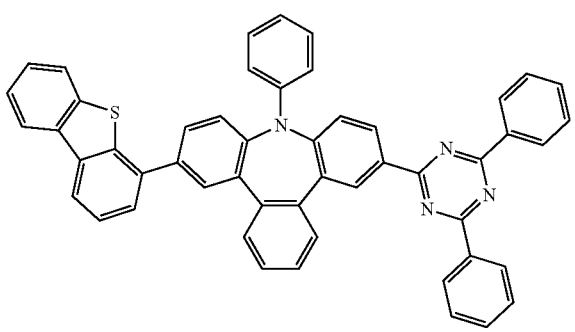
77
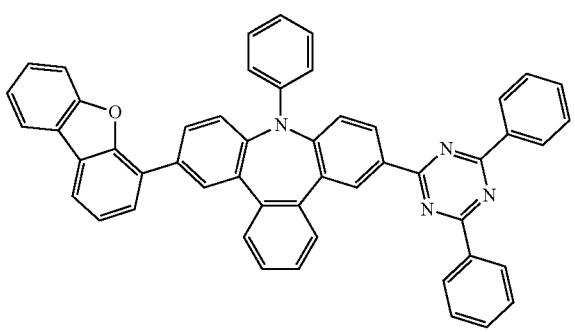
78
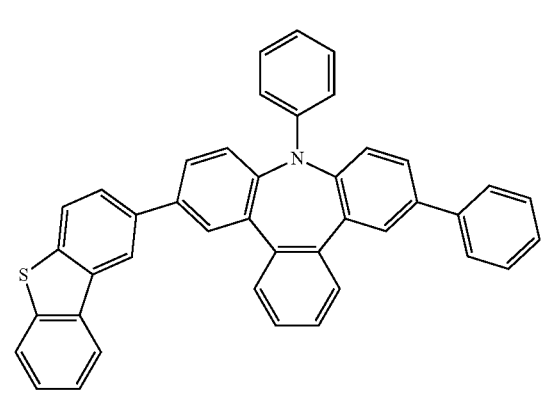
79
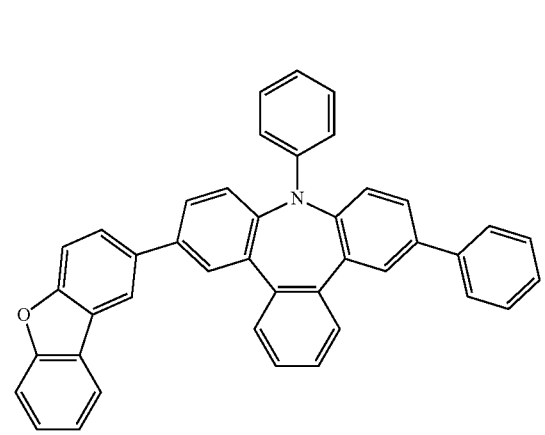
80
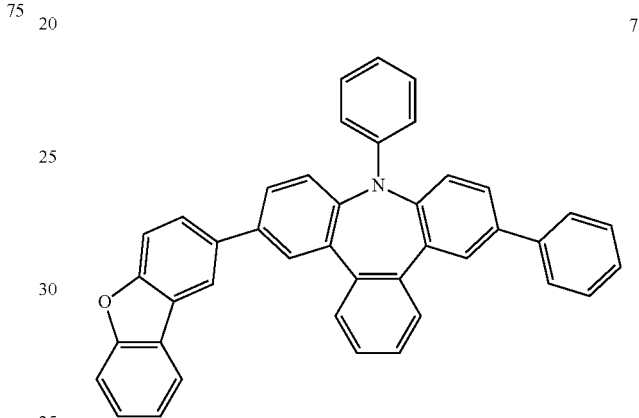
81
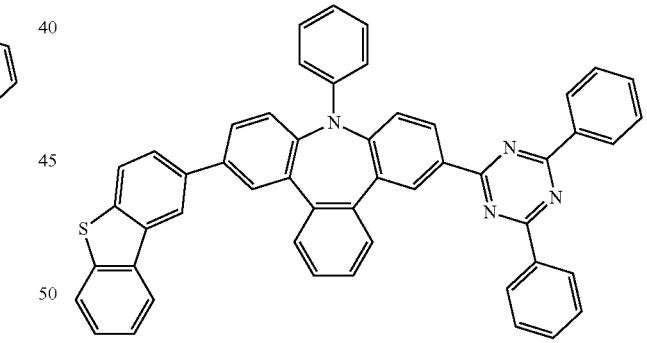

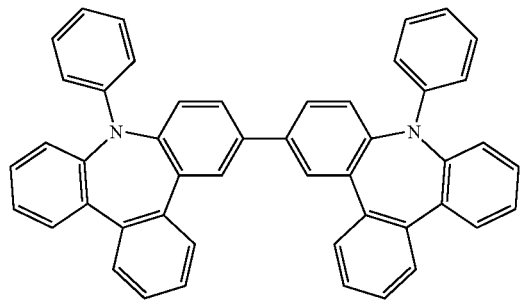
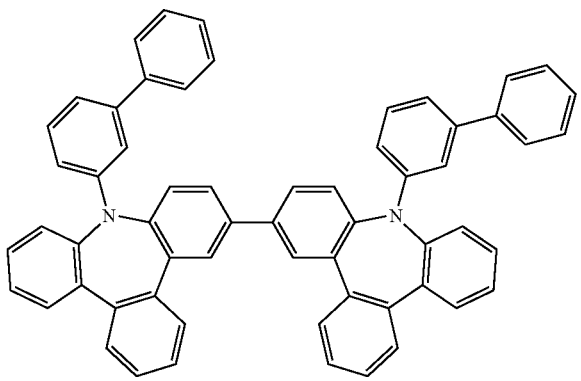
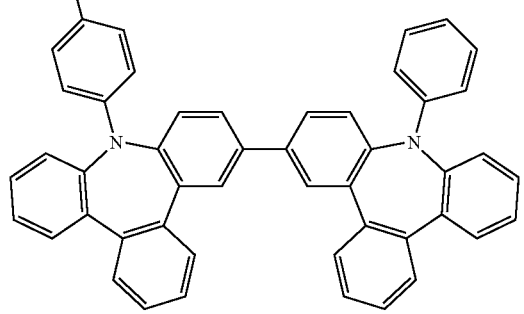
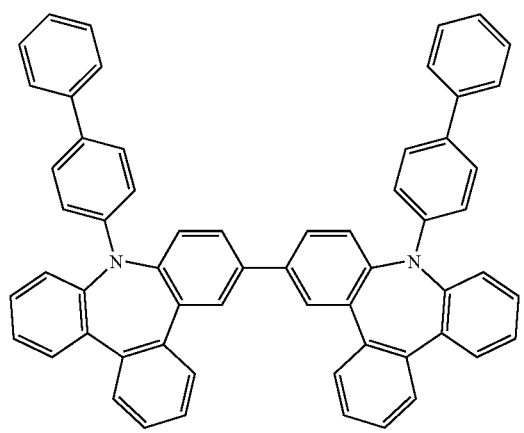
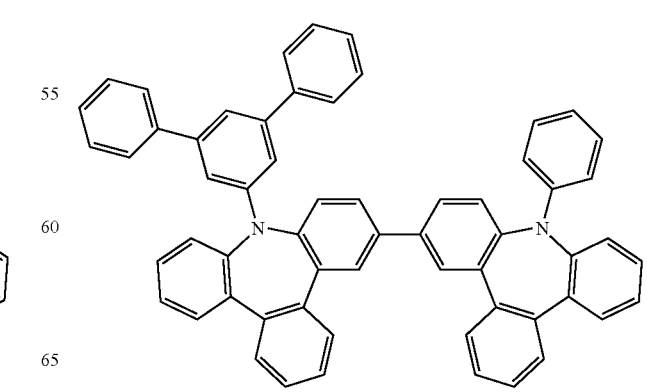

85
-continued
90
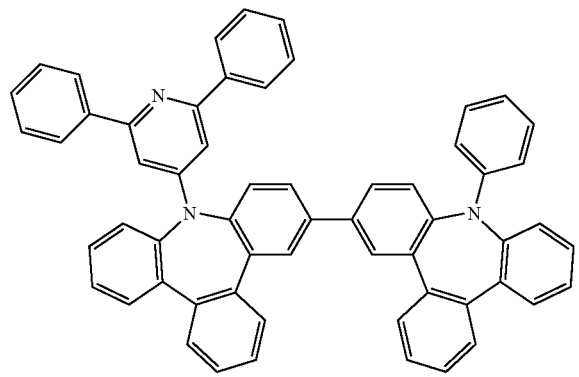
91
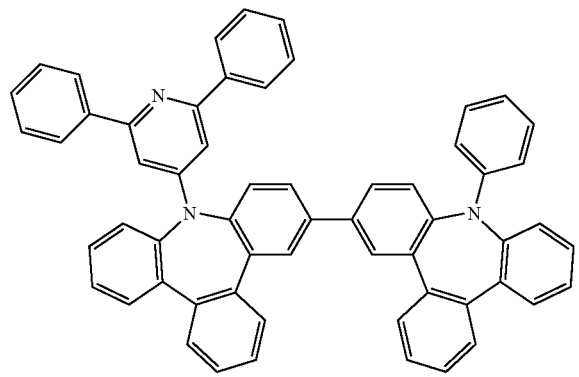
92
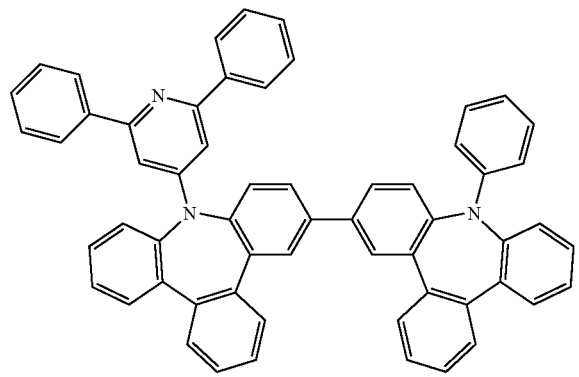
93
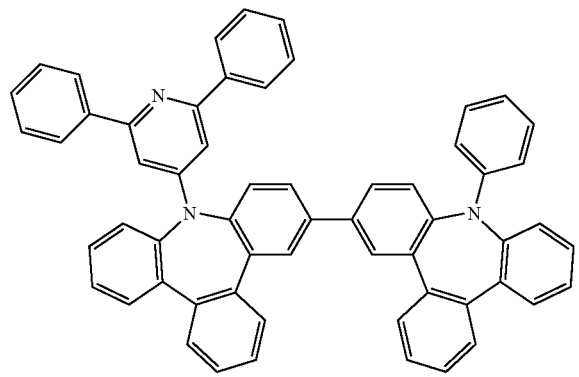
86
-continued
94
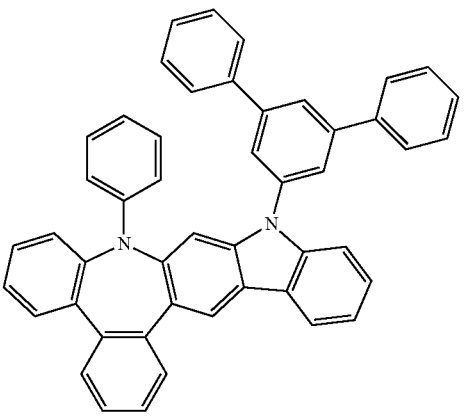
95
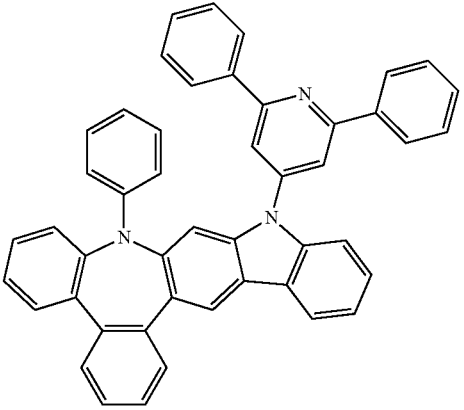
96
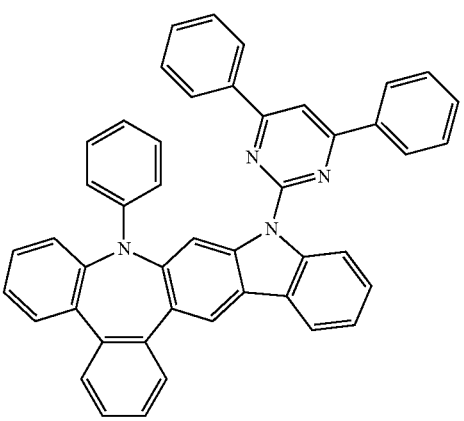
97
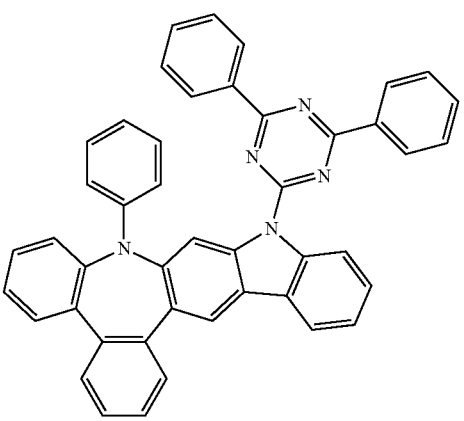

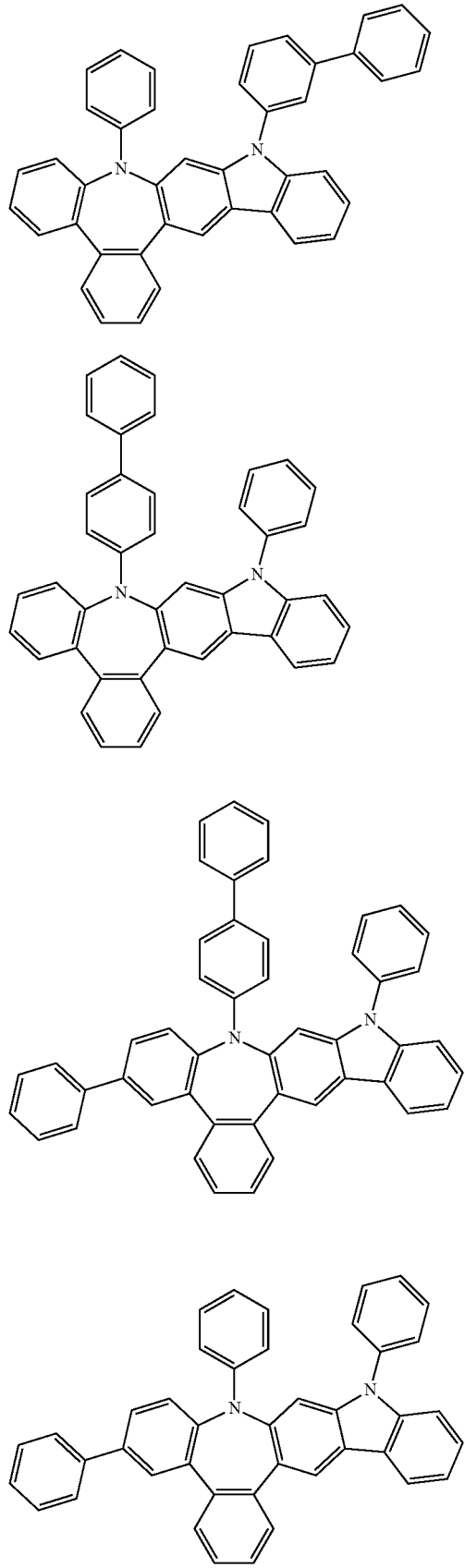
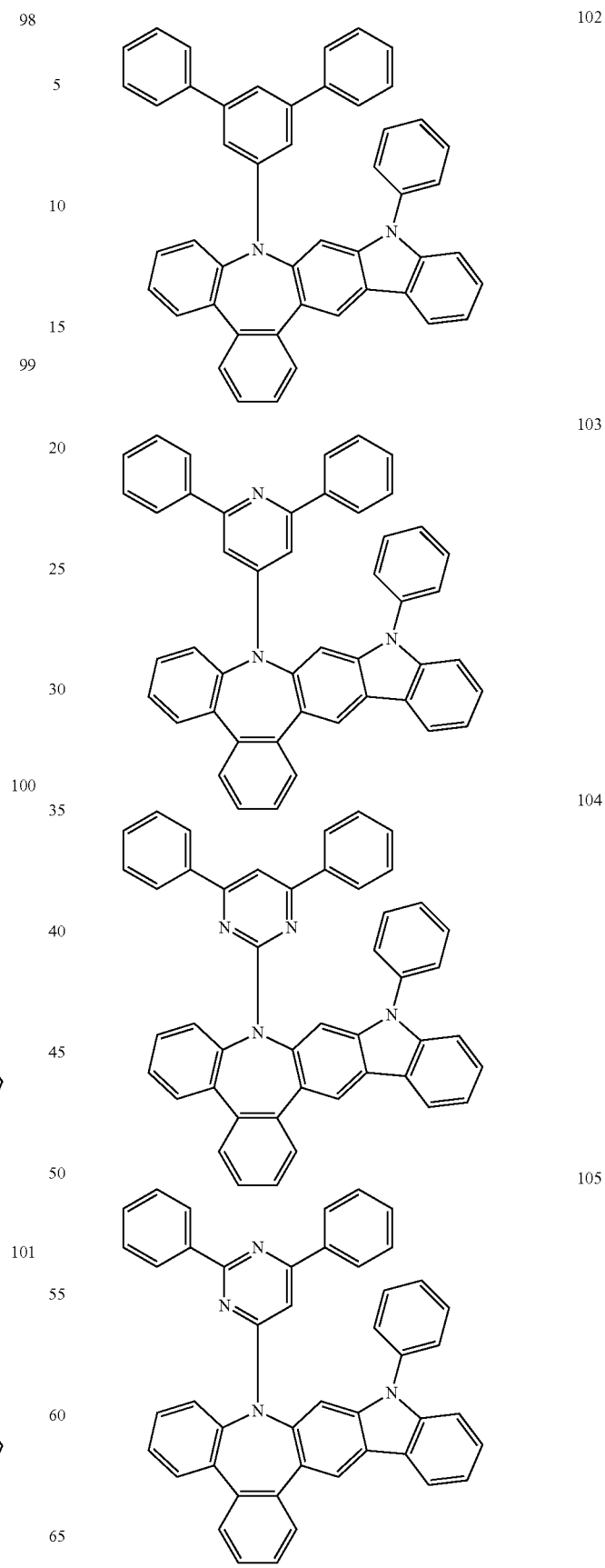

106
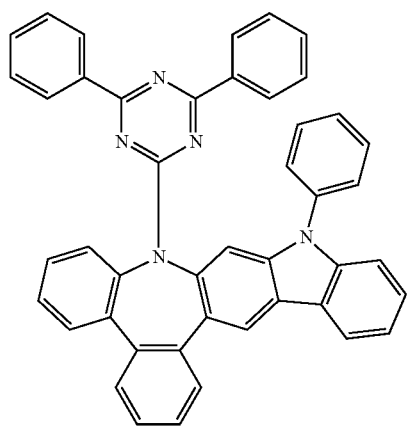
107
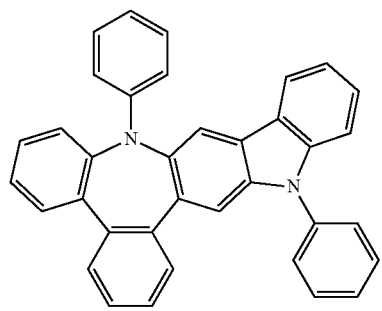
108
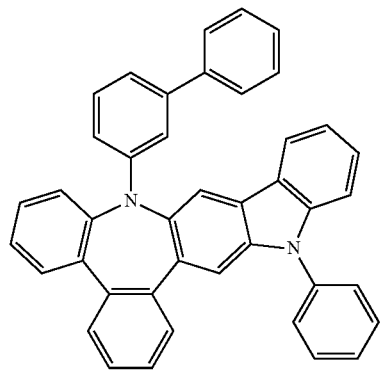
109
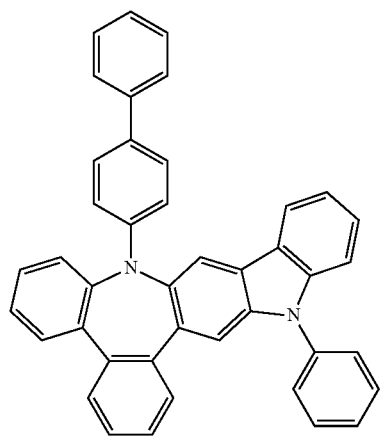
110
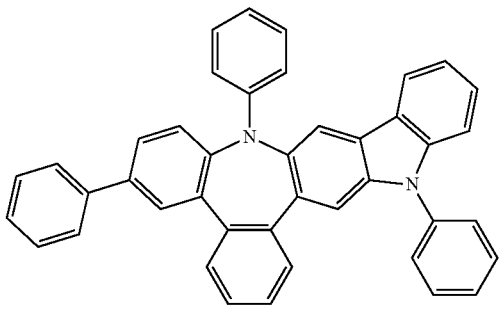
111
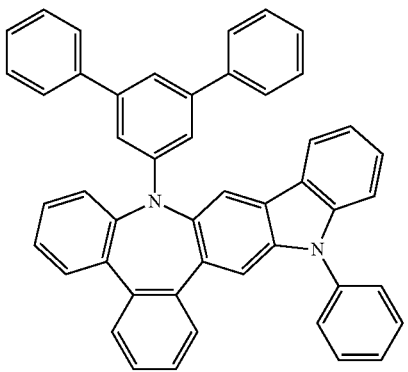
112
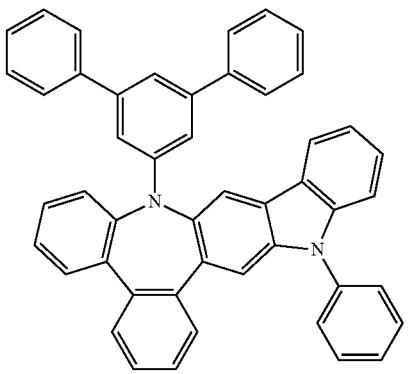
113
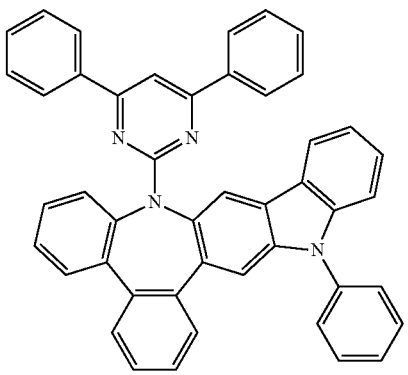

US 10,622,568 B2
91 -continued
114
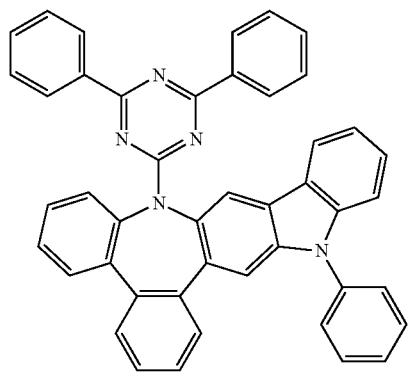
115
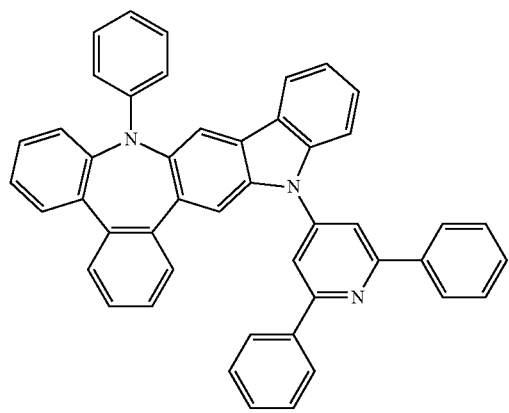
116
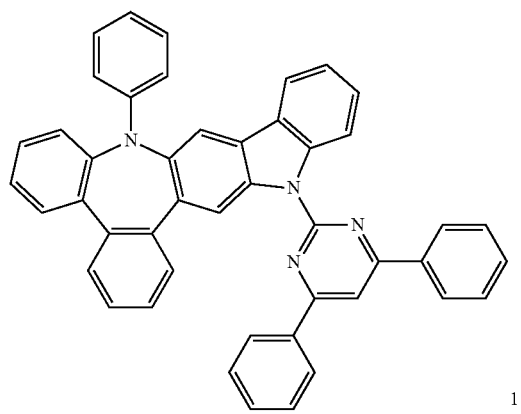
117
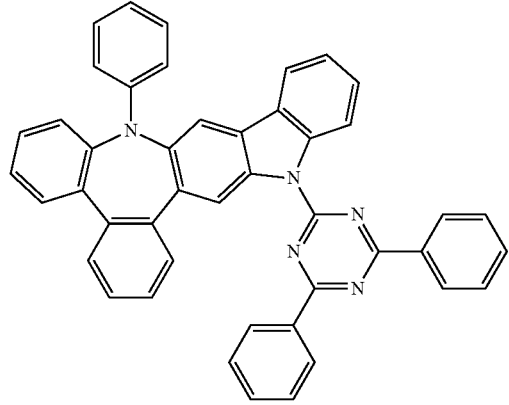
92 -continued
118
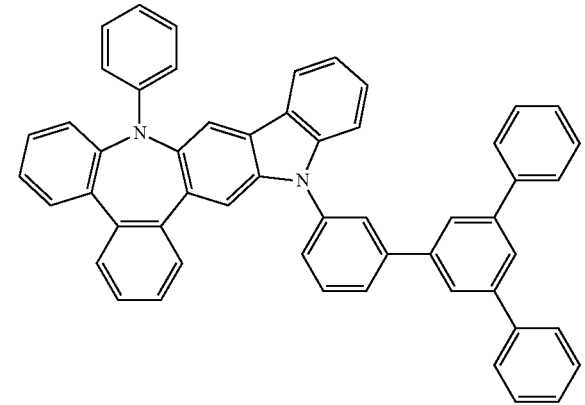
119
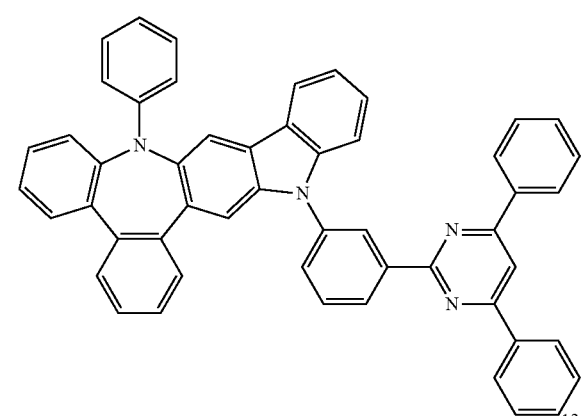
120
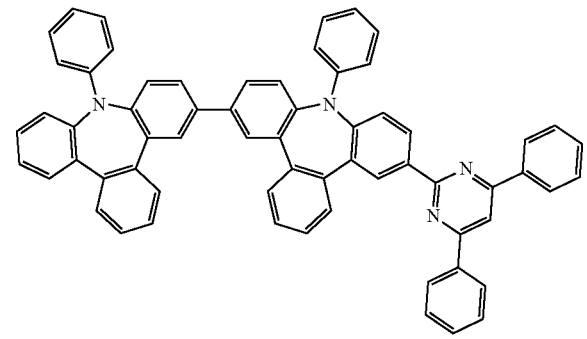
121
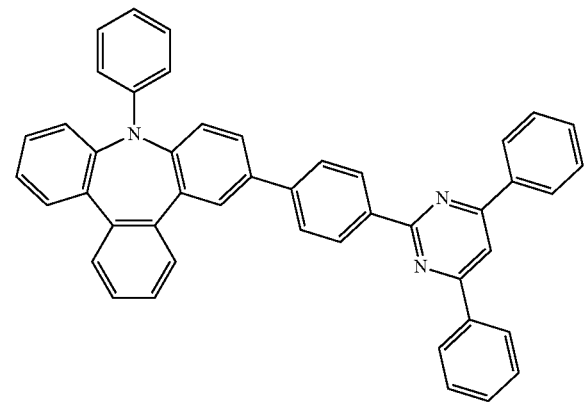

provided that when each of $A_1$ to $A_3$ in Formula 1A is a group derived from a benzene, at least one of $R_{11}$ to $R_{13}$ may be an electron-transporting moiety, being a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group.

In other embodiments, regardless $A_1$ to $A_3$ in Formula 1A, at least one of $R_{11}$ to $R_{13}$ may be an electron-transporting moiety, being a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group.

When the electron-transporting moiety, instead of the central nitrogen atom ("central N"), is necessarily linked to one of $A_1$ to $A_3$ in the core of Formula 1A (in the case that $X_1$ is N-[$(L_1)_{a1}$-$(R_1)_{b1}$]), excellent chemical and electric stability may be obtained (see Formula 1A' below).

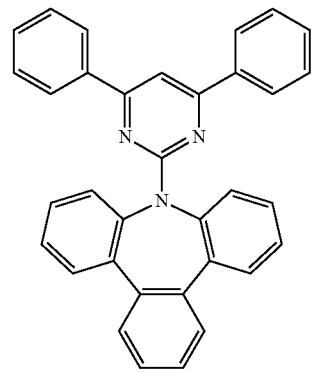

Compound A

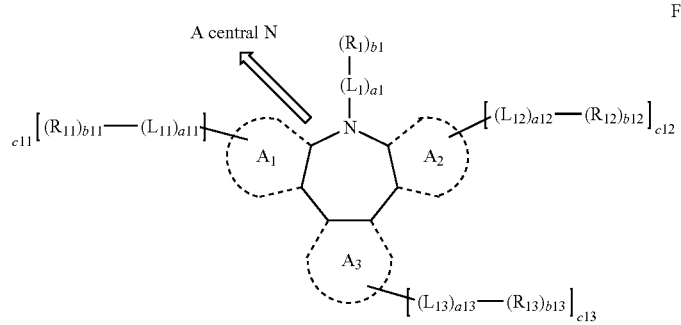

Formula 1A'

The highest occupied molecular orbital (HOMO), the lowest unoccupied molecular orbital (LUMO), a singlet (S1) energy level, and a triplet (T1) energy level of Compounds 3, 5, 8, 10, 11, 13, 14, 59, 82, 84, 88, 91, 96, 116, 120, and 121, and Compound A below were evaluated by using Gaussian program DFT method (the structure is optimized at B3LYP, 6-31G(d,p) level), and evaluation results are shown in Table 1 below.

TABLE 1

| Compound No. | HOMO(eV) | LUMO(eV) | S1 energy level (eV) | T1 energy level (eV) |
|---|---|---|---|---|
| Compound A | −5.608 | −1.479 | 3.531 | 2.966 |
| Compound 3 | −5.009 | −1.709 | 2.947 | 2.712 |
| Compound 5 | −5.132 | −1.878 | 2.769 | 2.568 |
| Compound 8 | −5.099 | −1.931 | 2.823 | 2.656 |
| Compound 10 | −5.010 | −1.708 | 3.027 | 2.886 |
| Compound 11 | −5.068 | −1.866 | 2.890 | 2.825 |
| Compound 13 | −5.068 | −1.866 | 2.890 | 2.825 |
| Compound 14 | −5.063 | −1.860 | 2.975 | 2.949 |
| Compound 59 | −5.108 | −1.760 | 3.004 | 2.745 |
| Compound 82 | −5.110 | −0.875 | 3.565 | 2.881 |
| Compound 84 | −5.129 | −0.987 | 3.509 | 2.877 |
| Compound 88 | −5.117 | −0.933 | 3.515 | 2.863 |
| Compound 91 | −5.046 | −1.515 | 3.295 | 2.959 |
| Compound 96 | −5.098 | −1.825 | 2.837 | 2.786 |
| Compound 116 | −4.916 | −1.826 | 2.761 | 2.724 |
| Compound 120 | −5.025 | −1.724 | 2.965 | 2.714 |
| Compound 121 | −5.031 | −1.685 | 3.065 | 2.731 |

From Table 1, it is confirmed that HOMO energy levels of Compounds 3, 5, 8, 10, 11, 13, 14, 59, 82, 84, 88, 91, 96, 116, 120, and 121 are higher than the HOMO energy level of Compound A. That is, absolute values of HOMO energy levels of Compounds 3, 5, 8, 10, 11, 13, 14, 59, 82, 84, 88, 91, 96, 116, 120, and 121 are smaller than the absolute value of the HOMO energy level of Compound A. Accordingly, an organic light-emitting device including the condensed cyclic compound, such as Compounds 3, 5, 8, 10, 11, 13, 14, 59, 82, 84, 88, 91, 96, 116, 120, and 121, has a low driving voltage, and thus, the organic light-emitting device has improved efficiency and lifespan characteristics.

From Table 1, it is confirmed that LUMO energy levels of Compounds 3, 5, 8, 10, 11, 13, 14, 59, 91, 96, 116, 120, and 121 are lower than the LUMO energy level of Compound A. That is, absolute values of LUMO energy levels of Compounds 3, 5, 8, 10, 11, 13, 14, 59, 91, 96, 116, 120, and 121 are greater than the absolute value of the LUMO energy level of Compound A. By doing so, the condensed cyclic compound, such as Compounds 3, 5, 8, 10, 11, 13, 14, 59, 91, 96, 116, 120, and 121 makes a valance in delivering holes and electrons, and accordingly, the condensed cyclic compound may be appropriate for use as a material for an organic light-emitting device, for example, a host material in an emission layer.

From Table 1, it is confirmed that Compounds 82, 84, and 88 have very high LUMO energy levels. That is, absolute values of the LUMO energy levels of Compounds 82, 84, and 88 are relatively smaller than absolute values of the LUMO energy levels of other compounds. In this regard, the condensed cyclic compound, such as Compounds 82, 84 and 88, has excellent hole-transporting capability. Accordingly, the condensed cyclic compound may be suitable for use as a material for an organic light-emitting device, for example, a material for a hole transport region between an anode and an emission layer or a material for a co-host in the emission layer.

From Table 1, it is confirmed that the compounds above have electric characteristics that are suitable for use as a material for forming an organic light-emitting device.

Two azepine cores in Formula 1B are combined with each other by linking $A_6$ to $A_7$, two azepine cores in Formula 1C are combined with each other by linking $A_6$ to $A_8$, and two azepine cores in Formula 1 D are combined with each other by linking $A_5$ to $A_8$. Accordingly, when a thin film is formed by using the condensed cyclic compound represented by one of Formulae 1B to 1D, the formed thin film has homogeneous thin-film morphology. Thus, a device including a thin film including the condensed cyclic compound represented by one of Formulae 1B to 1D may have excellent processability and excellent electrical characteristics.

Also, an organic light-emitting device including the condensed cyclic compound represented by one of Formulae 1A to 1D may have low roll-off-ratio characteristics.

The roll off ratio indicates a decrease in a current efficiency during driving under high brightness conditions, with respect to a current efficiency during driving under a reference brightness condition. When the roll off ratio is smaller, the decrease of the current efficiency during driving under high brightness conditions is lower. Thus, a high-quality device is produced.

The roll off ratio is calculated as follows:

[(current efficiency at reference brightness−current efficiency at relative high brightness)/current efficiency at reference brightness×100(%)].

Herein, the relative high brightness is a brightness higher than the reference brightness, and may be 2 to 15 times as high as the reference brightness.

For example, the roll off ratio is calculated as follows:

[(current efficiency at 1000 cd/m$^2$−current efficiency at 9000 cd/m$^2$)/current efficiency at 1000 cd/m$^2$×100(%)], but the calculation method is not limited thereto.

The preparation of condensed cyclic compounds represented by Formula 1A to 1 D may be apparent to one of ordinary skill in the art by referring to Synthesis Examples which are explained below.

Accordingly, since the condensed cyclic compounds represented by Formulae 1A to 1 D are suitable for use as a material for an organic layer of an organic light-emitting device, another aspect provides an organic light-emitting device including:

a first electrode;
a second electrode; and
an organic layer disposed between the first electrode and the second electrode,
wherein the organic layer includes an emission layer and at least one of the condensed cyclic compound represented by one of Formulae 1A to 1D.

In the organic light-emitting device,
the first electrode is an anode,
the second electrode is a cathode, and
the organic layer includes
i) a hole transport region that is disposed between the first electrode and the emission layer,
wherein the hole transport region includes at least one layer selected from a hole injection layer, a hole transport layer, an electron blocking layer, and ii) an electron transport region disposed between the emission layer and the second electrode,
wherein the electron transport region includes at least one layer selected from a hole blocking layer, an electron transport layer, and an electron injection layer.

The organic light-emitting device may have, due to the inclusion of an organic layer including at least one of the condensed cyclic compound represented by one of Formulae 1A to 1D, low driving voltage, high efficiency, high brightness, and long lifespan.

The expression "(an organic layer) includes at least one condensed cyclic compounds" used herein may be applicable when "(an organic layer) includes one condensed cyclic compound of Formulae 1A to 1D and when two or more different condensed cyclic compounds of Formulae 1A to 1D.

For example, the organic layer may include, as the condensed cyclic compound, only Compound 11. In this regard, Compound 11 may be situated in an emission layer of the organic light-emitting device. In another embodiment, the organic layer may include, as the condensed cyclic compound, Compound 11 and Compound 82. In this regard, Compound 11 and Compound 82 may be situated in an identical layer (for example, Compound 11 and Compound 82 may both be situated in an emission layer), or different layers (for example, Compound 11 may be situated in an emission layer and Compound 82 may be situated in a hole transport region).

The first electrode may be an anode, which is a hole injection electrode, and the second electrode may be a cathode, which is an electron injection electrode, or the first electrode may be a cathode, which is an electron injection electrode, or the second electrode may be an anode, which is a hole injection electrode.

For example,
the first electrode is an anode,
the second electrode is a cathode, and
the organic layer includes
i) a hole transport region disposed between the first electrode and the emission layer,
wherein the hole transport region includes at least one of a hole injection layer, a hole transport layer, an electron blocking layer, and a hole transport buffer layer, and
ii) an electron transport region disposed between the emission layer and the second electrode,
wherein the electron transport region includes at least one layer selected from a hole blocking layer, an electron transport layer, and an electron injection layer.

When the hole transport region includes a hole transport layer and a hole transport buffer layer, the hole transport buffer layer may be disposed between the hole transport layer and the emission layer.

The term "organic layer" used herein refers to a single layer and/or a plurality of layers disposed between the first electrode and the second electrode of an organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

In the FIGURE, a substrate may be additionally disposed under the first electrode 11 or above the second electrode 19. For use as the substrate, any substrate that is used in general organic light-emitting devices may be used, and the substrate may be a glass substrate or transparent plastic substrate. Each of these substrates may have excellent mechanical strength, thermal stability, transparency, surface smoothness, ease of handling, and water repellency.

The first electrode 11 may be formed by depositing or sputtering a material for forming the first electrode on the substrate. The first electrode 11 may be an anode. The material for the first electrode 11 may be selected from materials with a high work function to make holes be easily injected. The first electrode 11 may be a reflective electrode or a transmissive electrode. The material for the first electrode 11 may be an indium tin oxide (ITO), indium zinc oxide (IZO), tin oxide ($SnO_2$), or zinc oxide (ZnO). According to another embodiment, the material for the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layer structure or a multi-layer structure including two or more layers.

An organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one of a hole injection layer, a hole transport layer, an electron blocking layer, and a hole transport buffer layer.

The hole transport region may include only either a hole injection layer or a hole transport layer. According to another embodiment, the hole transport region may have a structure of hole injection layerhole transport layer or hole injection layerhole transport layerhole transport buffer layer, which are sequentially stacked in this stated order from the first electrode 11.

When the hole injection layer (HIL) includes a hole injection layer, the hole injection layer may be formed on the first electrode 11 by using any one of various methods, for example, vacuum deposition, spin coating, casting, or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Angstrom per second (Å/sec). However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for a hole transport layer, an electron blocking layer, and a hole transport buffer layer may be understood by referring to conditions for forming the hole injection layer.

The hole transport region may include at least one compound selected from m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (PANI/PSS), a compound represented by Formula 201 below, and a compound represented by Formula 202 below:

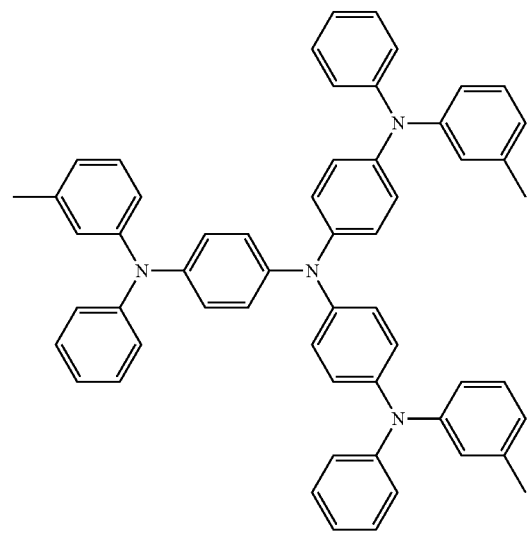

m-MTDATA

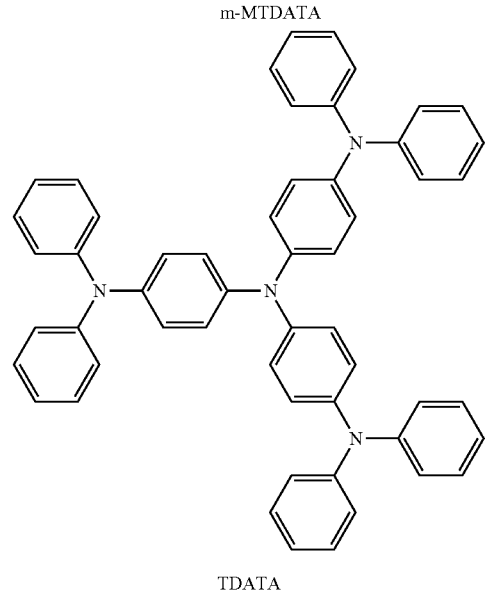

TDATA

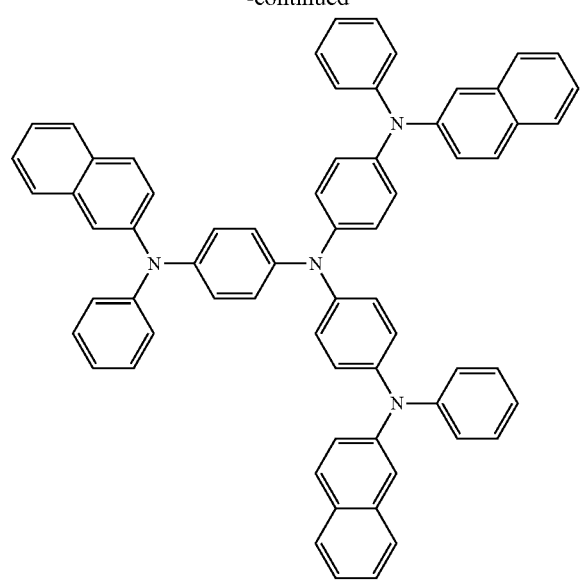
2-TNATA
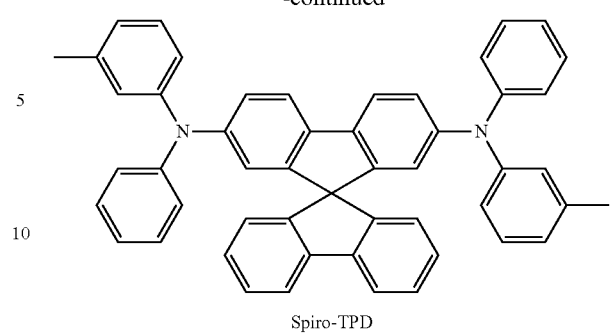
Spiro-TPD
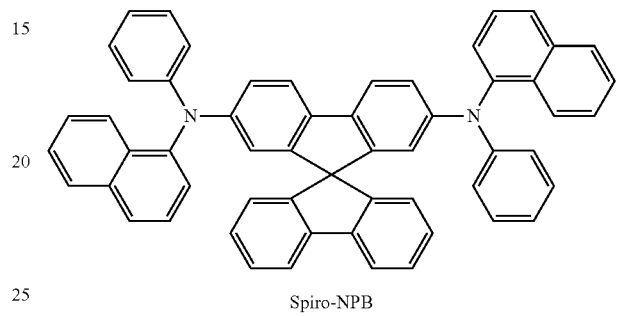
Spiro-NPB
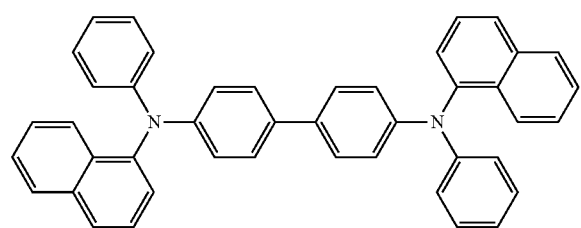
NPB
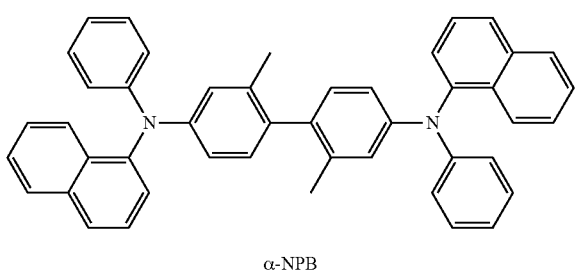
α-NPB
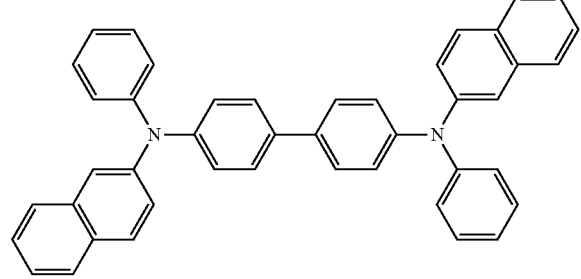
β-NPB
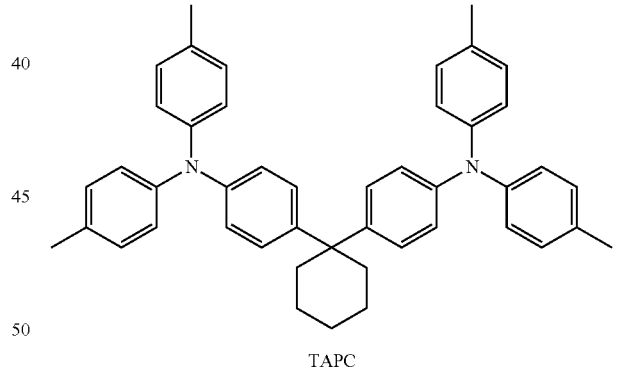
TAPC
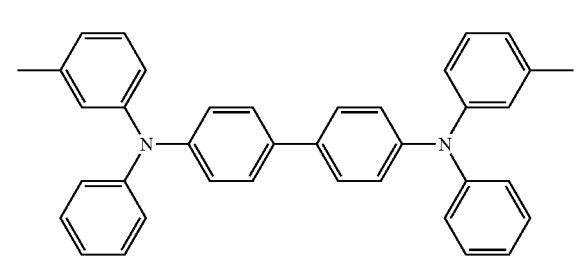
TPD
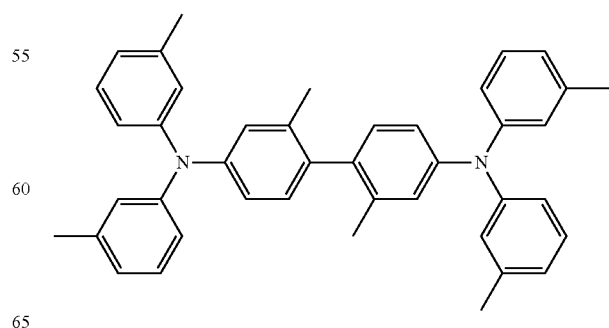
HMTPD Formula 201

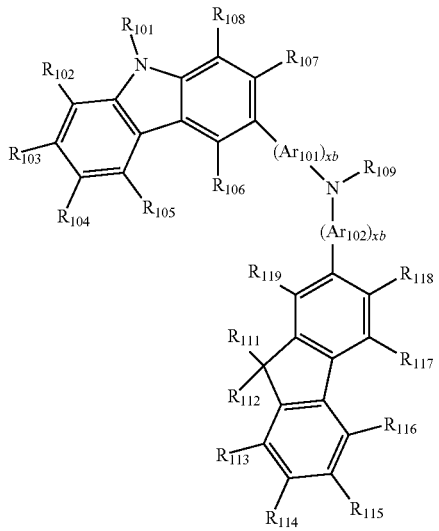

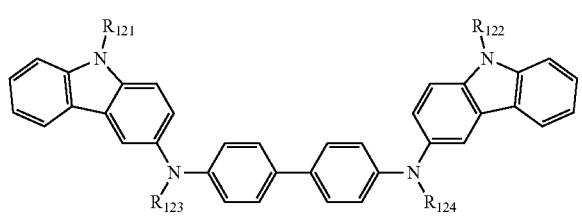
Formula 202

Groups $Ar_{101}$ to $Ar_{102}$ in Formula 201 may be each independently a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthrenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthrenylene group, a triphenylenylene group, a pyrenylene group, a chrysenylenylene group, a naphthacenylene group, a picenylene group, a perylenylene group, or a pentacenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic heterocondensed polycyclic group.

Variables xa and xb in Formula 201 may be each independently an integer of 0 to 5, or 0, 1 or 2. For example, xa may be 1 and xb may be 0, but xa and xb are not limited thereto.

Substituents $R_{101}$ to $R_{108}$, $R_{111}$ to $R_{119}$, and $R_{121}$ to $R_{124}$ in Formulae 201 and 202 may be each independently a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_1$ alkyl group or a $C_1$-$C_{10}$ alkoxy group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, and a pyrenyl group, each substituted with at least one group selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but they are not limited thereto.

Substituents $R_{109}$ in Formula 201 may be a phenyl group, a naphthyl group, an anthracenyl group, or a pyridinyl group; or a phenyl group, a naphthyl group, an anthracenyl group, or a pyridinyl group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A below, but is not limited thereto:

Formula 201A

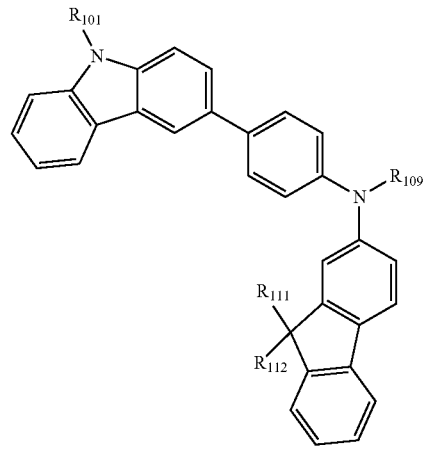

Substituents $R_{101}$, $R_{111}$, $R_{112}$, and $R_{109}$ in Formula 201A may be understood by referring to the description provided herein.
For example, the compound represented by Formula 201, and the compound represented by Formula 202 may include compounds HT1 to HT20 illustrated below, but are not limited thereto.
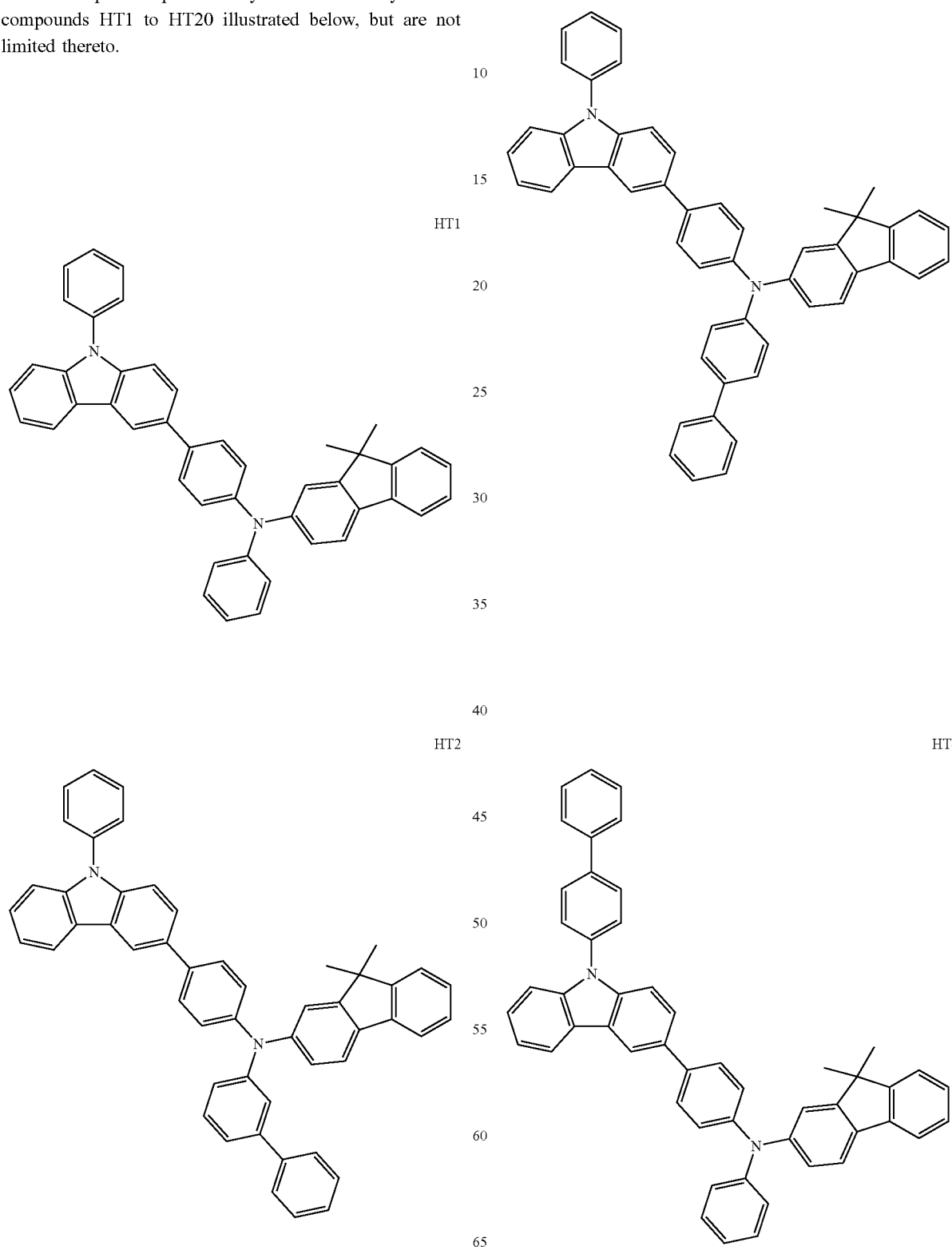

HT5
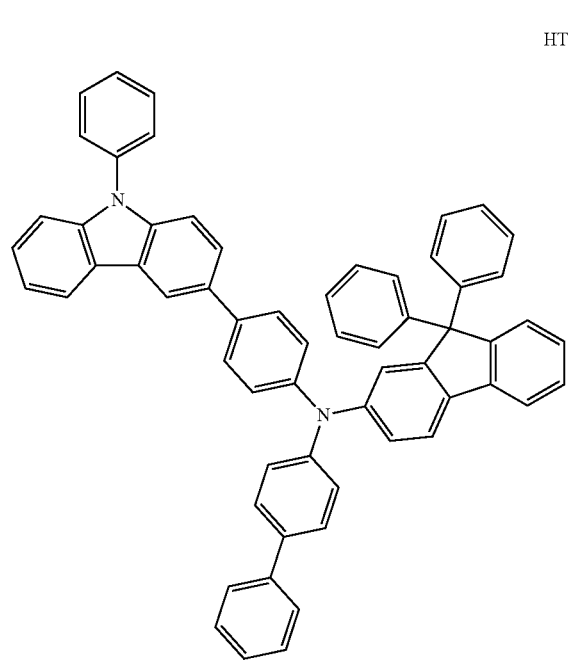
HT6
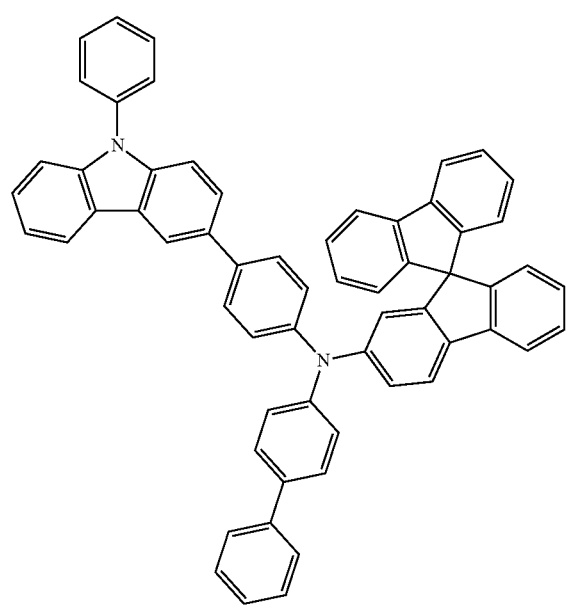
HT7
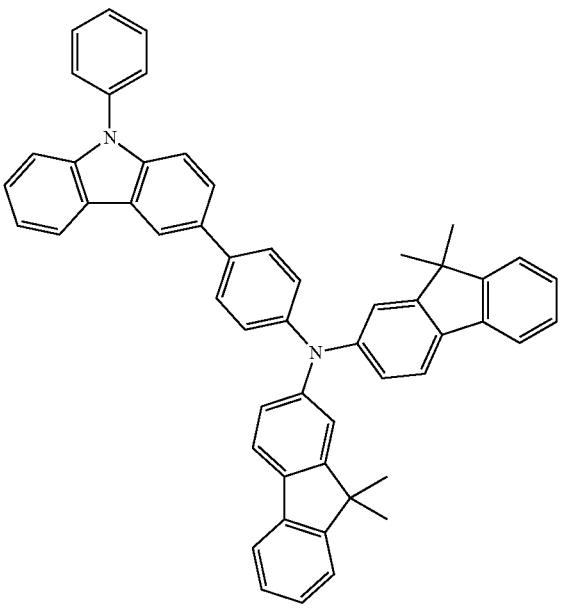
HT8
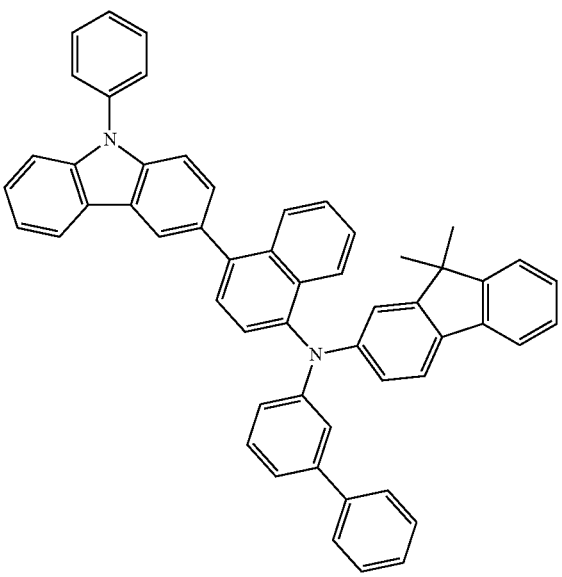

HT9
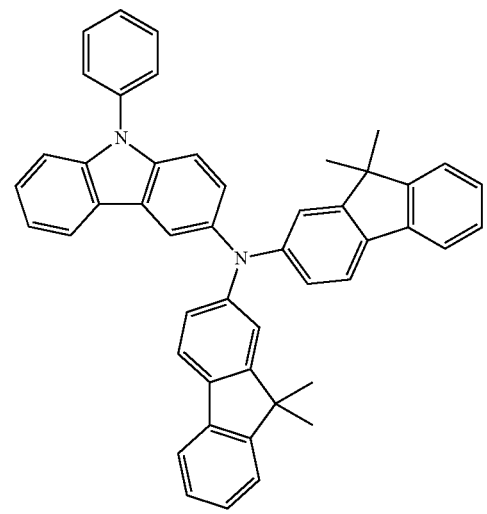
HT10
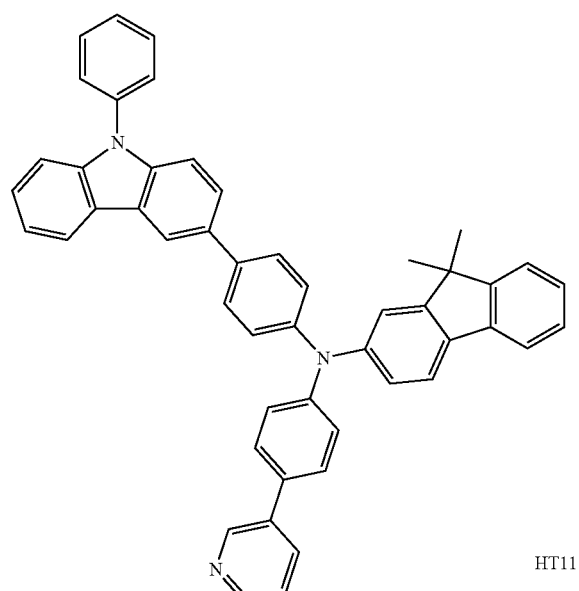
HT11
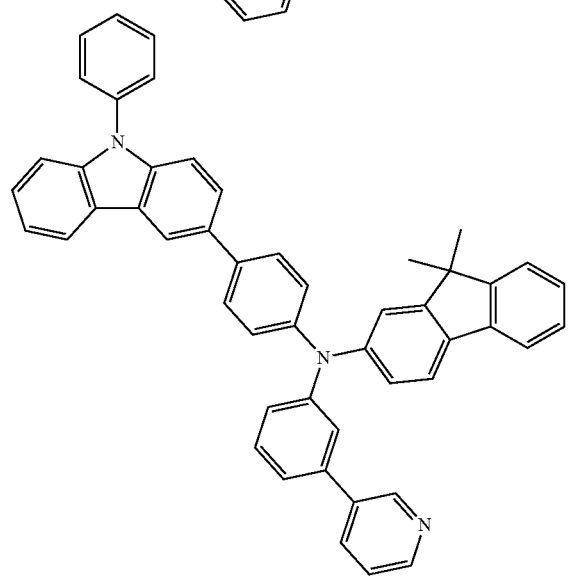
HT12
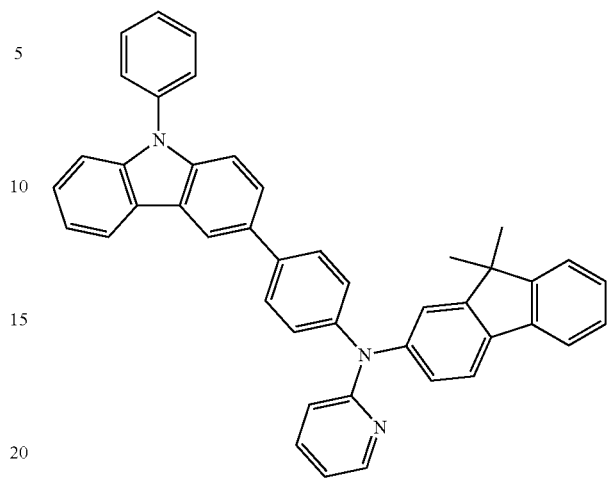
HT13
HT14
HT15

HT16
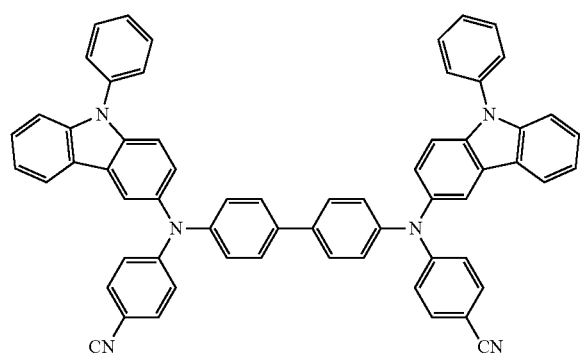

HT20
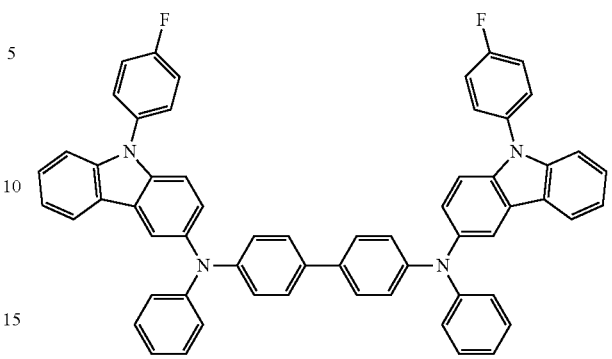

HT17
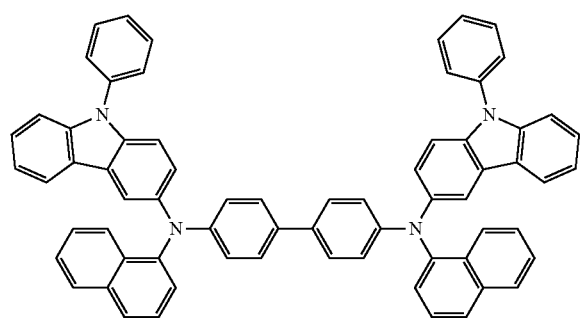

A thickness of the hole transport region may be in a range of about 100 Angstrom (Å) to about 10,000 Å, for example, about 100 Å to about 1,000 Å. When the hole transport region includes a hole injection layer, a hole transport layer, and a hole transport buffer layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å, and a thickness of the hole transport buffer layer is in a range of about 10 Å to about 500 Å. When the thicknesses of the hole transport region, the hole injection layer, the hole transport layer, and the hole transport buffer layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, and a cyano group-containing compound, but is not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

HT18
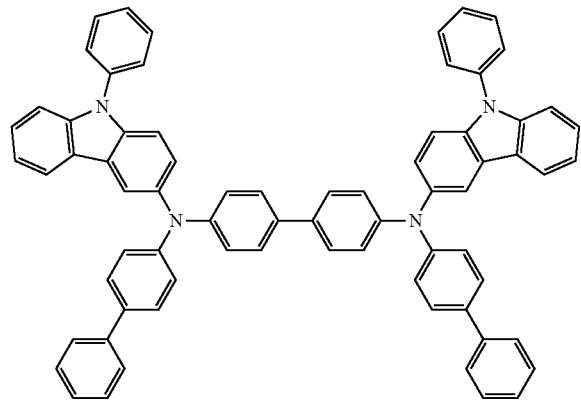

HT19
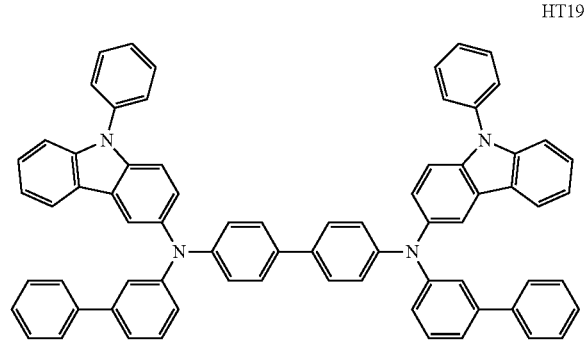

Compound HT-D1
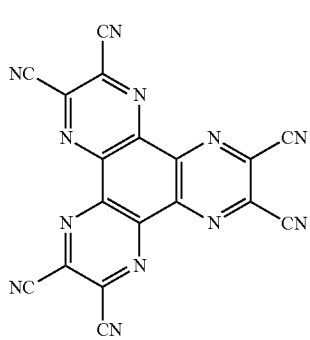

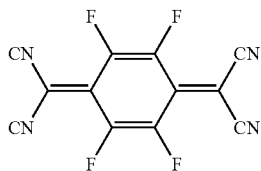
F4-TCNQ

The hole transport region may include a hole transport buffer layer.

The hole transport buffer layer compensates for an optical resonance distance according to the wavelength of light emitted from an emission layer to increase efficiency, and prevents electrons or excitons from entering into a hole transport region from the emission layer.

According to an embodiment, the hole transport region in the organic light-emitting device may include at least one of the condensed cyclic compound represented by one of Formulae 1A to 1D.

For example, the hole transport region includes a hole transport layer and a hole transport buffer layer, and the hole transport buffer layer is disposed between the hole transport layer and the emission layer, and the condensed cyclic compound may be included in the hole transport buffer layer, but features of the hole transport region are not limited thereto.

According to an embodiment, the hole transport region may include the condensed cyclic compound represented by Formulae 1B, 1C, or 1D, in Formulae 1B to 1D, wherein $X_4$ may be N-$[(L_4)_{a4}$-$(R_4)_{b4}]$, $X_7$ may be N-$[(L_7)_{a7}$-$(R_7)_{b7}]$, and $R_4$, $R_7$ and $R_{14}$ to $R_{19}$ in Formulae 1B to 1D may be a hydrogen, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_3$-$C_{10}$ cycloalkenyl group, a $C_6$-$C_{60}$ aryl group, and a monovalent non-aromatic condensed polycyclic group;

a $C_3$-$C_{10}$ cycloalkyl group, a $C_3$-$C_{10}$ cycloalkenyl group, a $C_6$-$C_{60}$ aryl group, or a monovalent non-aromatic condensed polycyclic group; or a $C_3$-$C_{10}$ cycloalkyl group, a $C_3$-$C_{10}$ cycloalkenyl group, a $C_6$-$C_{60}$ aryl group, or a monovalent non-aromatic condensed polycyclic group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_6$-$C_{60}$ aryl group, and a monovalent non-aromatic condensed polycyclic group, but they are not limited thereto.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied to form the hole injection layer although the deposition or coating conditions may vary according to the material that is used to form the emission layer.

The emission layer may include a host and a dopant. The host may include at least one condensed cyclic compound represented by one of Formulae 1A to 1D.

According to an embodiment, the emission layer in the organic light-emitting device may include at least one of the condensed cyclic compound represented by one of Formulae 1A to 1D. In this regard, the emission layer may further include a dopant, and the condensed cyclic compound may act as a host.

According to an embodiment, the emission layer of the organic light-emitting device includes the condensed cyclic compound represented by Formula 1A, wherein at least one of $R_{11}$ to $R_{13}$ in Formula 1A may be a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group; or the emission layer includes at least of the condensed cyclic compound represented by one of Formulae 1B to 1D, wherein $X_4$ in Formulae 1B to 1D may be N-$[(L_4)_{a4}$-$(R_4)_{b4}]$, and at least one of $R_4$ to $R_{14}$ in Formulae 1B to 1D may be a substituted or unsubstituted $C_2$-$C_{10}$ heterocycloalkyl group, a substituted or unsubstituted $C_2$-$C_{10}$ heterocycloalkenyl group, a substituted or unsubstituted $C_2$-$C_{60}$ heteroaryl group, or a substituted or unsubstituted monovalent non-aromatic hetero-condensed polycyclic group, but are not limited thereto.

Herein, the emission layer further includes, as a co-host, the condensed cyclic compound represented by Formulae 1B to 1D, wherein in Formulae 1B to 1D, $X_4$ may be N-$[(L_4)_{a4}$-$(R_4)_{b4}]$, $X_7$ may be N-$[(L_7)_{a7}$-$(R_7)_{b7}]$, $R_4$, $R_7$ and $R_{14}$ to $R_{19}$ may be a hydrogen, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_3$-$C_{10}$ cycloalkenyl group, a $C_6$-$C_{60}$ aryl group, and a monovalent non-aromatic condensed polycyclic group;

a $C_3$-$C_{10}$ cycloalkyl group, a $C_3$-$C_{10}$ cycloalkenyl group, a $C_6$-$C_{60}$ aryl group, or a monovalent non-aromatic condensed polycyclic group; or a $C_3$-$C_{10}$ cycloalkyl group, a $C_3$-$C_{10}$ cycloalkenyl group, a $C_6$-$C_{60}$ aryl group, or a monovalent non-aromatic condensed polycyclic group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a C$_6$-C$_{60}$ aryl group, and a monovalent non-aromatic condensed polycyclic group, but they are not limited thereto.

For example, the emission layer may include, as a host, only Compound 11, or a combination of Compounds 11 and 82.

When the organic light-emitting device is a full color organic light-emitting device, the emission layer may be patterned into a red emission layer, a green emission layer, and a blue emission layer. According to another embodiment, due to a stack structure including a red emission layer, a green emission layer, and/or a blue emission layer, the emission layer may emit white light. A host in the red emission layer, the green emission layer, and the blue emission layer may include the condensed cyclic compound represented by one of Formulae 1A to 1D. According to an embodiment, the host in the green emission layer may include the condensed cyclic compound represented by one of Formulae 1A to 1D.

A dopant in the emission layer may be a fluorescent dopant that emits light according to a fluorescent emission mechanism or a phosphorescent dopant that emits light according to a phosphorescent emission mechanism.

According to an embodiment, the emission layer may include a host including the condensed cyclic compound represented by one of Formulae 1A to 1D and a phosphorescent dopant. The phosphorescent dopant may include an organometallic complex including a transition metal (for example, iridium (Ir), platinum (Pt), osmium (Os), or rhodium (Rh)).

The phosphorescent dopant may include an organometallic complex represented by Formula 81 below:

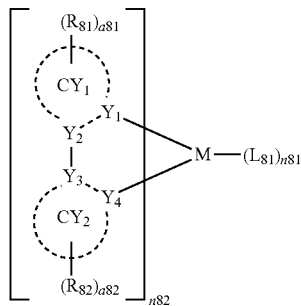

Formula 81 wherein in Formula 81,

M may be selected from iridium (Ir), platinum (Pt), osmium (Os), titanium (Ti), zirconium (Zr), hafnium (Hf), europium (Eu), terbium (Tb), and thulium (Tm);

$Y_1$ to $Y_4$ are each independently selected from carbon (C) or nitrogen (N);

$Y_1$ and $Y_2$ are linked via a single bond or a double bond, and $Y_3$ and $Y_4$ are linked via a single bond or a double bond;

$CY_1$ and $CY_2$ are each independently selected from a benzene, a naphthalene, a fluorene, a spiro-fluorene, an indene, a pyrrole, a thiophene, a furan, an imidazole, a pyrazole, a thiazole, an isothiazole, an oxazole, an isooxazole, a pyridine, a pyrazine, a pyrimidine, a pyridazine, a quinoline, an isoquinoline, a benzoquinoline, a quinoxaline, a quinazoline, a carbazole, a benzoimidazole, a benzofuran, a benzothiophene, an isobenzothiophene, a benzooxazole, an isobenzooxazole, a triazole, a tetrazole, an oxadiazole, a triazine, a dibenzofuran, or a dibenzothiophene, and $CY_1$ and $CY_2$ are optionally linked to each other through a single bond or an organic linking group;

$R_{81}$ to $R_{82}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_2$-C$_{10}$ heterocycloalkyl group, a substituted or unsubstituted C$_3$-C$_{10}$ cycloalkenyl group, a substituted or unsubstituted C$_2$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_2$-C$_{60}$ heteroaryl group, a substituted or unsubstituted monovalent non-aromatic condensed polycyclic group, a substituted or unsubstituted monovalent non-aromatic hetero-condensed polycyclic group, —N(Q$_1$)(Q$_2$), —Si(Q$_3$)(Q$_4$)(Q$_5$), or —B(Q$_6$)(Q$_7$);

a81 and a82 are each independently an integer of 1 to 5;

n81 is an integer of 0 to 4;

n82 is 1, 2, or 3; and

L$_{81}$ is selected from a monovalent organic ligand, a divalent organic ligand, and a trivalent organic ligand.

The phosphorescent dopant may include at least one of Compounds PD1 to PD74 below, but is not limited thereto:

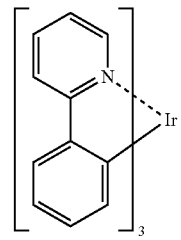

PD1

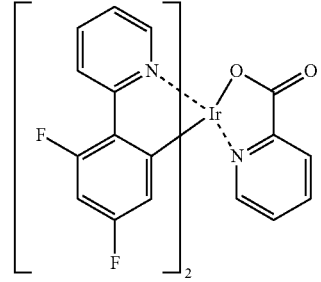

PD2

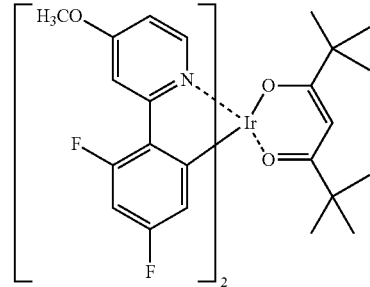

PD3

-continued
PD4
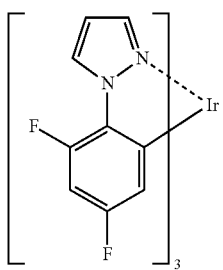
PD5
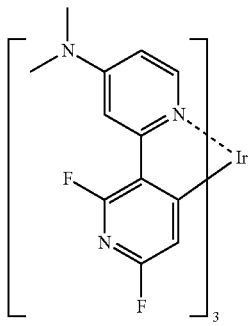
PD6
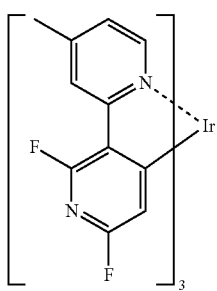
PD7
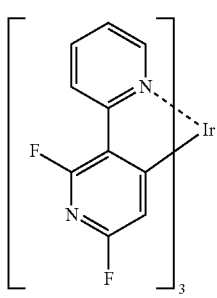
PD8
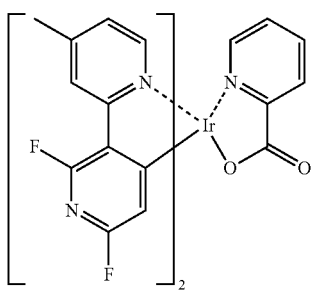
-continued
PD9
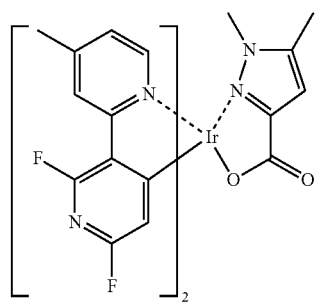
PD10
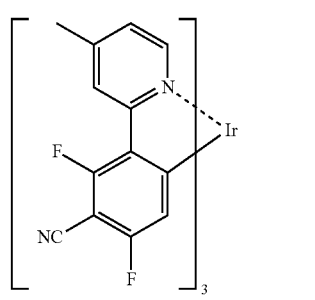
PD11
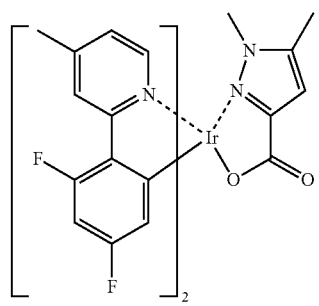
PD12
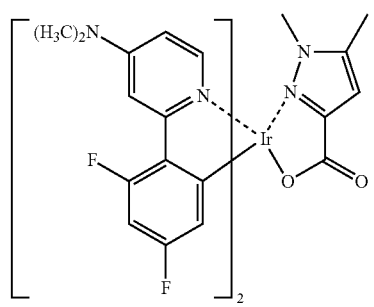
PD13
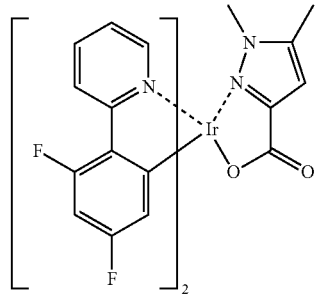

-continued
PD14
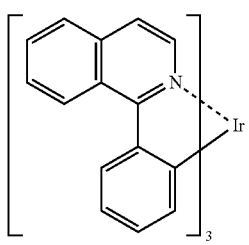
PD15
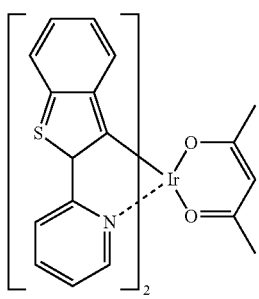
PD16
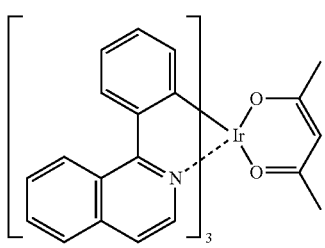
PD17
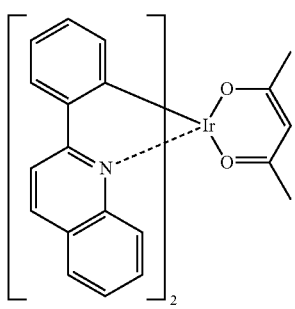
PD18
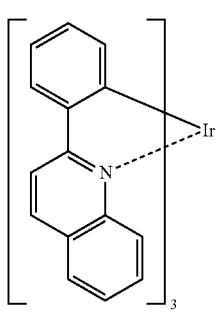
-continued
PD19
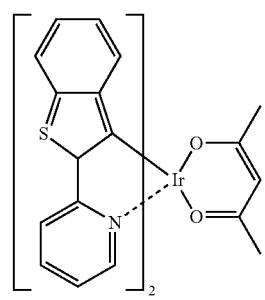
PD20
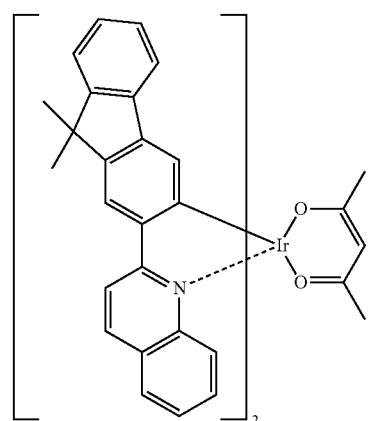
PD21
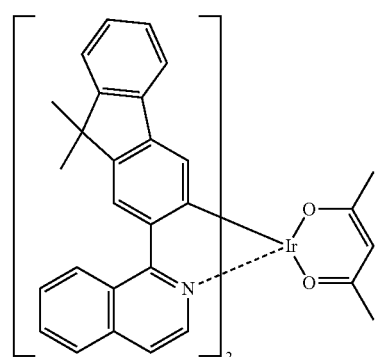
PD22
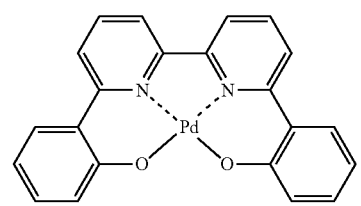
PD23
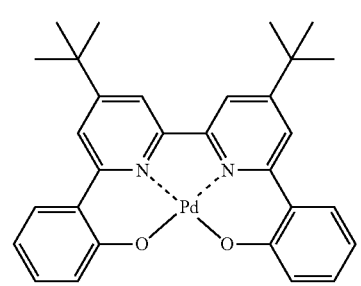

PD24 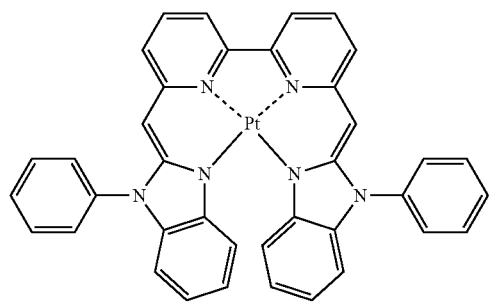
PD30 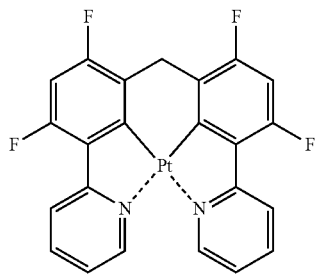
PD25 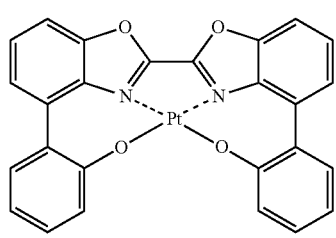
PD31 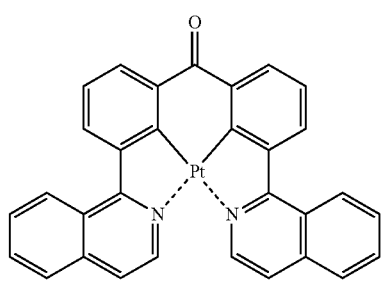
PD26 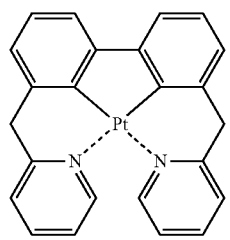
PD32 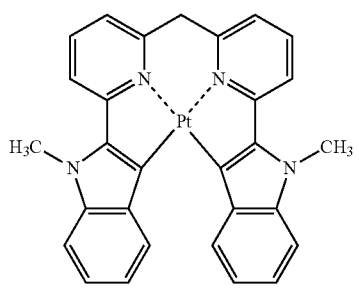
PD27 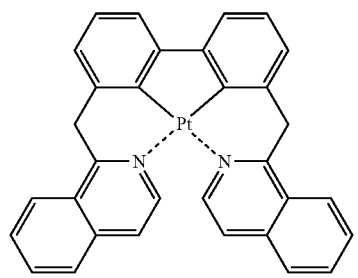
PD33 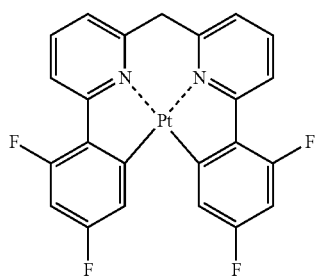
PD28 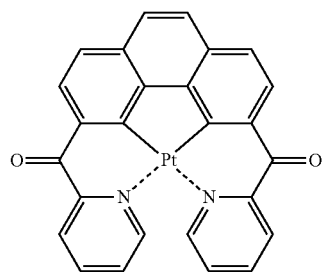
PD29 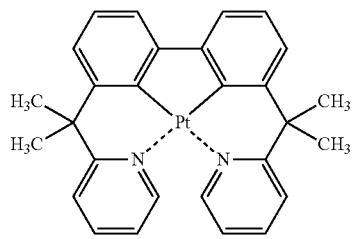
PD34 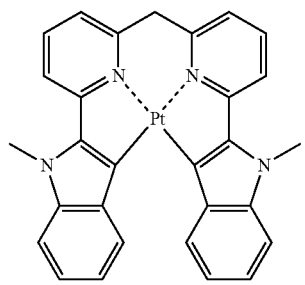

PD35 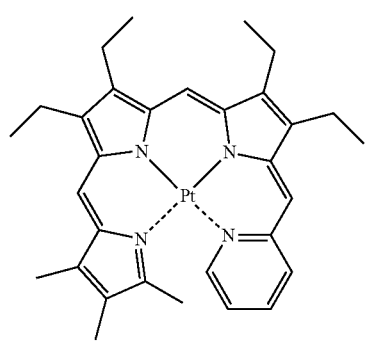
PD36 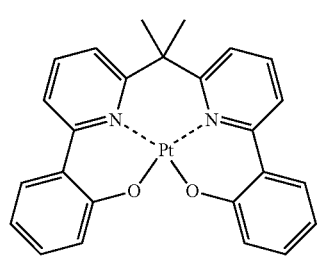
PD37 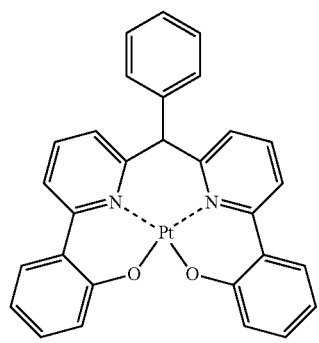
PD38 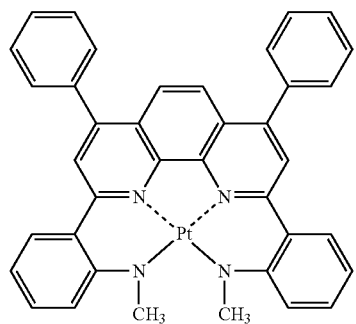
PD39 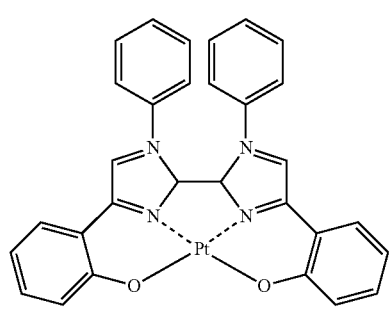
PD40 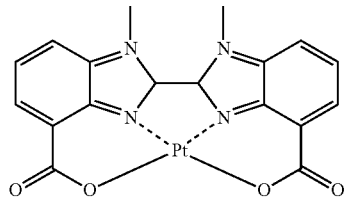
PD41 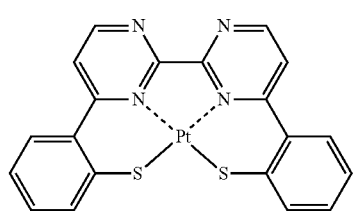
PD42 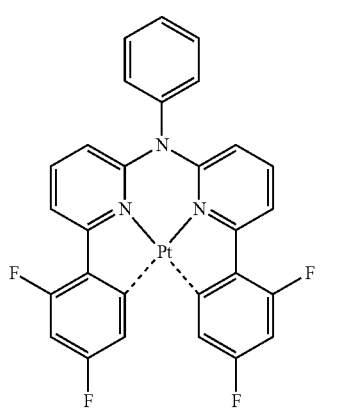
PD43 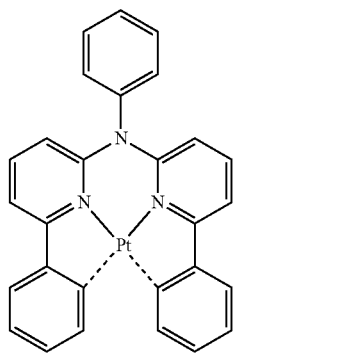
PD44 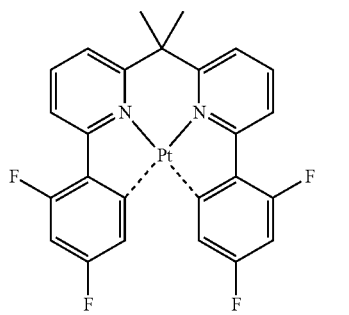

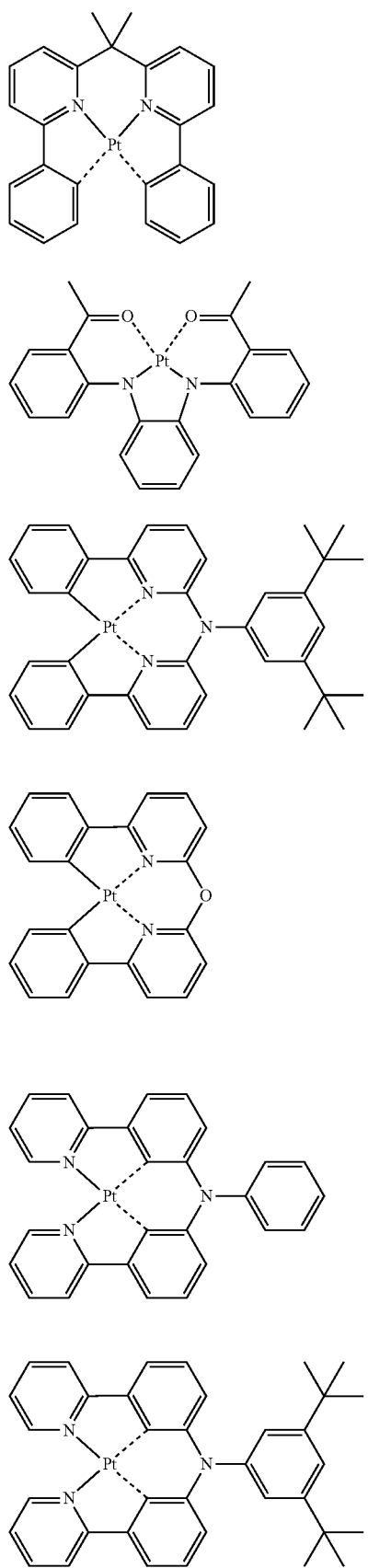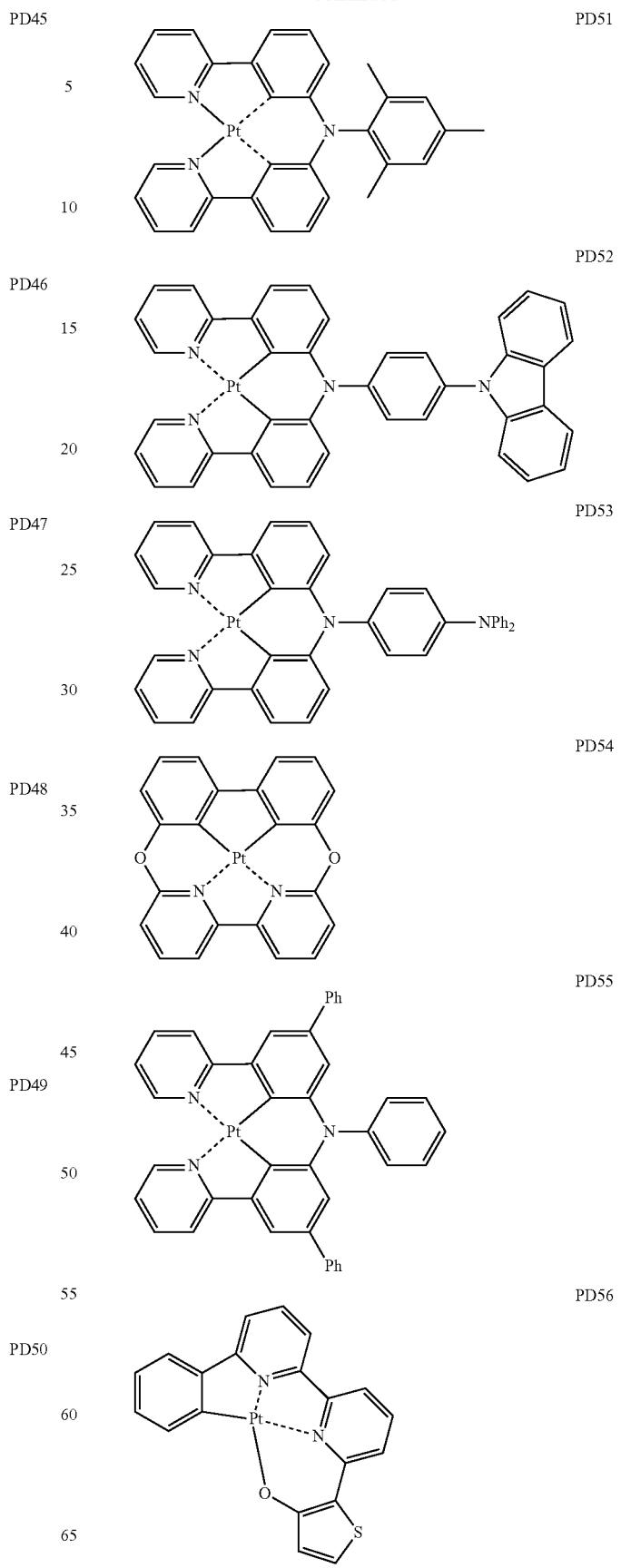

PD57 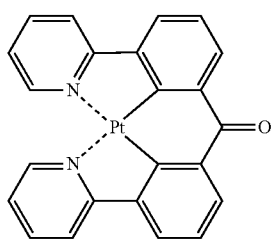
PD58 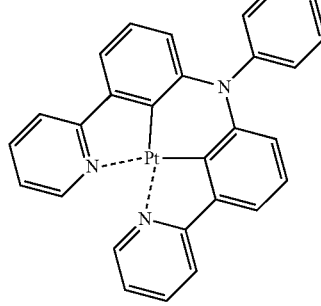
PD59 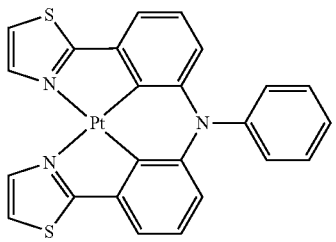
PD60 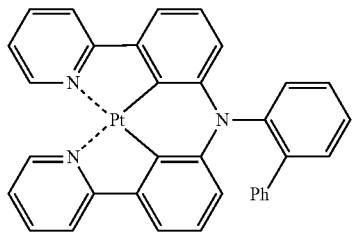
PD61 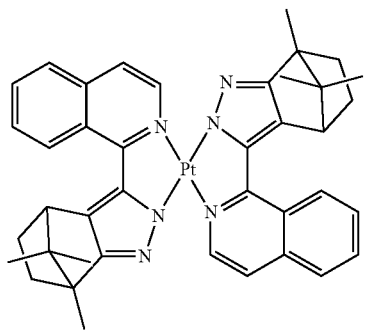
PD62 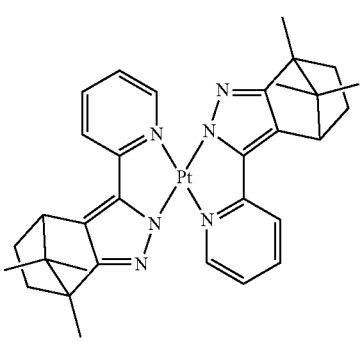
PD63 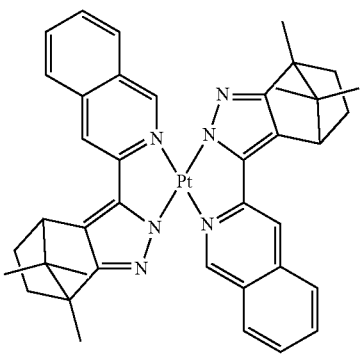
PD64 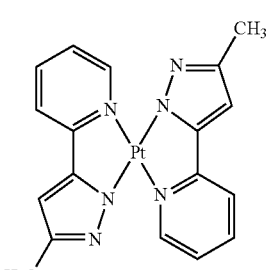
PD65 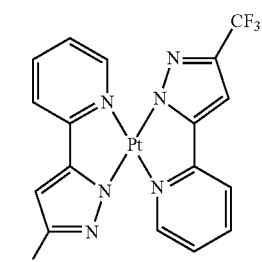
PD66 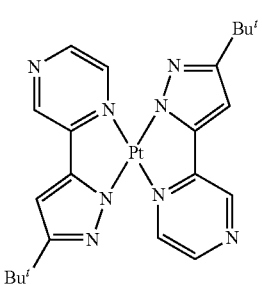

-continued
PD67
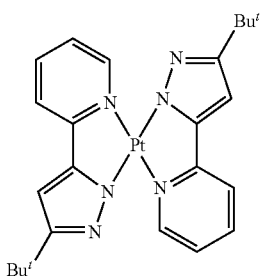
PD68
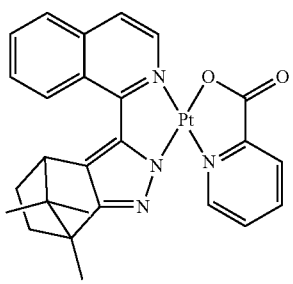
PD69
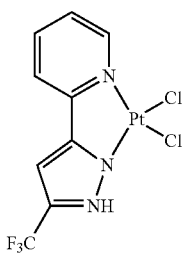
PD70
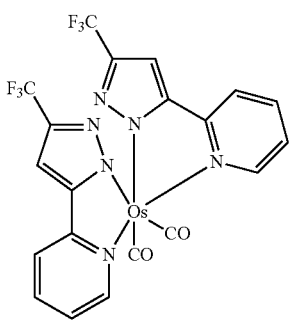
PD71
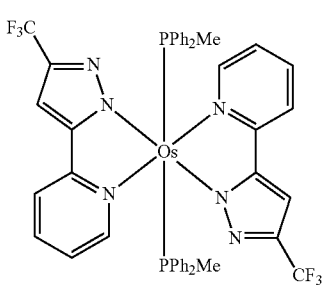
-continued
PD72
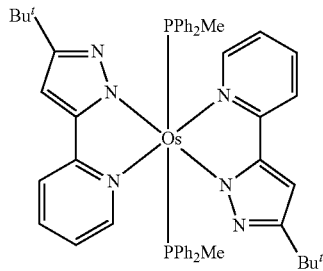
PD73
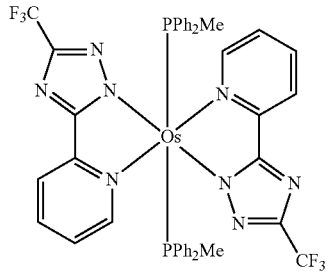
PD74
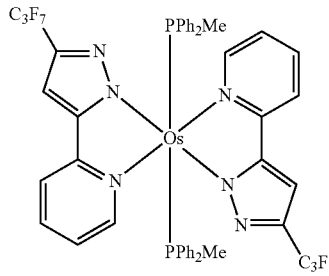
According to another embodiment, the phosphorescent dopant may include PtOEP or Compound PhGD illustrated below:
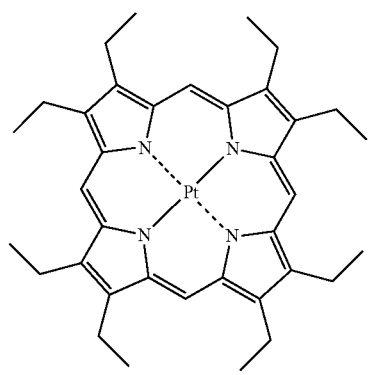
PtOEP
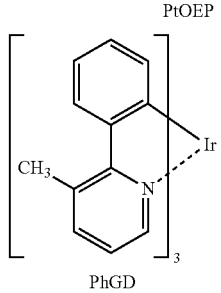
PhGD The fluorescent dopant may include at least one compound selected from DPAVBi, BDAVBi, TBPe, DCM, DCJTB, Coumarin 6, and C545T.

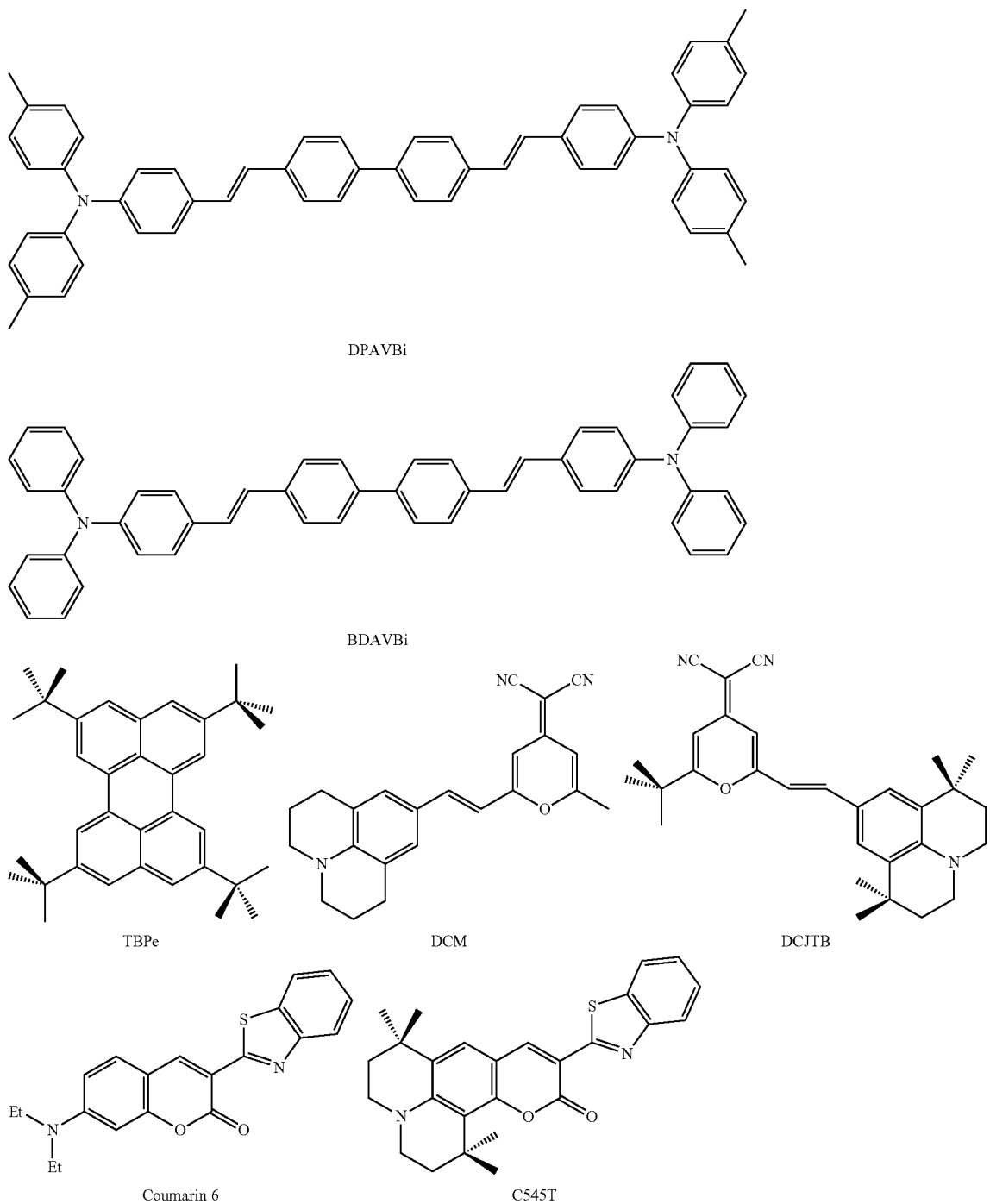

When the emission layer includes a host and a dopant, an amount of the dopant may be in a range of about 0.01 to about 20 parts by weight based on 100 parts by weight of the host, but is not limited thereto.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Then, an electron transport region may be disposed on the emission layer.

The electron transport region may include at least one layer selected from a hole blocking layer, an electron transport layer, and an electron injection layer.

For example, the electron transport region may have a structure of electron transport layer, hole blocking layer/electron transport layer/electron injection layer or electron transport layer/electron injection layer, but is not limited thereto. The electron transport layer may have a single-layered structure or a multi-layer structure including two or more different materials.

Conditions for forming the hole blocking layer, the electron transport layer, and the electron injection layer which constitute the electron transport region may be understood by referring to the conditions for forming the hole injection layer.

When the electron transport layer includes a hole blocking layer, the hole blocking layer may include, for example, at least one of BCP, Bphen, and Balq but is not limited thereto.

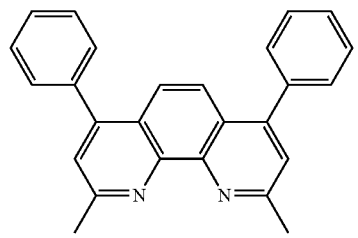

BCP

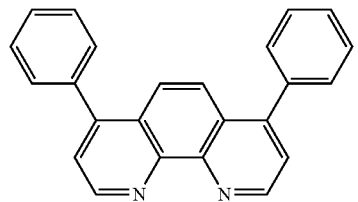

Bphen

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may further include, in addition to the condensed cyclic compound represented by Formula 1, at least one compound selected from BCP, Bphen, Alq$_3$, Balq, TAZ, and NTAZ.

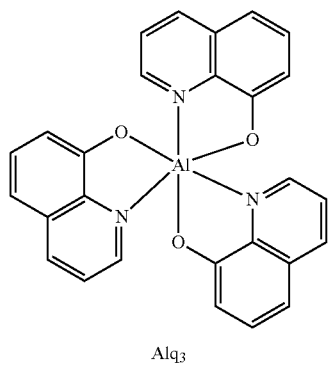

Alq$_3$

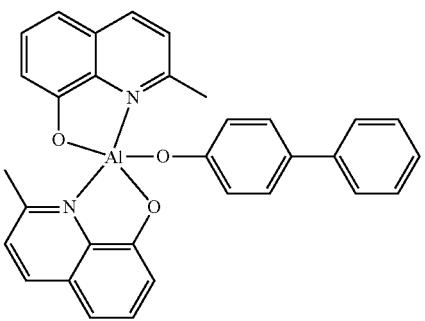

BAlq

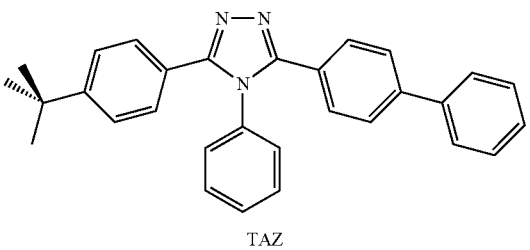

TAZ

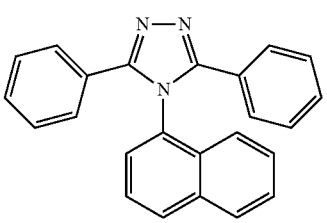

NTAZ

According to another embodiment, the electron transport layer may include at least one of ET1 and ET2, but are not limited thereto:

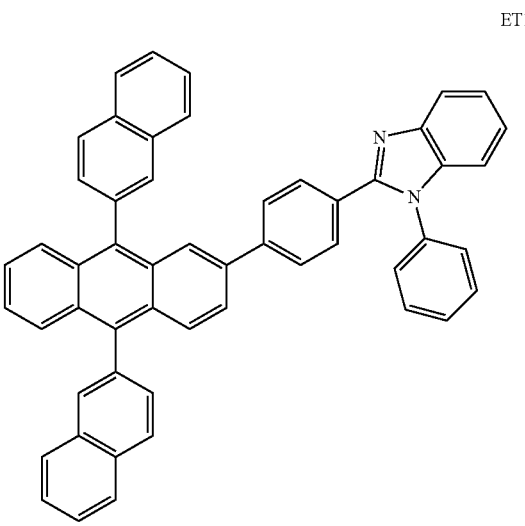

ET1

-continued

ET2

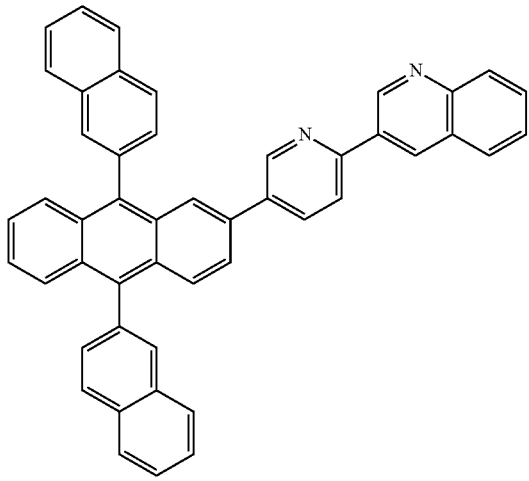

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

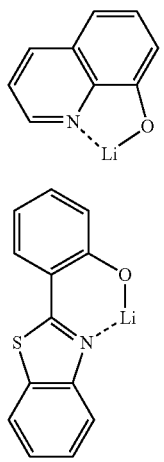

ET-D1

ET-D2

The electron transport region may include an electron injection layer (EIL) that allows electrons to be easily provided from the second electrode 19.

The electron injection layer may include at least one compound selected from, LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top emission type light-emitting device, a transmissive electrode formed using ITO or IZO may be used as the second electrode 19.

Hereinbefore, the organic light-emitting device has been described with reference to the FIGURE but is not limited thereto.

A $C_1$-$C_{60}$ alkyl group used herein refers to a linear or branched aliphatic hydrocarbon monovalent group having 1 to 60 carbon atoms. Detailed examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —$OA_{101}$ (wherein $A_{101}$ is the $C_1$-$C_{60}$ alkyl group). Detailed examples thereof are a methoxy group, an ethoxy group, and an isopropyloxy group.

A $C_2$-$C_{60}$ alkenyl group used herein refers to a hydrocarbon group formed by substituting at least one carbon double bond in the middle or at the terminal of the $C_2$-$C_{60}$ alkyl group. Detailed examples thereof are an ethenyl group, a propenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group formed by substituting at least one carbon triple bond in the middle or at the terminal of the $C_2$-$C_{60}$ alkyl group. Detailed examples thereof are an ethynyl group, and a propynyl group. A $C_2$-$C_{60}$ alkynylene group used herein refers to a divalent group having the same structure as the $C_2$-$C_{60}$ alkynyl group.

A $C_3$-$C_{10}$ cycloalkyl group used herein refers to a monovalent hydrocarbon monocyclic group having 3 to 10 carbon atoms. Detailed examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_2$-$C_{10}$ heterocycloalkyl group used herein refers to a monovalent monocyclic group having at least one hetero atom selected from N, O, P, and S as a ring-forming atom and 2 to 10 carbon atoms. Detailed examples thereof are a tetrahydrofuranyl group, and a tetrahydrothiophenyl group. A $C_2$-$C_{10}$ heterocycloalkylene group used herein refers to a divalent group having the same structure as the $C_2$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromaticity. Detailed examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_2$-$C_{10}$ heterocycloalkenyl group used herein refers to a monovalent monocyclic group that has at least one hetero atom selected from N, O, P, and S as a ring-forming atom, 2 to 10 carbon atoms, and at least one double bond in its ring. Detailed examples of the $C_2$-$C_{10}$ heterocycloalkenyl group are a 2,3-dihydrofuranyl group and a 2,3-dihydrothiophenyl group. A $C_2$-$C_{10}$ heterocycloalkenylene group used herein refers to a divalent group having the same structure as the $C_2$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_2$-$C_{60}$ heteroaryl group used herein refers to a monovalent group having a carbocyclic aromatic system that has at least one hetero atom selected from N, O, P, and S as a ring-forming atom, and 2 to 60 carbon atoms. A $C_2$-$C_{60}$ heteroarylene group used herein refers to a divalent group having a carbocyclic aromatic system that has at least one hetero atom selected from N, O, P, and S as a ring-forming atom, and 2 to 60 carbon atoms. Examples of the $C_2$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group each include two or more rings, the rings may be fused to each other.

A $C_6$-$C_{60}$ aryloxy group used herein indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

A monovalent non-aromatic condensed polycyclic group used herein refers to a monovalent group that has two or more rings condensed to each other, only carbon atoms (for example, the number of carbon atoms may be in a range of 8 to 60) as a ring forming atoms, wherein the molecular structure as a whole is non-aromatic. A detailed example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group that has two or more rings condensed to each other, has a heteroatom selected from N, O P, and S, other than carbon atoms (for example, the number of carbon atoms may be in a range of 2 to 60), as a ring forming atoms, wherein the molecular structure as a whole is non-aromatic. An example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

At least one of substituents of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic hetero-condensed polycyclic group may be a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic hetero-condensed polycyclic group, —$N(Q_{21})(Q_{22})$, —$Si(Q_{23})(Q_{24})(Q_{25})$ and —$B(Q_{26})(Q_{27})$; or —$N(Q_{31})(Q_{32})$, —$Si(Q_{33})(Q_{34})(Q_{35})$, or —$B(Q_{36})(Q_{37})$; and $Q_1$ to $Q_7$, $Q_{11}$ to $Q_{17}$, $Q_{21}$ to $Q_{27}$, and $Q_{31}$ to $Q_{37}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group.

For example, at least one of substituents of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic hetero-condensed polycyclic group may be a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one group selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthrenyl group, a triphenylenyl group, a pyrenyl group, a chrysenyl group, a naphthacenyl group, a picenyl group, a perilenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthridinyl group, a quinoxalinyl group, a quinazolinyl group, a cynolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, —N($Q_{11}$)($Q_{12}$), —Si($Q_{13}$)($Q_{14}$)($Q_{15}$), and —B($Q_{16}$)($Q_{17}$), each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cynolinyl group, and a quinazolinyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthrenyl group, a triphenylenyl group, a pyrenyl group, a chrysenyl group, a naphthacenyl group, a picenyl group, a perilenyl group, a pentaphenyl group, a hexacenyl group, a pyrrolyl group, an imidazolyl group, pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthridinyl group, a quinoxalinyl group, a quinazolinyl group, a cynolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, each substituted with at least one group selected from a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cynolinyl group, and a quinazolinyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, or an imidazopyridinyl group, each substituted with at least one group selected from a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group and a quinazolinyl group, each substituted with at least one group selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, —N($Q_{21}$)($Q_{22}$), —Si($Q_{23}$)($Q_{24}$)($Q_{25}$), and —B($Q_{26}$)($Q_{27}$), each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group; or
—N($Q_{31}$)($Q_{32}$), —Si($Q_{33}$)($Q_{34}$)($Q_{35}$), or —B($Q_{36}$)($Q_{37}$); and $Q_1$ to $Q_7$, $Q_{11}$ to $Q_{17}$, $Q_{21}$ to $Q_{27}$ and $Q_{31}$ to $Q_{37}$ may be each independently a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthrenyl group, a triphenylenyl group, a pyrenyl group, a chrysenyl group, a naphthacenyl group, a picenyl group, a perilenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthridinyl group, a quinoxalinyl group, a quinazolinyl group, a cynolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, or an imidazopyridinyl group, each substituted with at least one group selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cynolinyl group, and a quinazolinyl group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that a molar equivalent of A was identical to a molar equivalent of B.

EXAMPLE

Synthesis Example 1

Synthesis of Compound 82

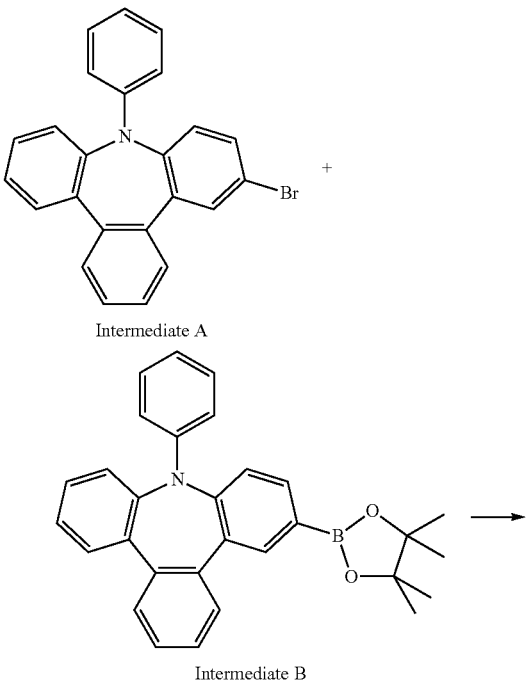

Intermediate A

Intermediate B

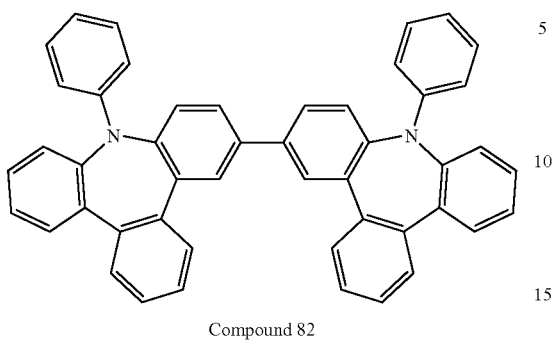

Compound 82

20 g (50.215 mmol) of Intermediate A, 24.6 g (55.236) of Intermediate B, 2.9 g (2.510 mmol) of tetrakis(triphenylphosphine)palladium(0), and 19.8 g (143.6 mmol) of potassium carbonate were suspended in a mixed solution of THF/toluene/distilled water at a ratio of 150/150/150 mL, and then, the mixture was suspended and then refluxed for 18 hours while stirring. When the reaction stopped, 2 L of methanol was slowly added thereto and precipitations were filtered therefrom, and washed with methanol and distilled water, and recrystallized by using a dichlorobenzene solution to obtain 21.30 g (yield 67%) of Compound 82.

$^1$H-NMR (600 MHz, CDCl$_3$): 7.88 (d, 2H); 7.68 (m, 4H); 7.61 (m, 8H); 7.46 (td, 2H); 7.39 (m, 6H); 7.00 (t, 4H); 6.62 (m, 6H).

Synthesis Example 2

Synthesis of Compound 84

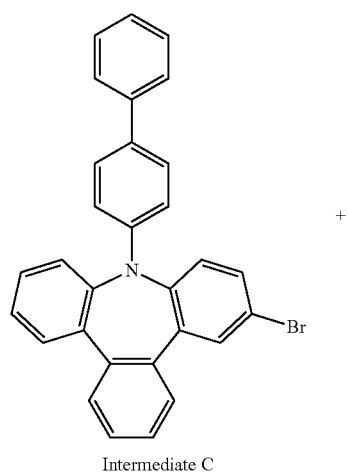

Intermediate C

+

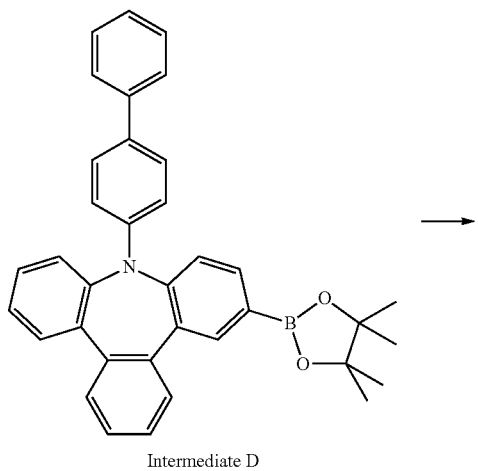

Intermediate D

→

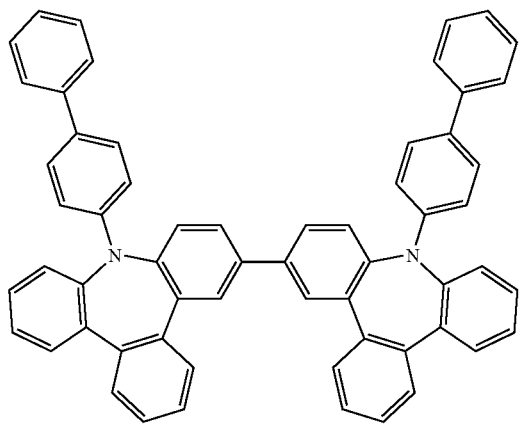

Compound 84

20 g (42.159 mmol) of Intermediate C, 24.18 g (46.375 mmol) of Intermediate D, 2.436 g (2.108 mmol) of tetrakis(triphenylphosphine)palladium(0), and 16.67 g (120.6 mmol) of potassium carbonate were suspended in a mixed solution of THF/toluene/distilled water at a ratio of 150/150/150 mL, and then, the mixture was suspended and then refluxed for 18 hours while stirring. When the reaction stopped, 2 L of methanol was slowly added thereto and precipitations were filtered therefrom, and washed with methanol and distilled water, and recrystallized by using a dichlorobenzene solution to obtain 19.80 g (yield 60%) of Compound 84.

$^1$H-NMR (600 MHz, CDCl$_3$): 7.91 (d, 2H); 7.71 (td, 4H); 7.65 (m, 8H); 7.51 (td, 2H); 7.43 (m, 10H); 7.33 (t, 4H); 7.26 (s, 4H); 7.19 (t, 2H); 6.73 (d, 4H).

Synthesis Example 3

Synthesis of Compound 88

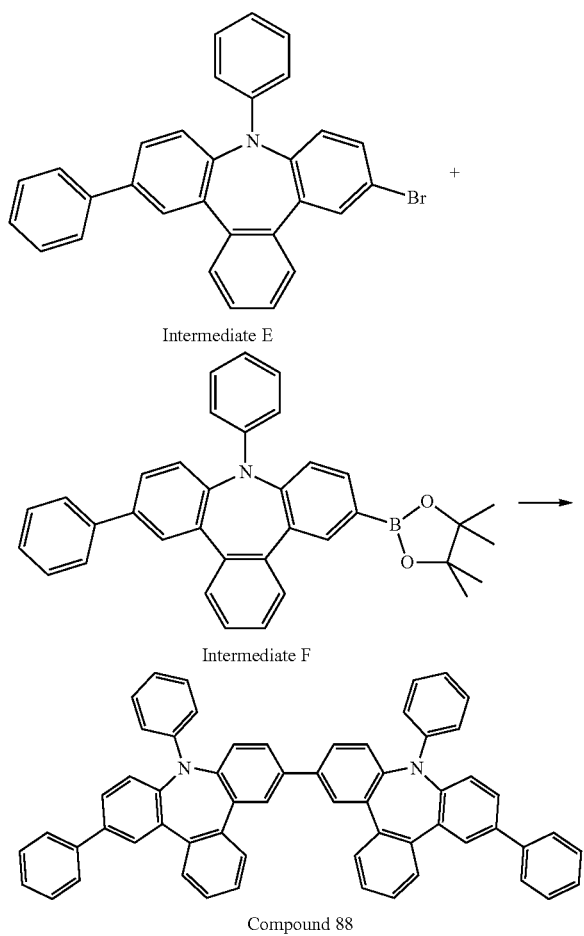

17.20 g (yield 52%) of Compound 88 was obtained in the same manner as in Synthesis Example 3, except that 20 g (42.159 mmol) of Intermediate E was used instead of Intermediate C and 24.18 g (46.375 mmol) of Intermediate F was used instead of Intermediate D.

$^1$H-NMR (600 MHz, CDCl$_3$): 7.89 (m, 4H); 7.68 (m, 16H); 7.42 (m, 10H); 7.03 (q, 4H); 6.68 (m, 6H).

Synthesis Example 4

Synthesis of Compound 11

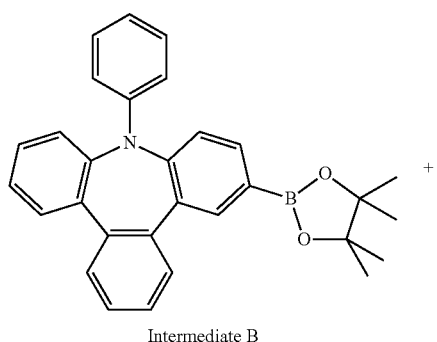

Intermediate B

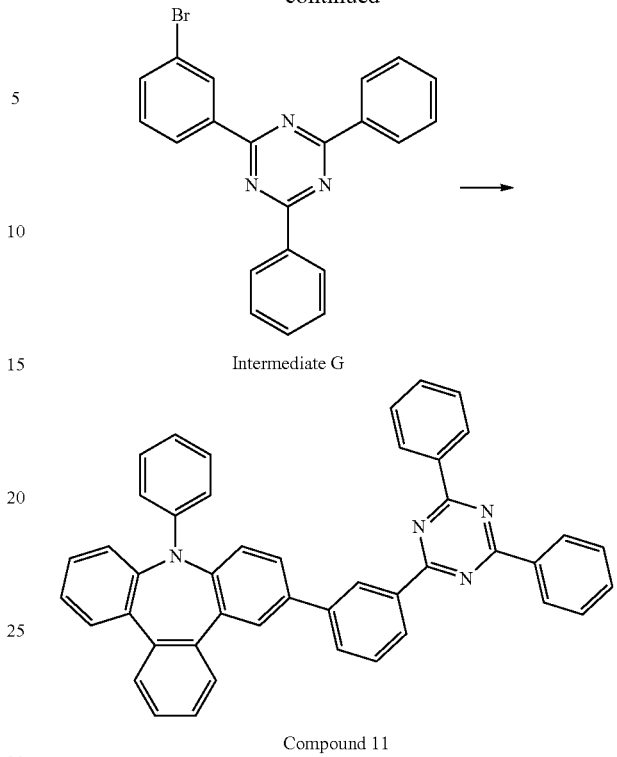

20 g (44.907 mmol) of Intermediate B, 19.179 g (49.398 mmol) of Intermediate G, 2.595 g (2.245 mmol) of tetrakis(triphenylphosphine)palladium(0), and 17.751 g (128.4 mol) of potassium carbonate were suspended in a mixed solution of THF/toluene/distilled water at a ratio of 150/150/150 mL, and then, the mixture was suspended and then refluxed for 18 hours while stirring. When the reaction stopped, 2 L of methanol was slowly added thereto and precipitations were filtered therefrom, and washed with methanol and distilled water, and refined by column chromatography (methylene chloride (MC):hexanes (Hx)=1:4) and recrystallized by using a toluene to obtain 21.0 g (yield 75%) of Compound 11.

$^1$H-NMR (300 MHz, CDCl$_3$): 8.84 (s, 1H), 7.75 (dd, 4H), 8.61 (d, 1H), 7.60 (m, 16H), 7.43 (m, 6H), 6.72 (d, 2H).

Evaluation Example 1

Thermal Characteristics Evaluation on Compounds 82, 84, 88, and 11

Thermal analysis was performed on Compounds 82, 84, 88 and 11 by using thermo gravimetric analysis (TGA) and differential scanning calorimetry (DSC) (N$_2$ atmosphere, temperature range: from room temperature to 800° C. (10° C./min)-TGA, from room temperature to 450° C.-DSC, Pan Type: Pt Pan in disposable Al Pan(TGA), and disposable Al pan(DSC)), and results thereof are shown in Table 2.

TABLE 2

| Compound No. | Td5 | Tg | Tm | Ts |
|---|---|---|---|---|
| Compound 82 | 419 | 170.24 | 332.54 | N/A |
| Compound 84 | 493 | 195.66 | 329.66 | N/A |

TABLE 2-continued

| Compound No. | Td5 | Tg | Tm | Ts |
|---|---|---|---|---|
| Compound 88 | 487 | 192.33 | 330.21 | N/A |
| Compound 11 | 441 | 139.15 | 272.50 | N/A |

From Table 2, it was confirmed that Compounds 82, 84, 88, and 11 have excellent thermal stability.

Example 1

An ITO glass substrate was cut to a size of 50 mm×50 mm×0.5 mm and then, sonicated in acetone isopropyl alcohol and pure water, each for 15 minutes, and then, washed by exposure to UV ozone for 30 minutes.

Then, m-MTDATA was deposited on an ITO electrode (anode) of the glass substrate at a deposition speed of 1 Å/sec to form a hole injection layer having a thickness of 600 Å, then, α-NPB was deposited on the hole injection layer at a deposition speed of 1 Å/sec to form a hole transport layer having a thickness of 250 Å, and then, Compound 82 was deposited on the hole transport layer at a deposition speed of 1 Å/sec to form a hole transport buffer layer having a thickness of 50 Å.

Ir(ppy)$_3$ (dopant) and CBP (host) were co-deposited on the hole transport buffer layer at a deposition speed 0.1 Å/sec and a deposition speed of 1 Å/sec, respectively, to form an emission layer having a thickness of 400 Å.

BAlq was deposited on the emission layer at a deposition speed of 1 Å/sec to form a hole blocking layer having a thickness of 50 Å, and Alq$_3$ was deposited on the hole blocking layer to form an electron transport layer having a thickness of 300 Å, and then, LiF was deposited on the electron transport layer to form an electron injection layer having a thickness of 10 Å, and then, Al was vacuum deposited on the electron injection layer to form a second electrode (cathode) having a thickness of 1,200 Å, thereby completing manufacturing of an organic light-emitting device having a structure of ITO/m-MTDATA (600 Å)/α-NPB (250 Å)/Compound 82 (50 Å)/CBP+10% (Ir(ppy)$_3$) (400 Å)/Balq(50 Å)/Alq$_3$(300 Å)/LiF(10 Å)/Al(1,200 Å).

Example 2

An organic light-emitting device having the structure of ITO/m-MTDATA (600 Å)/α-NPB (250 Å)/Compound 84 (50 Å)/CBP+10% (Ir(ppy)$_3$) (400 Å)/Balq(50 Å)/Alq$_3$(300 Å)/LiF(10 Å)/Al(1,200 Å) was manufactured in the same manner as in Example 1, except that Compound 84 was used instead of Compound 82 in forming the hole transport buffer layer.

Example 3

An organic light-emitting device having the structure of ITO/m-MTDATA (600 Å)/α-NPB (250 Å)/Compound 88 (50 Å)/CBP+10% (Ir(ppy)$_3$) (400 Å)/Balq(50 Å)/Alq$_3$(300 Å)/LiF(10 Å)/Al(1,200 Å) was manufactured in the same manner as in Example 1, except that Compound 88 was used instead of Compound 82 in forming the hole transport buffer layer.

Example 4

An organic light-emitting device having the structure of ITO/m-MTDATA (600 Å)/α-NPB (300 Å)/Compound 11+10% (Ir(ppy)$_3$) (400 Å)/Balq(50 Å)/Alq$_3$(300 Å)/LiF(10 Å)/Al(1,200 Å) was manufactured in the same manner as in Example 1, except that without the formation of the hole transport buffer layer, the thickness of the hole transport layer was changed to 300 Å, and in forming the emission layer, as the host, Compound 11 was used instead of CPB.

Comparative Example 1

An organic light-emitting device having the structure of ITO/m-MTDATA (600 Å)/α-NPB (300 Å)/CBP+10% (Ir(ppy)$_3$) (400 Å)/Balq(50 Å)/Alq$_3$(300 Å)/LiF(10 Å)/Al(1,200 Å) was manufactured in the same manner as in Example 4, except that in forming the emission layer, as the host, CPB was used instead of Compound 11.

Evaluation Example 3

Evaluation on Characteristics of Organic Light-emitting Devices

Characteristics of the organic light-emitting devices manufactured according to Examples 1 to 4 and Comparative Example 1 were evaluated according to the following methods, and results thereof are shown in Table 3.
(1) Change in Current Density According to Voltage
Regarding the manufactured organic light-emitting devices, a current flowing in a unit device was measured by using a current-voltage meter while a voltage was raised from −5 Volts (V) to 10 V, and the measured current value was divided by an area.
(2) Change in Brightness According to Voltage
Regarding the manufactured organic light-emitting devices, brightness was measured by using Minolta Cs-1000A while a voltage was raised from −5 V to 10 V.
(3) Luminescence Efficiency
Current efficiency candelas per ampere (cd/A) was measured at the same current density (10 milliamperes per square centimeter (mA/cm$^2$)) by using brightness, current density, and voltage measured according to (1) and (2).

TABLE 3

| | Hole transport layer | Hole transport buffer layer | Host | Dopant | Driving Voltage Voltage (V) | Current efficiency (cd/A) | Roll off ratio (%) |
|---|---|---|---|---|---|---|---|
| Example 1 | α-NPB (250 Å) | Compound 82 (50 Å) | CBP | Ir(ppy)$_3$ | 7.0 | 36.3 | 15 |
| Example 2 | α-NPB (250 Å) | Compound 84 (50 Å) | CBP | Ir(ppy)$_3$ | 7.0 | 37.6 | 14 |
| Example 3 | α-NPB (250 Å) | Compound 88 (50 Å) | CBP | Ir(ppy)$_3$ | 6.2 | 40.2 | 11 |

TABLE 3-continued

| | Hole transport layer | Hole transport buffer layer | Host | Dopant | Driving Voltage Voltage (V) | Current efficiency (cd/A) | Roll off ratio (%) |
|---|---|---|---|---|---|---|---|
| Example 4 | | α-NPB(300 Å) | Compound 11 | Ir(ppy)$_3$ | 5.8 | 39.2 | 12 |
| Comparative Example 1 | | α-NPB(300 Å) | CBP | Ir(ppy)$_3$ | 6.2 | 32.3 | 25 |

\* Driving voltage and current efficiency in Table 3 were measured at 1,000 cd/m$^2$
\* The roll off ratio in Table 3 was calculated by [(current efficiency at 1,000 cd/m$^2$ − current efficiency at 9,000 cd/m$^2$)/current efficiency at 1,000 cd/m$^2$ × 100 (%)]

Referring to Table 3, it was confirmed that the organic light-emitting devices manufactured according to Examples 1 to 4 have lower driving voltage, higher current efficiency, and lower roll-off-ratio than the organic light-emitting devices manufactured according to Comparative Example 1.

The condensed cyclic compound according to embodiments has excellent electric characteristics and thermal stability. Accordingly, an organic light-emitting device including the condensed cyclic compound may have a low driving voltage, high efficiency, high brightness, and a long lifespan.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A condensed cyclic compound represented by one of Formulae 1A to 1D:

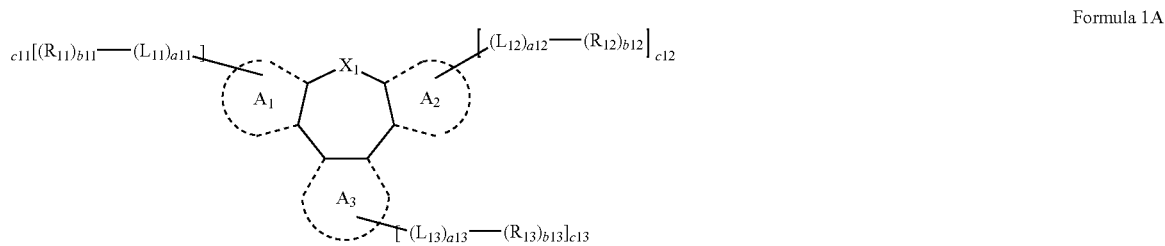

Formula 1A

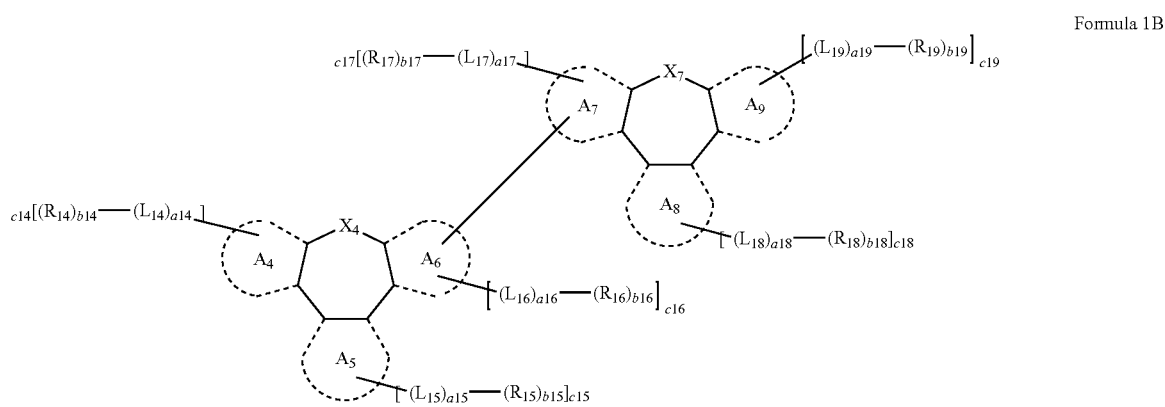

Formula 1B

-continued

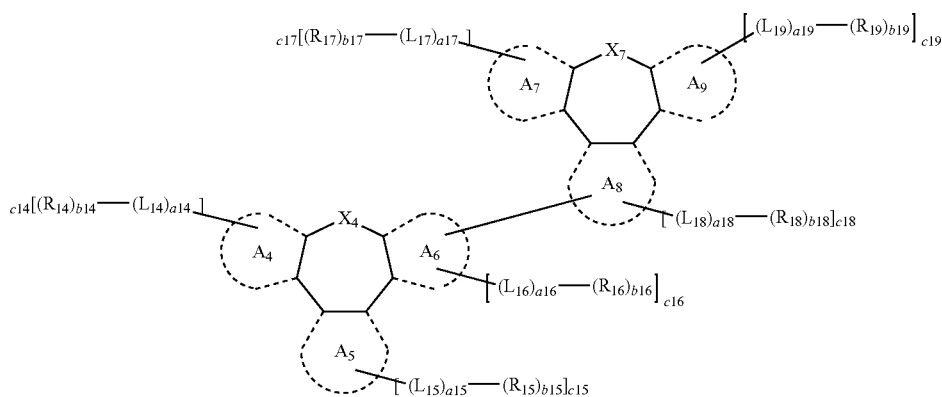

Formula 1C

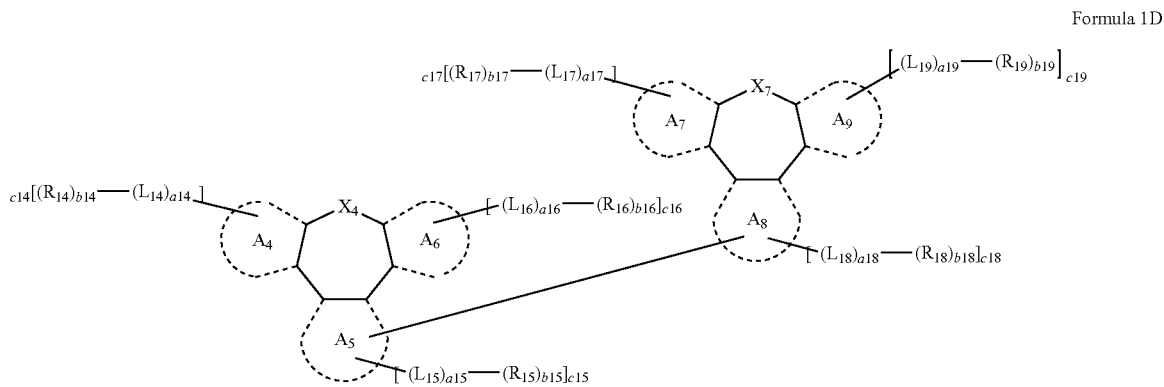

Formula 1D wherein in Formulae 1A to 1D, $A_1, A_2, A_4, A_6, A_7$ and $A_9$ are each independently a group derived from a benzene, a naphthalene, a pyrene, a fluorene, a pyridine, a pyrimidine, or a pyrazine, and $A_3$, $A_5$ and $A_8$ are a group derived from a benzene;

$X_1$ is N-[$(L_1)_{a1}$-$(R_1)_{b1}$], Si[$(L_2)_{a2}$-$(R_2)_{b2}$][$(L_3)_{a3}$-$(R_2)_{b3}$], S(=O), or S(=O)$_2$;

$X_4$ is N-[$(L_4)_{a4}$-$(R_4)_{b4}$], Si[$L_5)_{a5}$-$(R_5)_{b5}$][$(L_6)_{a6}$-$(R_6)_{b6}$], S(=O), or S(=O)$_2$, $X_7$ is N-[$(L_7)_{a7}$-$(R_7)_{b7}$], Si[$(L_8)_{a8}$-$(R_8)_{b8}$][$(L_9)_{a9}$-$(R_9)_{b9}$], S(=O), or S(=O)$_2$, $L_1$ to $L_9$, and $L_{11}$ to $L_{19}$ are each independently a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolyl group, a dibenzocarbazolyl group, an imidazopyrimidinylene group, or an imidazopyridinylene group; or a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolyl group, a dibenzocarbazolyl group, an imidazopyrimidinylene group, or an imidazopyridinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, an imidazopyridinyl group, and —Si($Q_{33}$)($Q_{34}$)($Q_{35}$), a1 to a9 and a11 to a19 are each independently an integer of 0 to 5;

provided that, when each of $A_1$ and $A_2$ in Formula 1A is a group derived from a benzene, $L_1$ is a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, or a hexacenylene group; or a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthrenylene group, a triphenylenylene group, a pyrenylene group, a chrysenylene group, a naphthacenylene group, a picenylene group, a perylenylene group, a pentaphenylene group, or a hexacenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, and —Si($Q_{33}$)($Q_{34}$)($Q_{35}$), and a1 is an integer of 1 to 5;

$R_1$, $R_4$, and $R_7$ are each independently a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a anthracenyl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

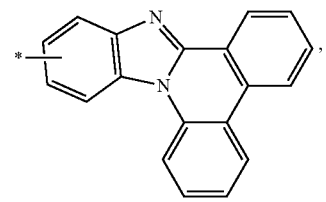

a group represented by

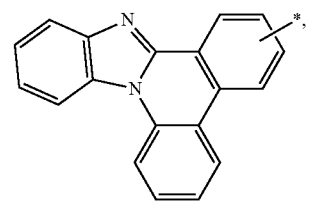

or a group represented by

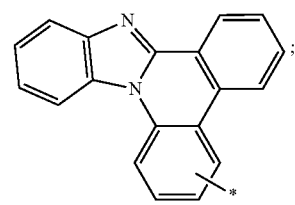

or
a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, an anthracenyl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by ,

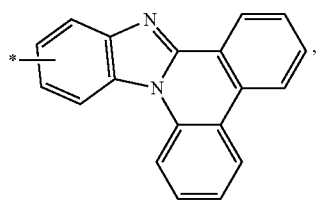

a group represented by

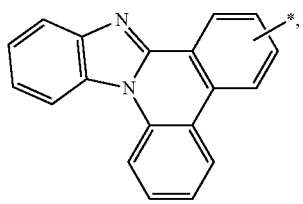

or a group represented by

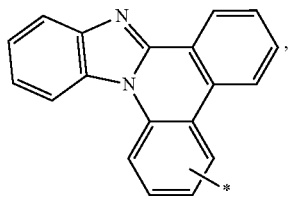

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

$R_2$, $R_5$, $R_6$, $R_8$, $R_9$, and $R_{11}$ to $R_{19}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthrenyl group, a triphenylenyl group, a pyrenyl group, a chrysenyl group, a naphthacenyl group, a picenyl group, a perilenyl group, a pentaphenyl group, a hexacenyl group, a pyrrolyl group, an imidazolyl group, pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthridinyl group, a quinoxalinyl group, a quinazolinyl group, a cynolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

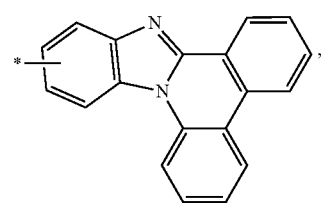

a group represented by

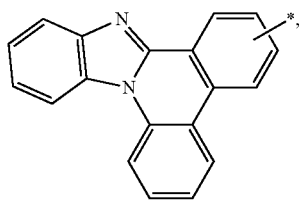

or a group represented by

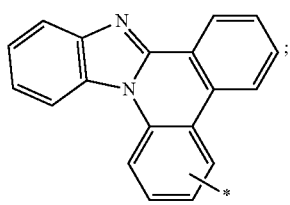

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a anthracenyl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

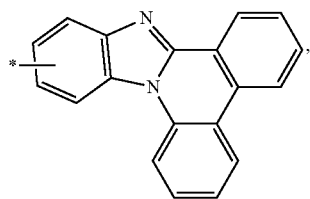

a group represented by

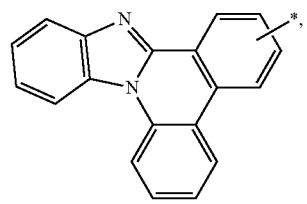

or a group represented by

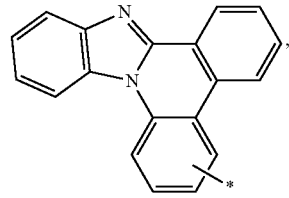

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group; or —N($Q_1$)($Q_2$), or —Si($Q_3$)($Q_4$)($Q_5$);

provided that i) at least one of $R_{11}$ to $R_{13}$ in Formula 1A is a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthridinyl group, a quinoxalinyl group, a quinazolinyl group, a cynolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrimidinyl group, an imidazopyridinyl group, a group represented by

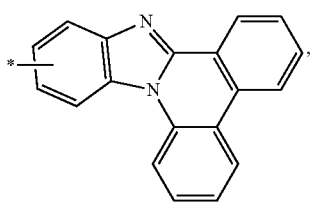

a group represented by

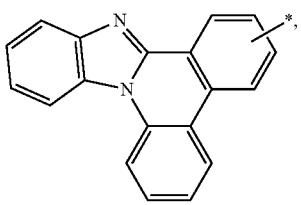

or a group represented by

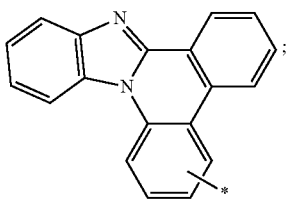

or
a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

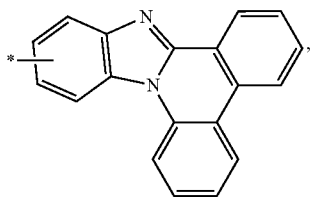

a group represented by

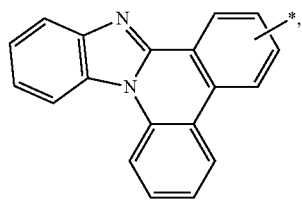

or a group represented by

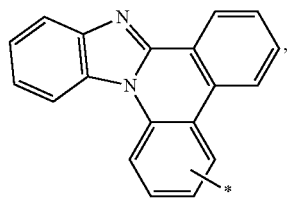

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_2$o alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group, ii) in Formulae 1B to 1D, a) at least one of $R_{14}$ to $R_{19}$ are each independently
a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthrenyl group, a triphenylenyl group, a pyrenyl group, a chrysenyl group, a naphthacenyl group, a picenyl group, a perilenyl group, a pentaphenyl group, or a hexacenyl group;
a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a anthracenyl group, a fluoranthrenyl group, a triphenylenyl group, a pyrenyl group, a chrysenyl group, a naphthacenyl group, a picenyl group, a perylenyl group, a pentaphenyl group, or a hexacenyl group, each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, and a chrysenyl group, or b) $X_4$ is N-[$(L_4)_{a4}$-$(R_4)_{b4}$], and at least one of $R_4$ and $R_{14}$ to $R_{19}$ are each independently a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

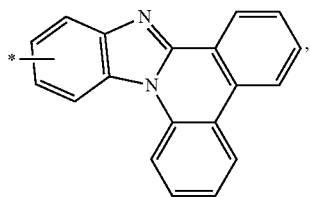

a group represented by

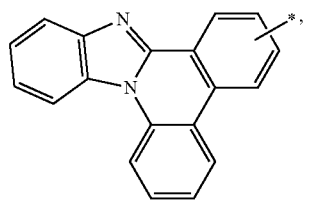

or a group represented by

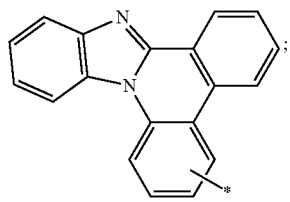

or a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinyl group, a dibenzofuranyl group, a dibenzothiophenyl group, a benzocarbazolyl group, a dibenzocarbazolyl group, an imidazopyridimidinyl group, an imidazopyridinyl group, a group represented by

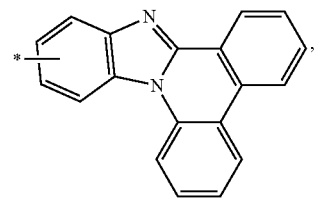

a group represented by

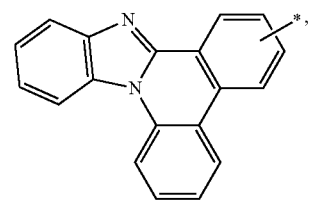

or a group represented by

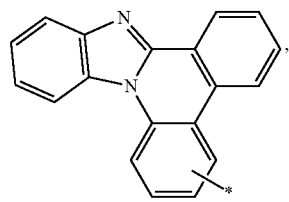

each substituted with at least one group selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, and an imidazopyridinyl group;

b1 to b9 and b11 to b19 are each independently an integer of 1 to 5;

c11 to c19 are each independently 1,2,3, or 4;

$Q_1$ to $Q_5$ and $Q_{33}$ to $Q_{35}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, or a monovalent non-aromatic hetero-condensed polycyclic group.

2. The condensed cyclic compound of claim 1, wherein $A_1, A_2, A_4, A_6, A_7$, and $A_9$ are each independently a group derived from a benzene, or a naphthalene.

3. The condensed cyclic compound of claim 1, wherein
$X_1$ is N-[$(L_1)_{a1}$-$(R_1)_{b1}$],
$X_4$ is N-[$(L_4)_{a4}$-$(R_4)_{b4}$], and
$X_7$ is N-[$(L_7)_{a7}$-$(R_7)_{b7}$].

4. The condensed cyclic compound of claim 1, wherein $L_1$ to $L_9$, and $L_{11}$ to $L_{19}$ are each independently represented by one of Formulae 2-1 to 2-34:

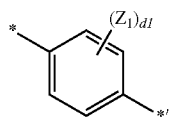

Formula 2-1

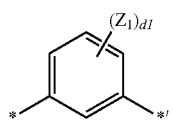

Formula 2-2

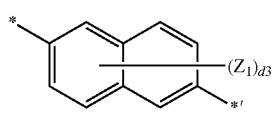

Formula 2-3

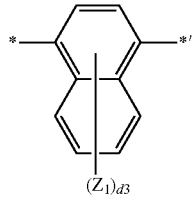

Formula 2-4

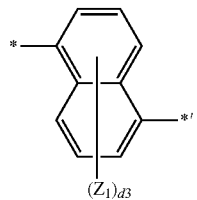

Formula 2-5

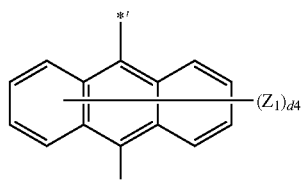

Formula 2-6

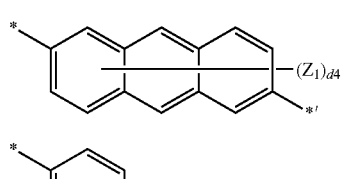

Formula 2-7

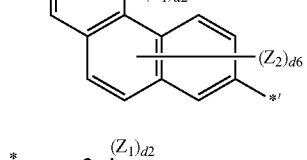

Formula 2-8

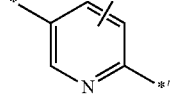

Formula 2-9

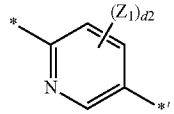

Formula 2-10

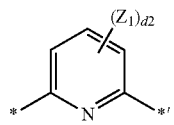

Formula 2-11

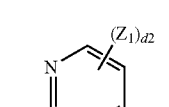

Formula 2-12

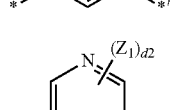

Formula 2-13

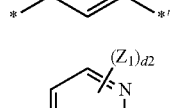

Formula 2-14

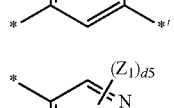

Formula 2-15

Formula 2-16
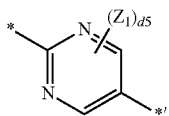
Formula 2-17
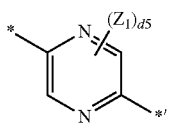
Formula 2-18
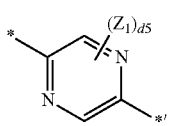
Formula 2-19
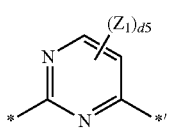
Formula 2-20
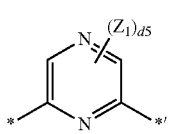
Formula 2-21
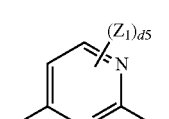
Formula 2-22
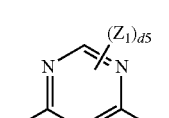
Formula 2-23
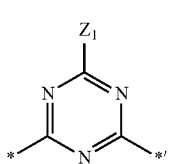
Formula 2-24
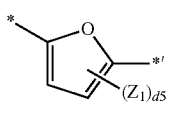
Formula 2-25
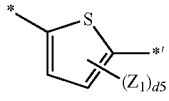
Formula 2-26
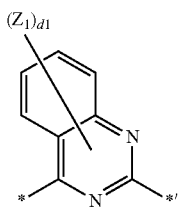
Formula 2-27
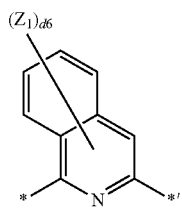
Formula 2-28
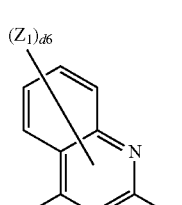
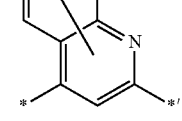
Formula 2-29
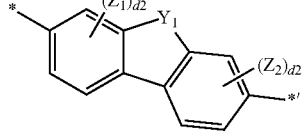
Formula 2-30
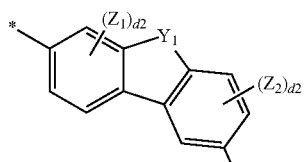
Formula 2-31
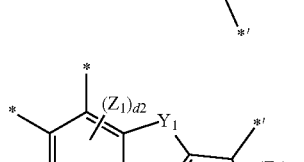
Formula 2-32
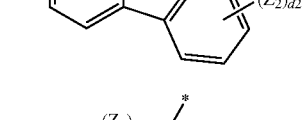
Formula 2-33
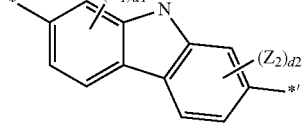
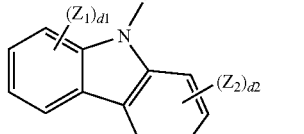
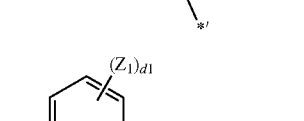
Formula 2-34
wherein in Formulae 2-1 to 2-34,
$Y_1$ is O, S, $C(Z_3)(Z_4)$, or $N(Z_5)$;
$Z_1$ to $Z_5$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, an imidazopyridinyl group, or $-Si(Q_{33})(Q_{34})(Q_{35})$;

wherein $Q_{33}$ to $Q_{35}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a pyrenyl group, a pyridinyl group, a pyrazinyl group, a pyrimidinyl group, a pyridazinyl group, a quinolinyl group, an isoquinolinyl group, a quinazolinyl group, a carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, an imidazopyrimidinyl group, or an imidazopyridinyl group; and d1 is an integer of 1 to 4;
d2 is an integer of 1 to 3;
d3 is an integer of 1 to 6;
d4 is an integer of 1 to 8;
d5 is an integer of 1 or 2;
d6 is an integer of 1 to 5; and
* and *' each indicates a binding site to a neighboring atom.

5. The condensed cyclic compound of claim 1, wherein $L_1$ to $L_9$, and $L_{11}$ to $L_{19}$ are each independently represented by one of Formulae 3-1 to 3-39:

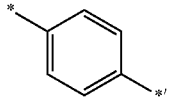

Formula 3-1

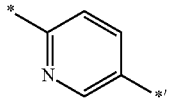

Formula 3-2

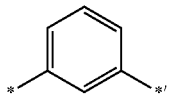

Formula 3-3

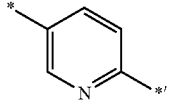

Formula 3-4

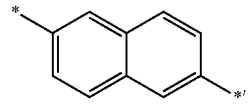

Formula 3-5

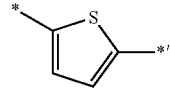

Formula 3-6

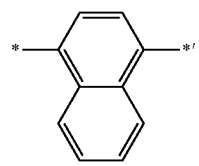

Formula 3-7

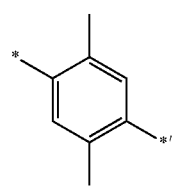

Formula 3-8

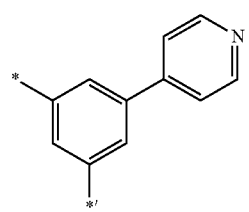

Formula 3-9

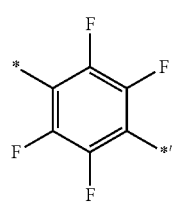

Formula 3-10

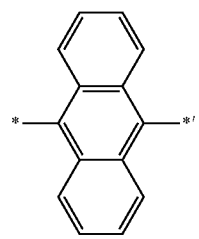

Formula 3-11

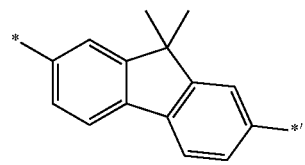

Formula 3-12

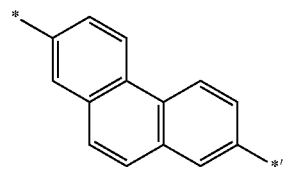

Formula 3-13

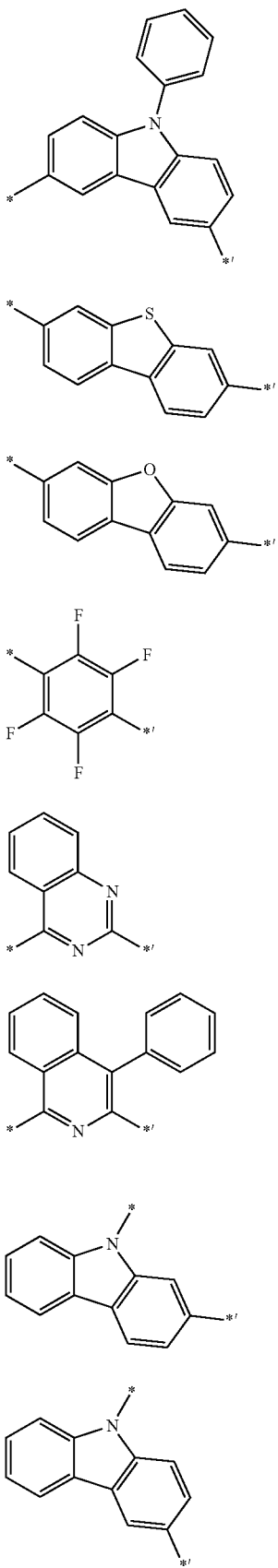

169
-continued

Formula 3-28
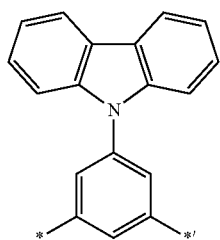

Formula 3-29
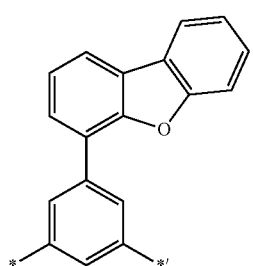

Formula 3-30
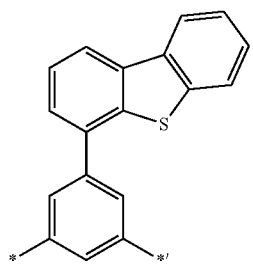

Formula 3-31
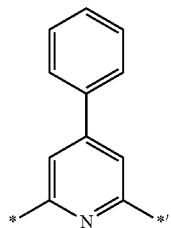

Formula 3-32
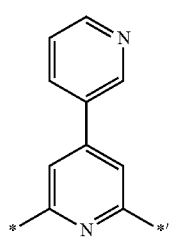

Formula 3-33
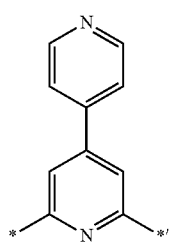

170
-continued

Formula 3-34
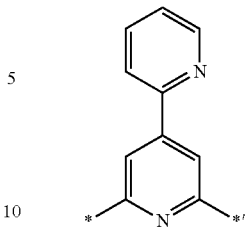

Formula 3-35
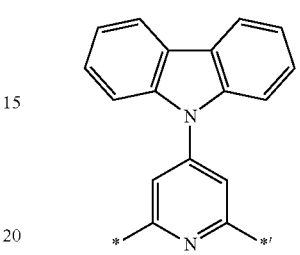

Formula 3-36
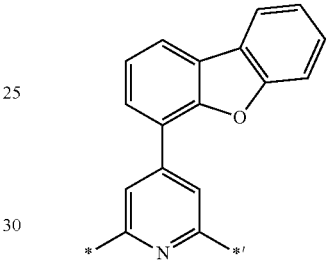

Formula 3-37
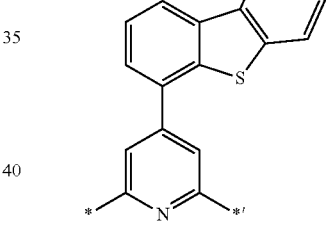

Formula 3-38
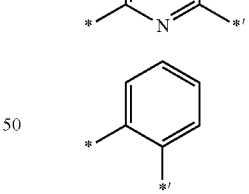

Formula 3-39 wherein * and *' in Formulae 3-1 to 3-39 each indicates a binding site to a neighboring atom.

6. The condensed cyclic compound of claim 1, wherein $L_1$ to $L_9$ and $L_{11}$ to $L_{19}$ in Formulae 1A to 1D are each independently a phenylene group or a phenyl group-substituted phenylene group, and a1 to a9 and a11 to a19 are each independently 0,1, or 2.

7. The condensed cyclic compound of claim 1, wherein $R_1$ $R_4$, and $R_7$ are each independently represented by one of Formulae 4-1 to 4-32;

$R_2$, $R_5$, $R_6$, $R_8$, $R_9$, and $R_{11}$ to $R_{19}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

one of Formulae 4-1 to 4-32; or

—Si($Q_3$)($Q_4$)($Q_5$), wherein, $Q_3$ to $Q_5$ are each independently a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group a phthalazinyl group, a quinoxalinyl group, a cynolinyl group, or a quinazolinyl group; and provided that at least one of $R_{11}$ to $R_{13}$ in Formula 1A is represented by one of Formulae 4-5 to 4-25 and 4-27 to 4-32, and provided that when one of $R_{11}$ to $R_{13}$ is represented by one of Formula 4-5 to 4-8, $Y_{31}$ in the Formulae 4-5 to 4-8 is O or S, wherein selections of $R_1$ to $R_9$, and $R_{14}$ to $R_{19}$ are subject to limitations of claim 1:

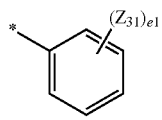

Formula 4-1

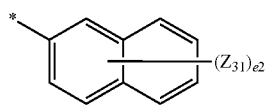

Formula 4-2

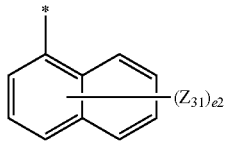

Formula 4-3

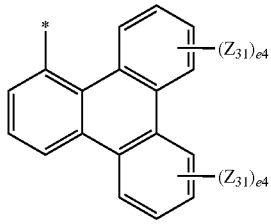

Formula 4-4

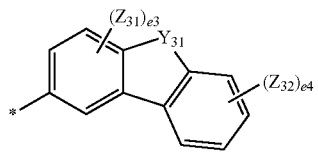

Formula 4-5

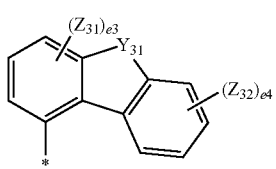

Formula 4-6

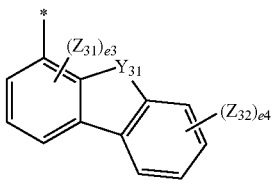

Formula 4-7

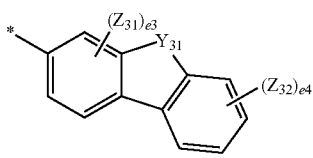

Formula 4-8

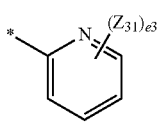

Formula 4-9

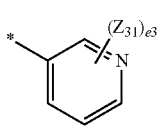

Formula 4-10

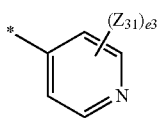

Formula 4-11

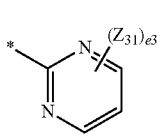

Formula 4-12

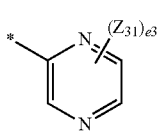

Formula 4-13

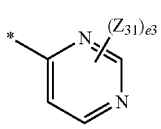

Formula 4-14

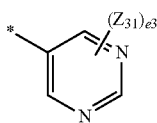

Formula 4-15

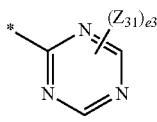

Formula 4-16

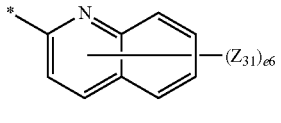

Formula 4-17

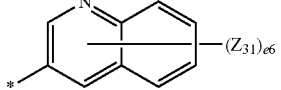

Formula 4-18

-continued

Formula 4-19
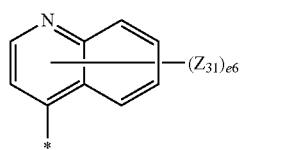

Formula 4-20
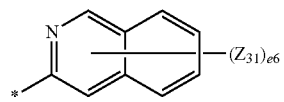

Formula 4-21
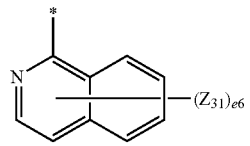

Formula 4-22
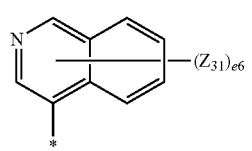

Formula 4-23
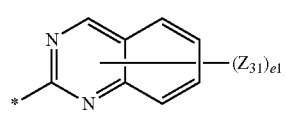

Formula 4-24
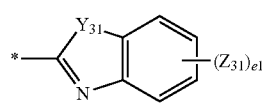

Formula 4-25
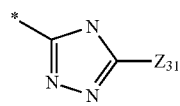

Formula 4-26
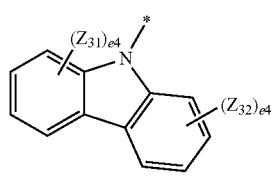

Formula 4-27
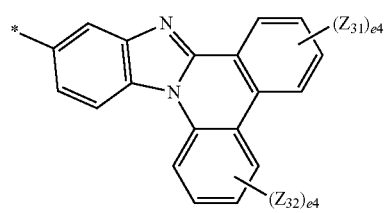

Formula 4-28
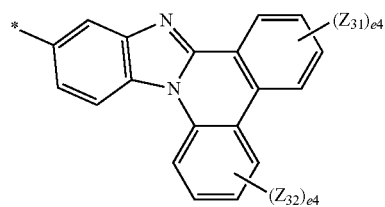

-continued

Formula 4-29
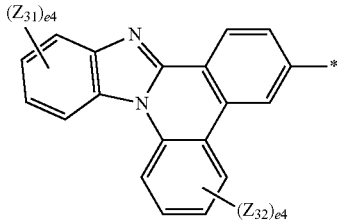

Formula 4-30
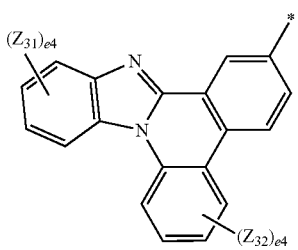

Formula 4-31
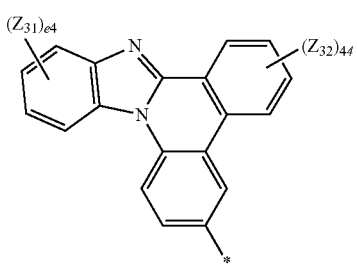

Formula 4-32
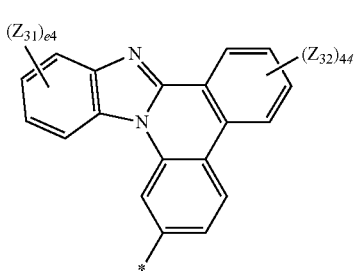

wherein in Formulae 4-1 to 4-32, $Y_{31}$ is O, S, C($Z_{33}$)($Z_{34}$), N($Z_{35}$), or Si($Z_{36}$)($Z_{37}$); wherein $Z_{31}$ to $Z_{37}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a phenyl group-substituted phenyl group, a naphthyl group, an anthracenyl group, a pyrenyl group, a phenanthrenyl group, a triphenylenyl group, a pyrenyl group, a chrysenyl group, a pyridinyl group, a pyrazinyl group, a pyrimidinyl group, a pyridazinyl group, a quinolinyl group, an isoquinolinyl group, a quinazolinyl group, a quinoxalinyl group, a carbazolyl group, a phenyl group-substituted carbazolyl group, a phenanthrolinyl group, a benzoimidazolyl group, a triazinyl group, a dibenzofuranyl group, a dibenzothiophenyl group, a benzocarbazolyl group, a dibenzocarbazolyl group, a phenyl group-substituted benzocarbazolyl group, a phenyl group-substituted dibenzocarbazolyl group, an imidazopyrimidinyl group, or an imidazopyridinyl group;

e1 is an integer of 1 to 5;
e2 is an integer of 1 to 7;
e3 is an integer of 1 to 3;
e4 is an integer of 1 to 4;
e5 is an integer of 1 or 2;
e6 is an integer of 1 to 6; and
* indicates a binding site to a neighboring atom.

8. The condensed cyclic compound of claim 1, wherein
$R_1$, $R_4$, and $R_7$ are each independently represented by one of Formulae 5-1 to 5-60;
$R_2$, $R_5$, $R_6$, $R_8$, $R_9$, and $R_{11}$ to $R_{19}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;
one of Formulae 5-1 to 5-60; or
—Si($Q_3$)($Q_4$)($Q_5$), wherein, $Q_3$ to $Q_5$ are each independently a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group a phthalazinyl group, a quinoxalinyl group, a cynolinyl group, or a quinazolinyl group;
at least one of $R_{11}$ to $R_{13}$ in Formula 1A is represented by one of Formulae 5-10 to 5-17 and 5-27 to 5-60,
wherein selections of $R_1$ to $R_9$, and $R_{14}$ to $R_{19}$ are subject to limitations of claim 1

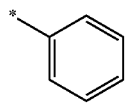

Formula 5-1

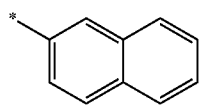

Formula 5-2

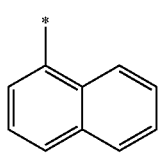

Formula 5-3

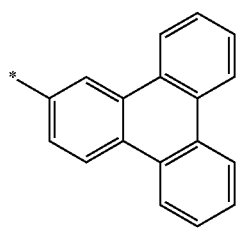

Formula 5-4

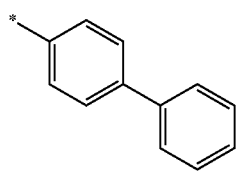

Formula 5-5

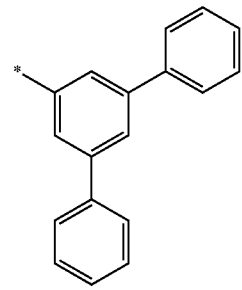

Formula 5-6

Formula 5-7

Formula 5-8

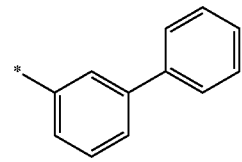

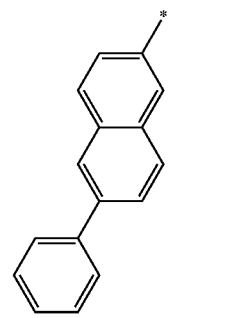

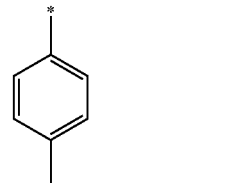

Formula 5-9

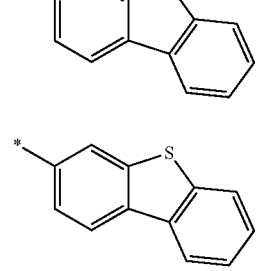

Formula 5-10

Formula 5-11

Formula 5-12

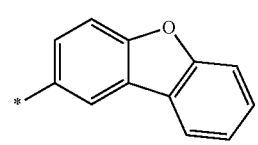

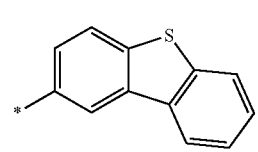

Formula 5-13

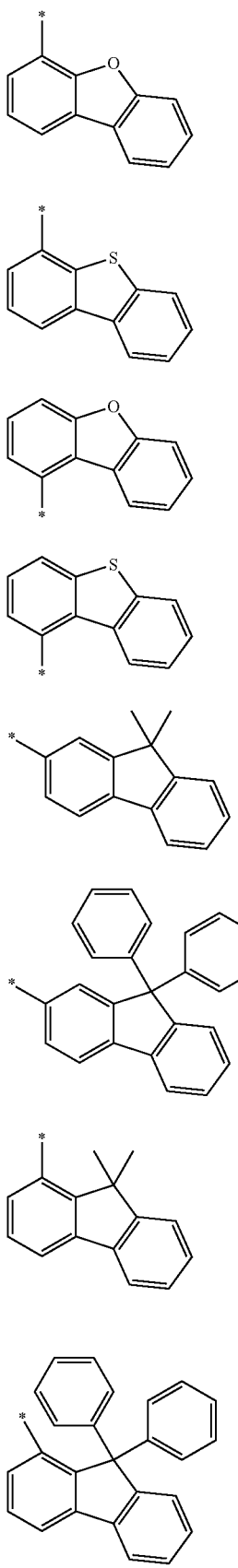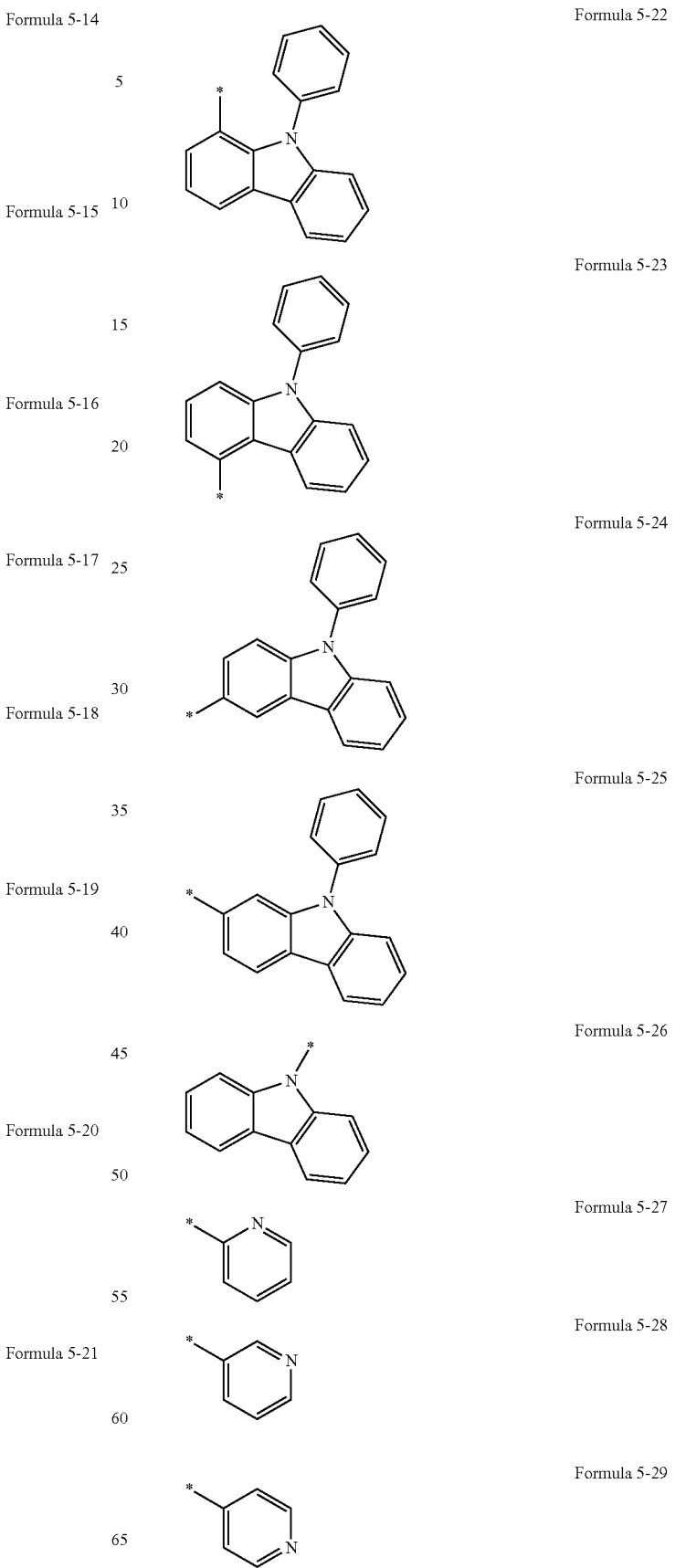

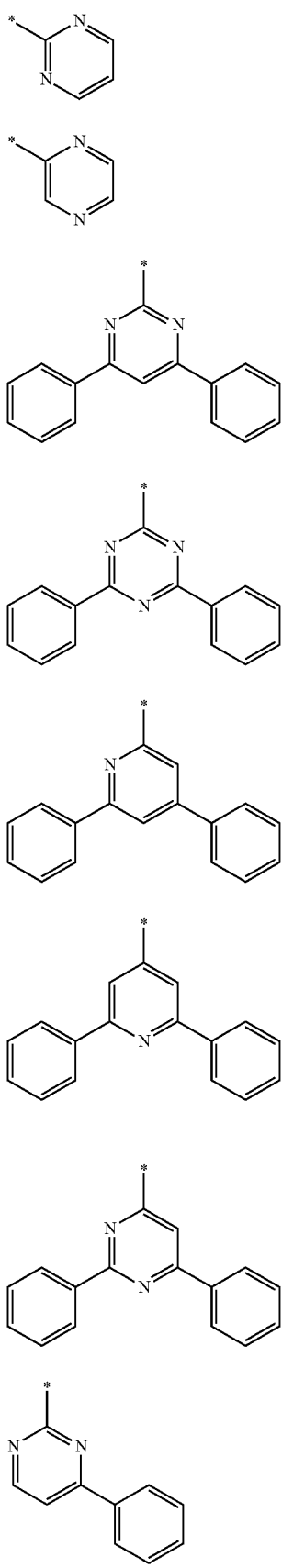
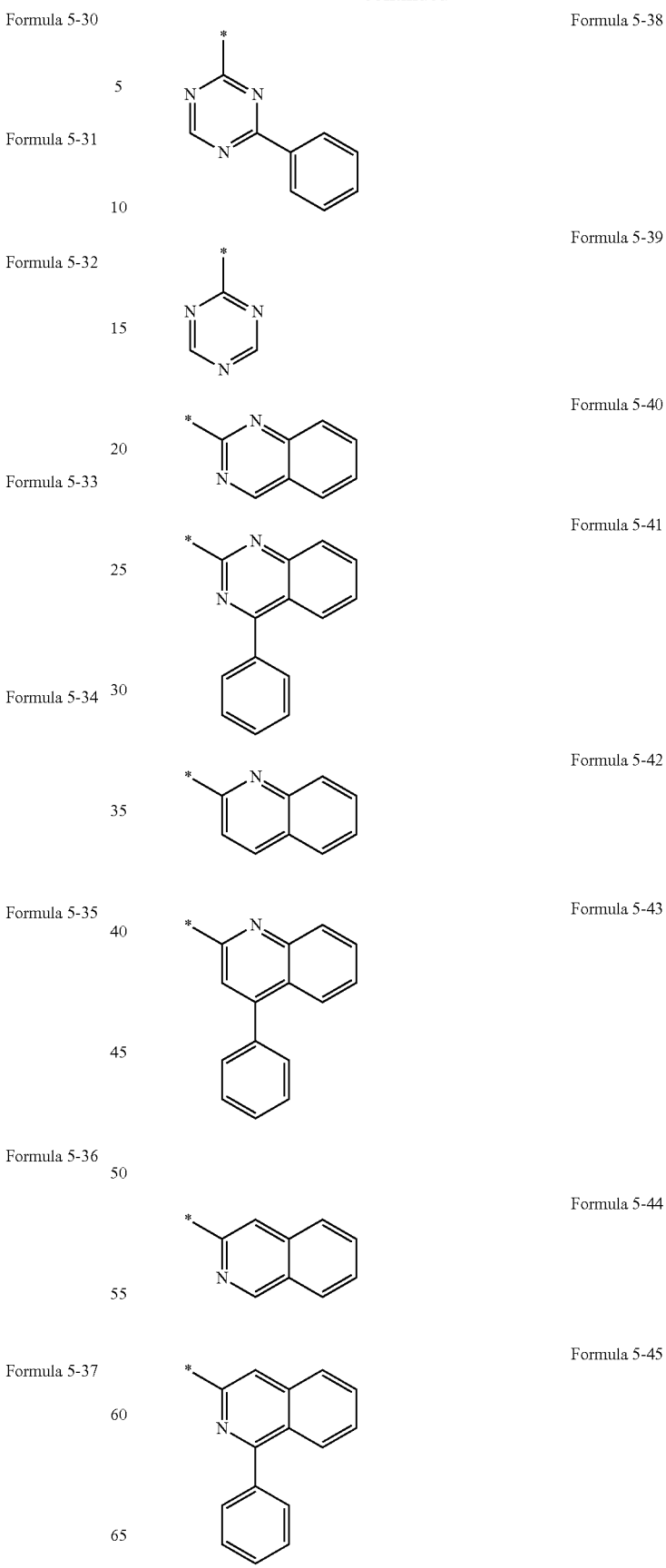

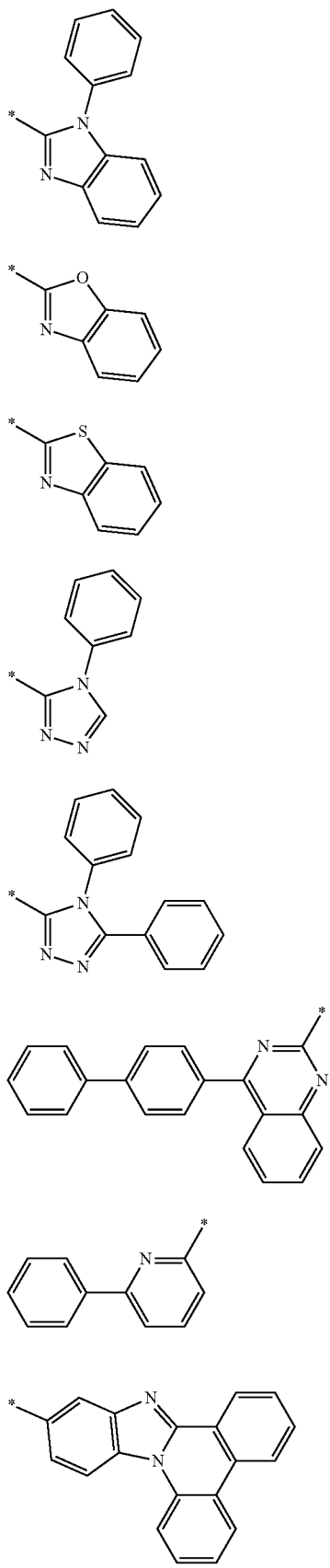
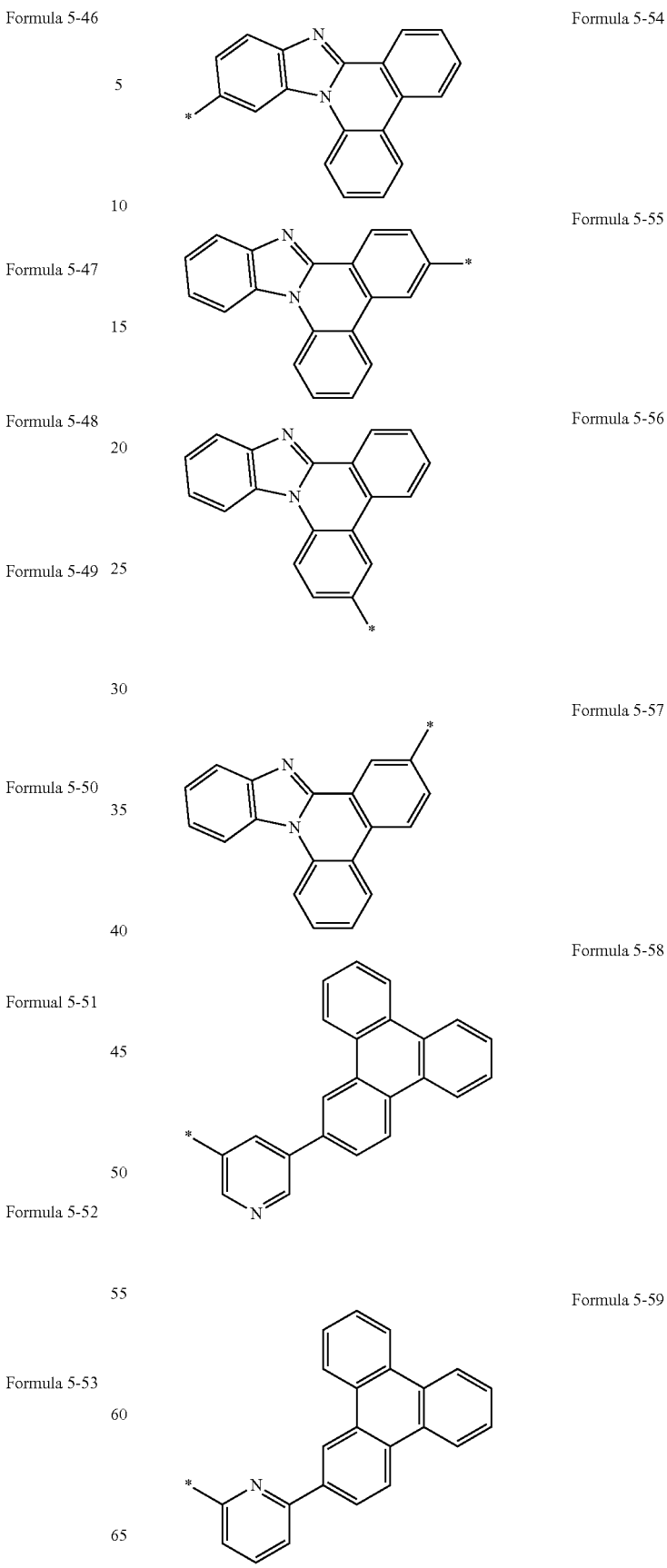

Formula 5-60
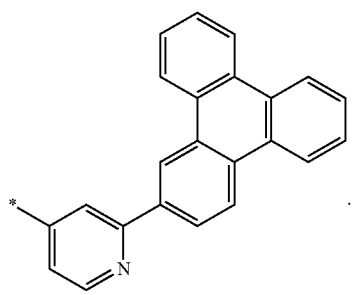
9. The condensed cyclic compound of claim 1, wherein the condensed cyclic compound is represented by one of Formula 1 B to 1 D,
wherein in Formulae 1 B to 1 D,
$X_4$ IS N-$[(L_4)_{a4}$-$(R_4)_{b4}]$ and
$X_7$ is N-$[(L_7)_{a7}$-$(R_7)_{b7}]$.
10. A condensed cyclic compound being one of Compounds 1 to 81, 84 to 85, and 89 to 121:
1
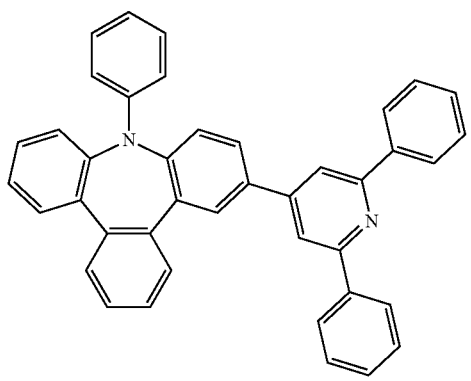
2
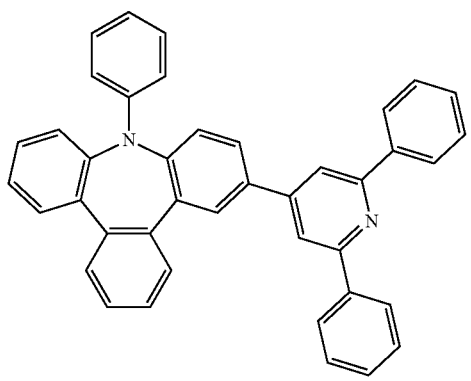
3
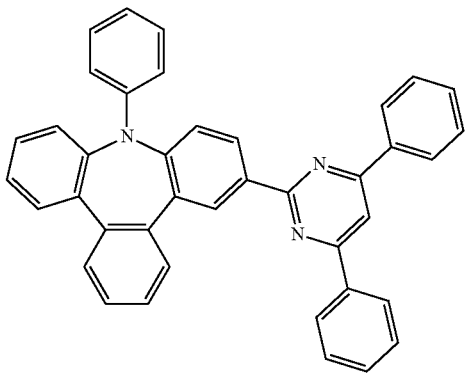
4
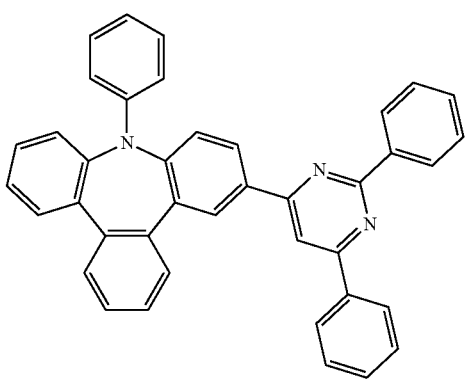
5
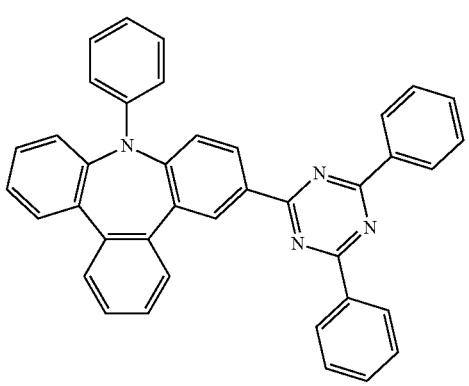
6
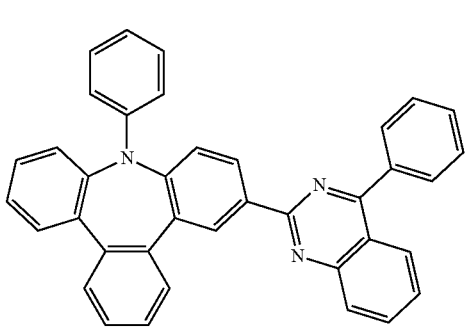

185
-continued
7
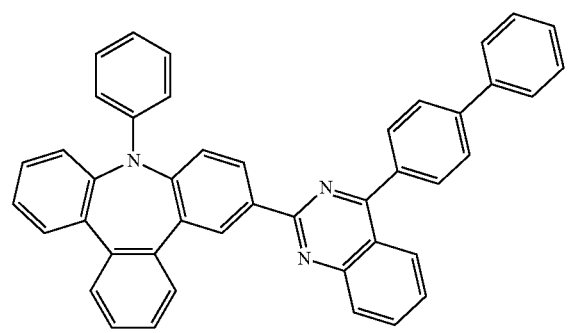
8
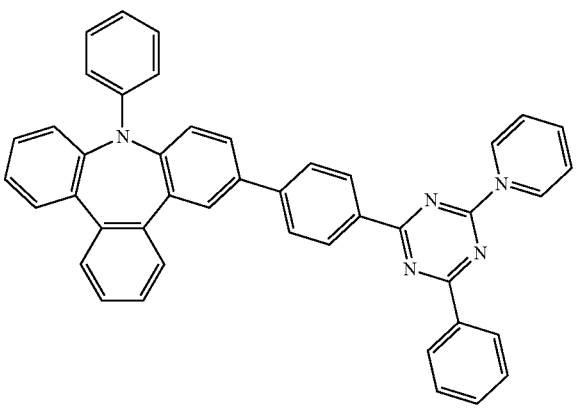
9
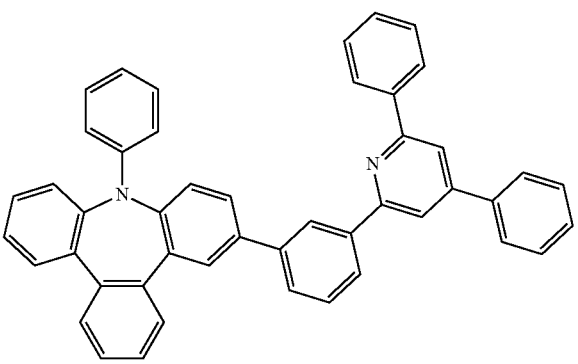
10
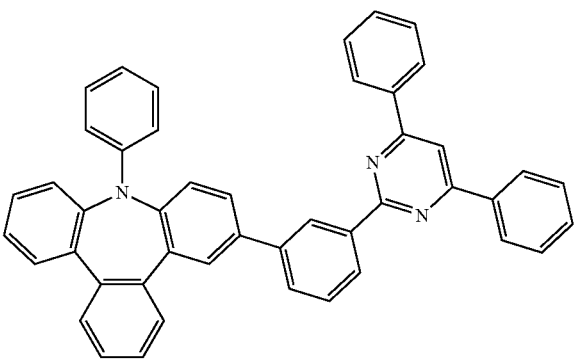
186
-continued
11
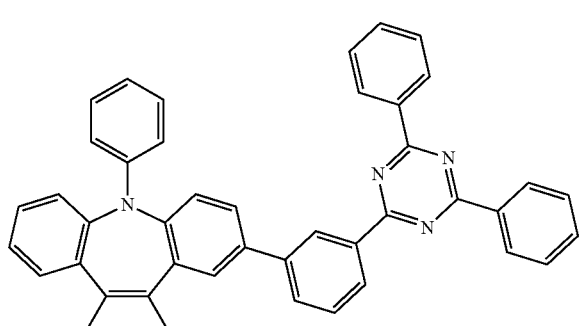
12
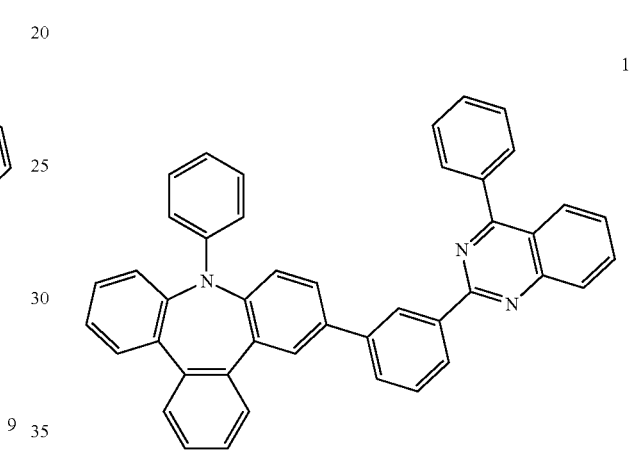
13
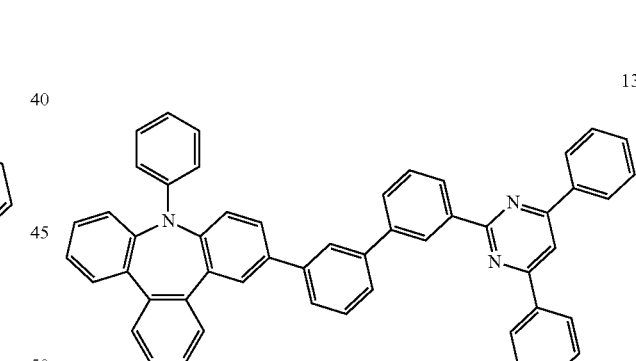
14
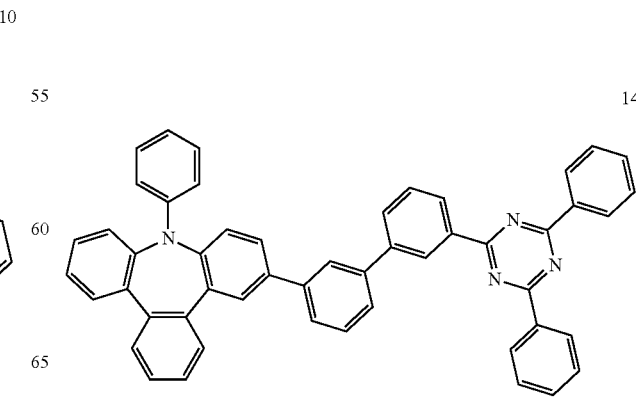

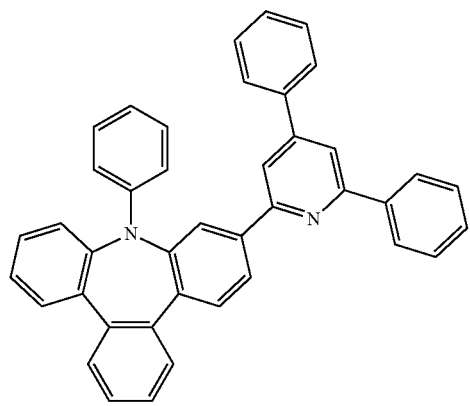
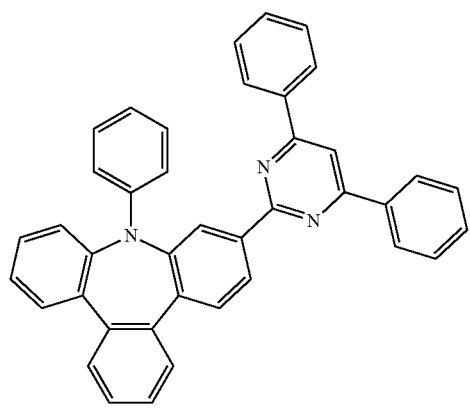
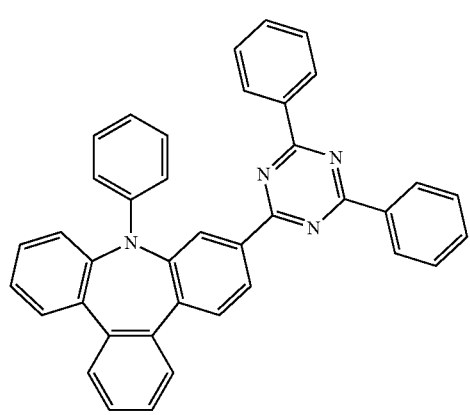
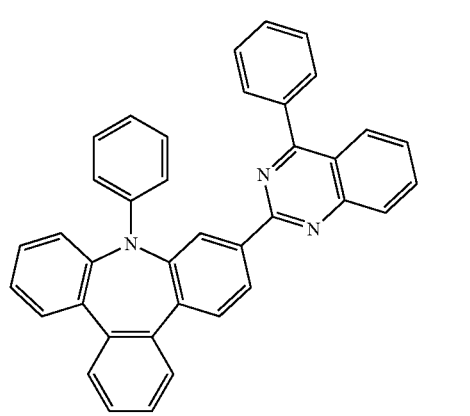
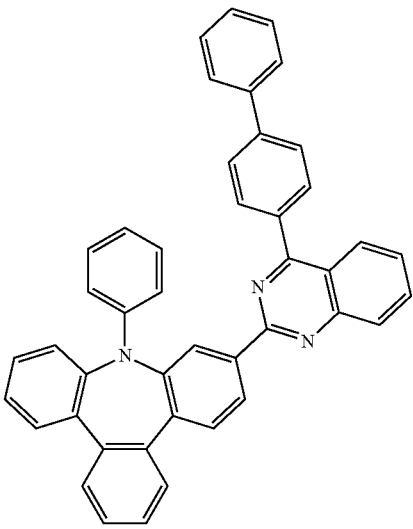
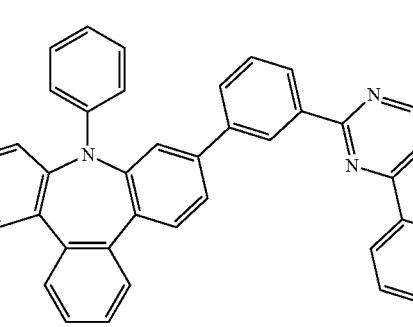
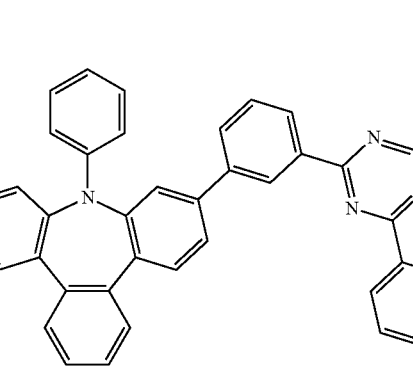
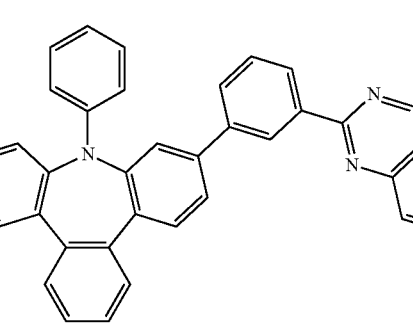

23
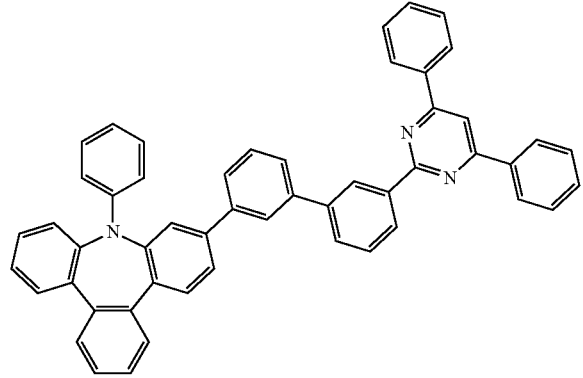
24
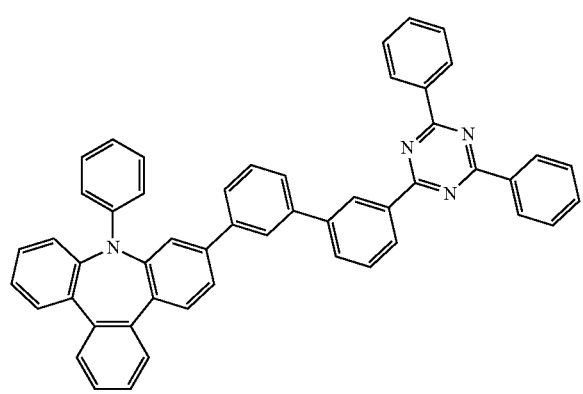
25
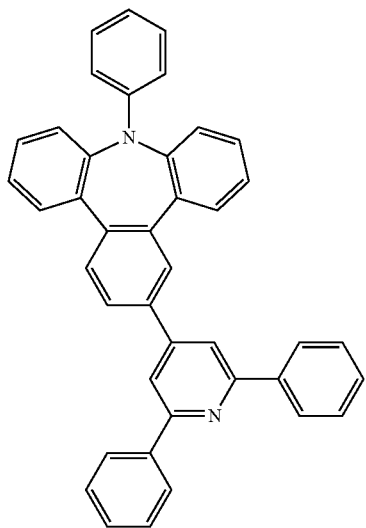
26
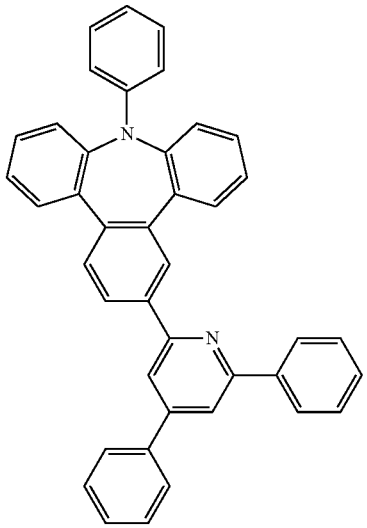
27
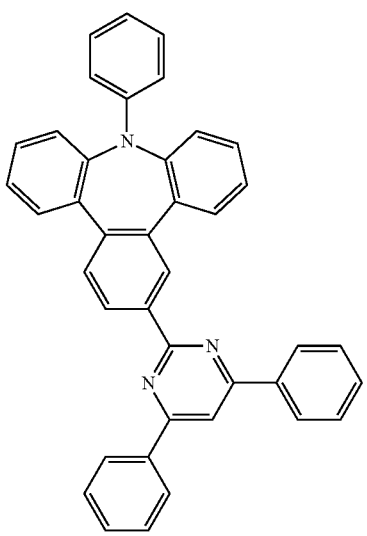
28
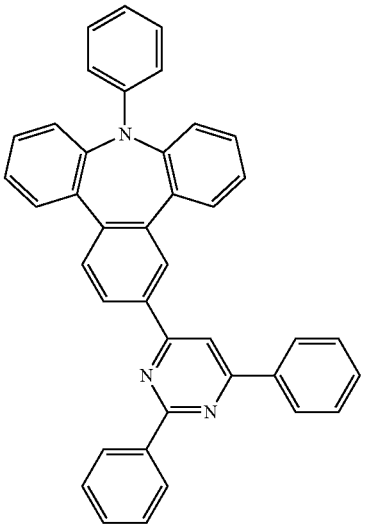

29
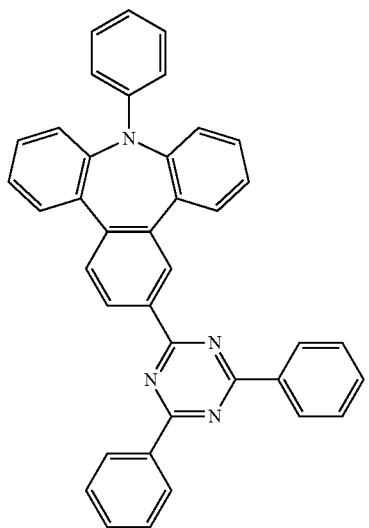
30
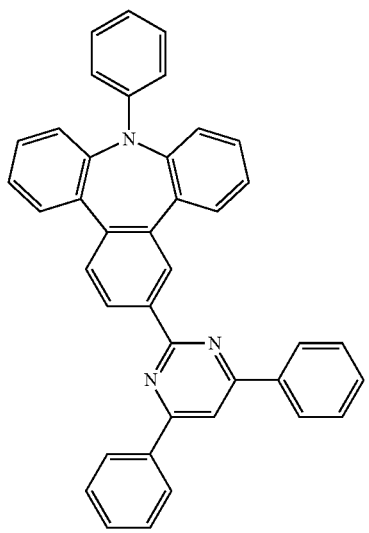
31
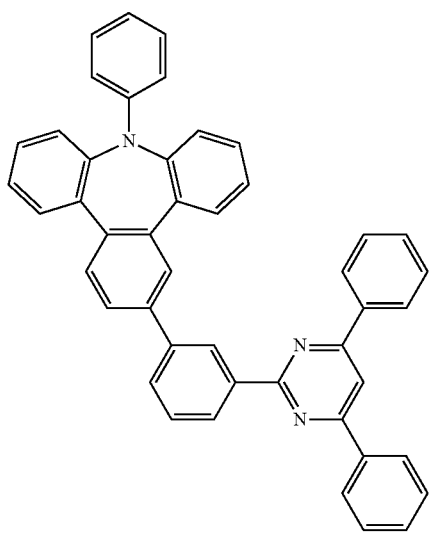
32
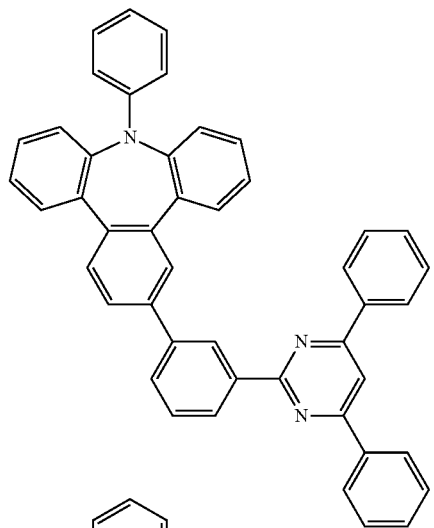
33
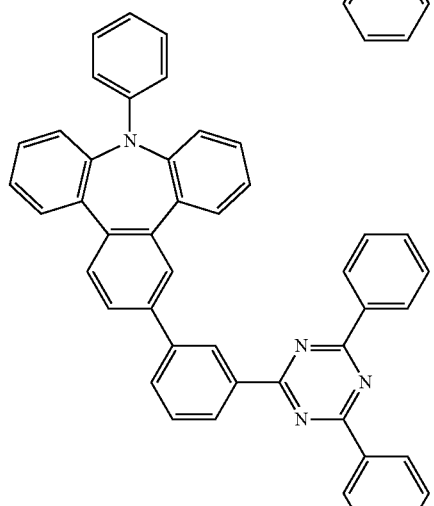
34

193
-continued
35
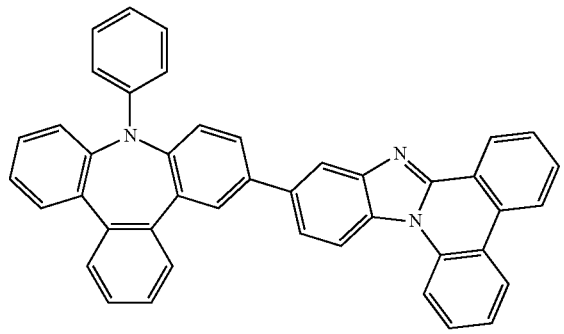
36
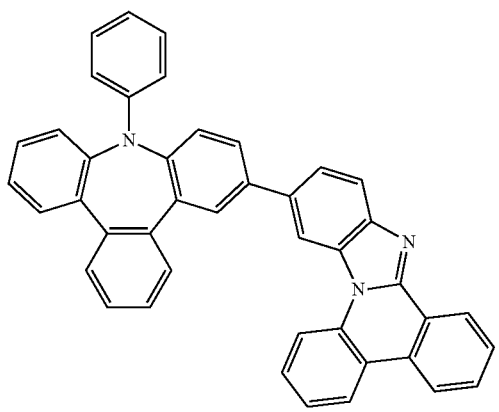
37
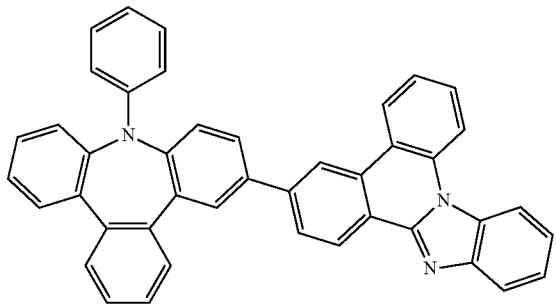
38
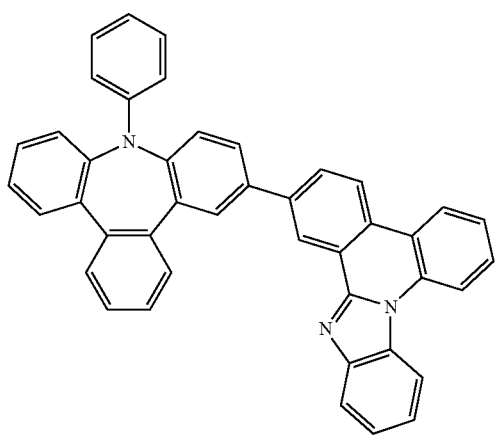
194
-continued
39
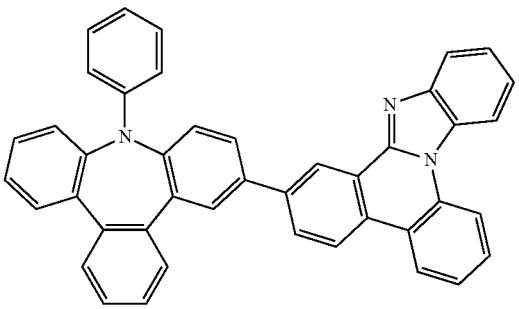
40
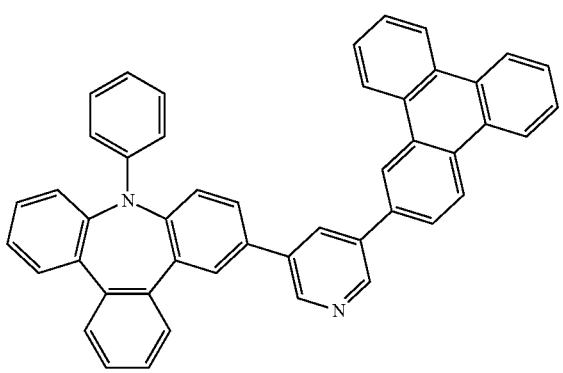
41
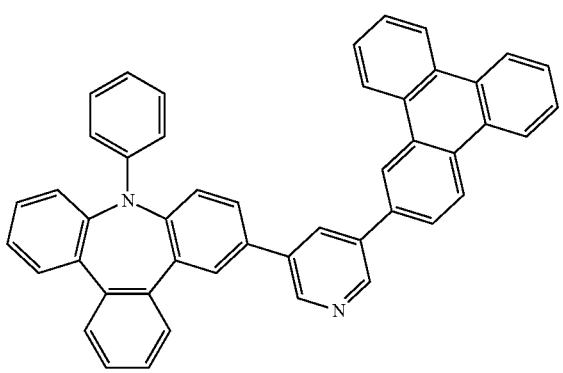
42

43
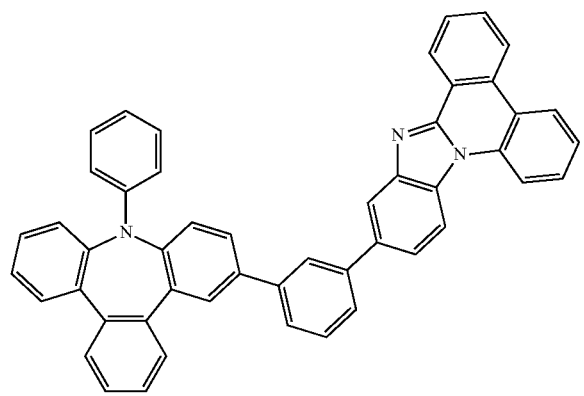
44
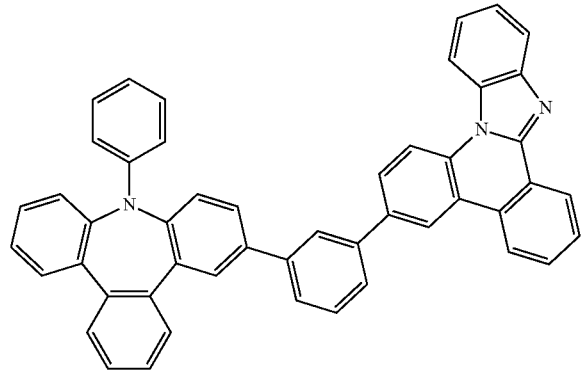
45
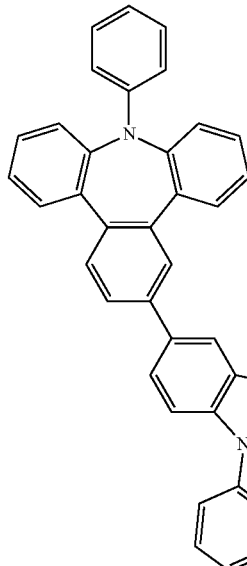
46
47
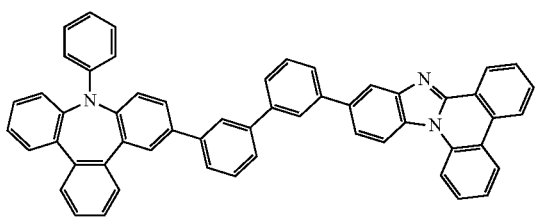
48
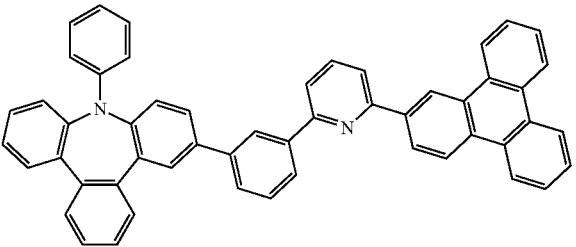
49
50
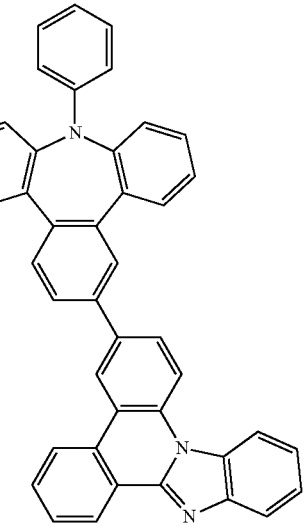

197
-continued
51
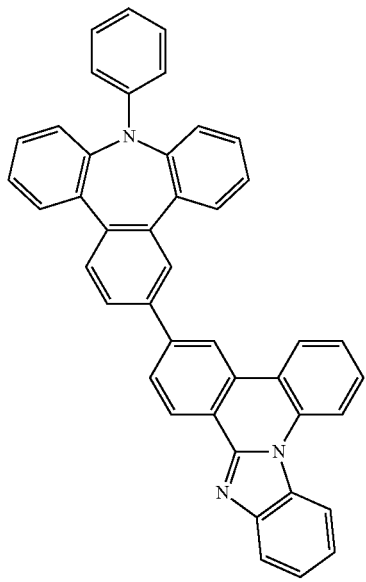
52
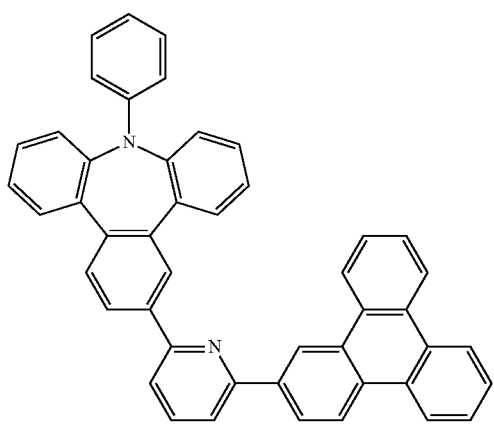
53
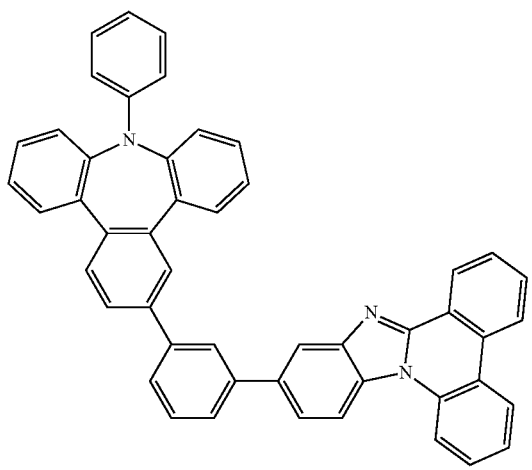
198
-continued
54
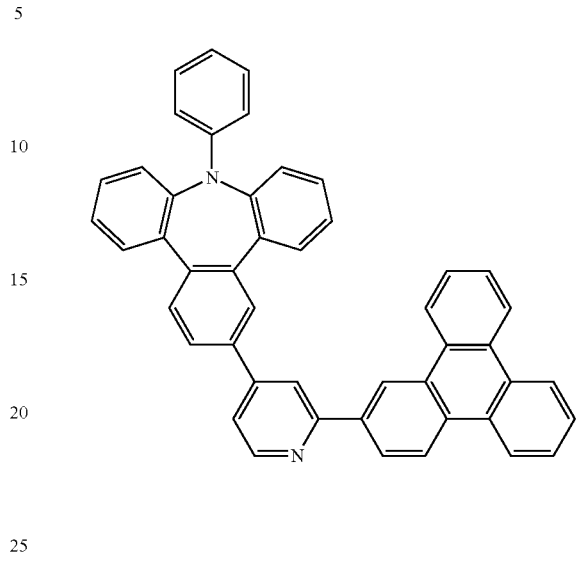
55
56
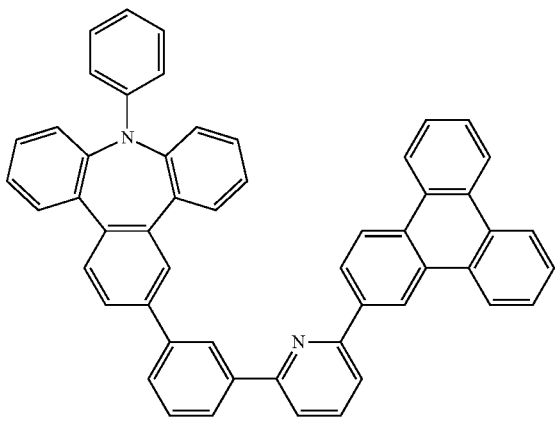

57
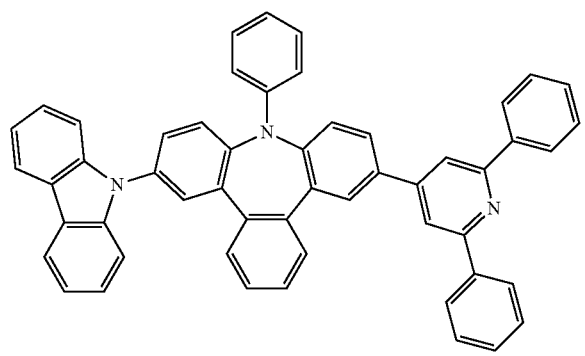
58
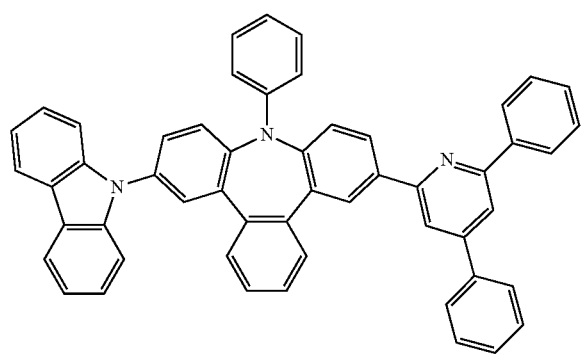
59
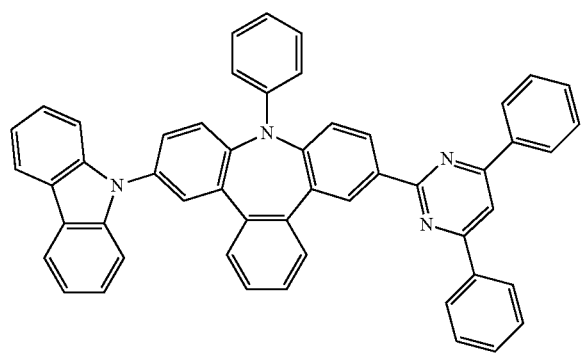
60
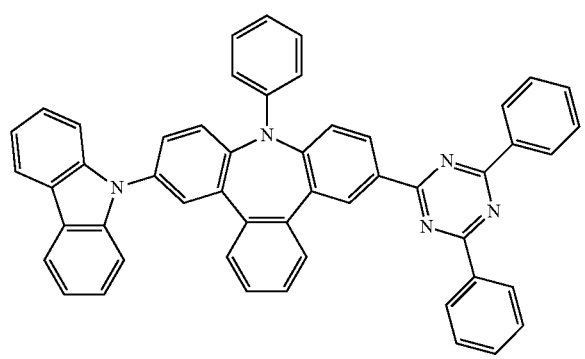
61
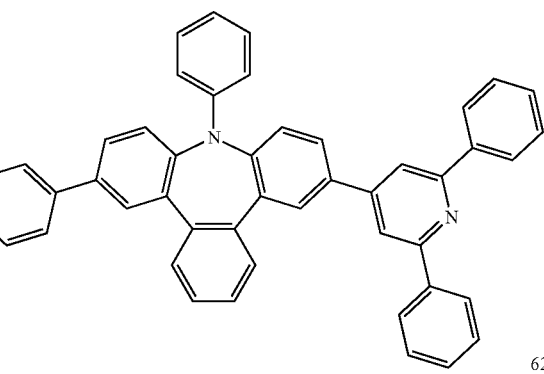
62
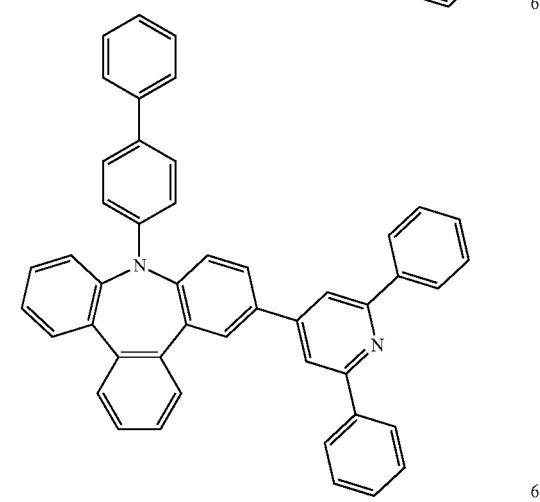
63
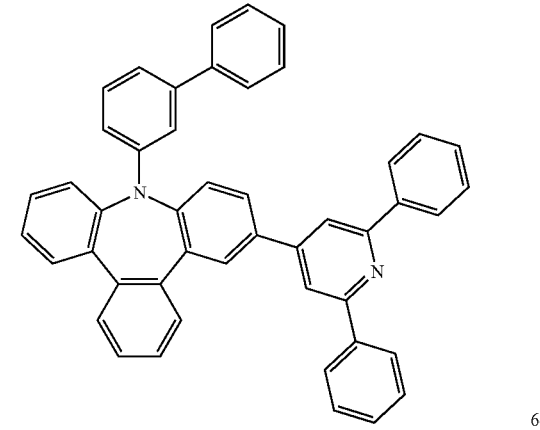
64
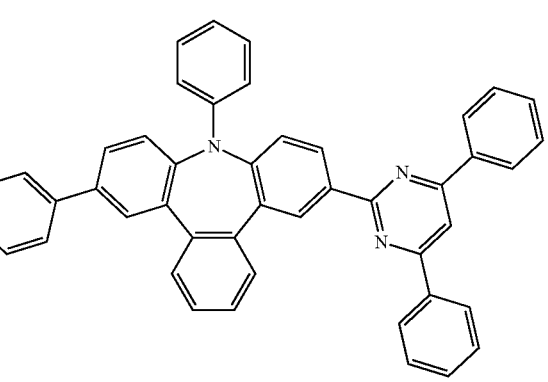

201
-continued
65
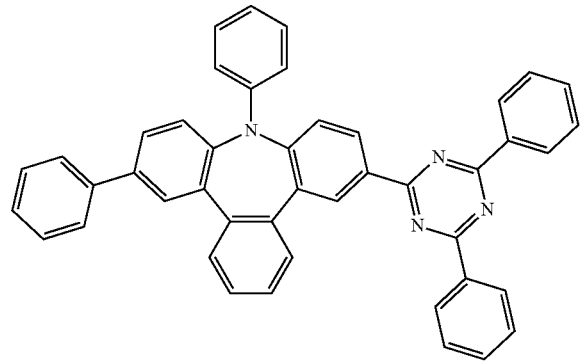
66
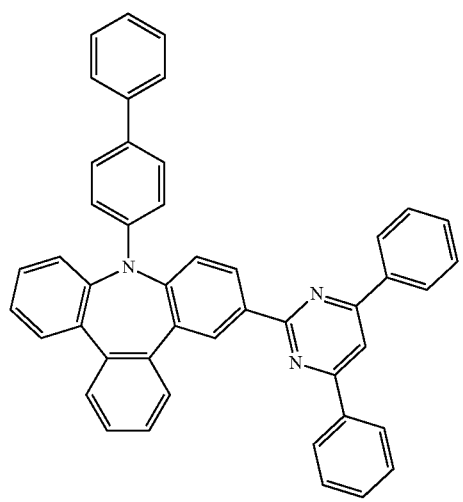
67
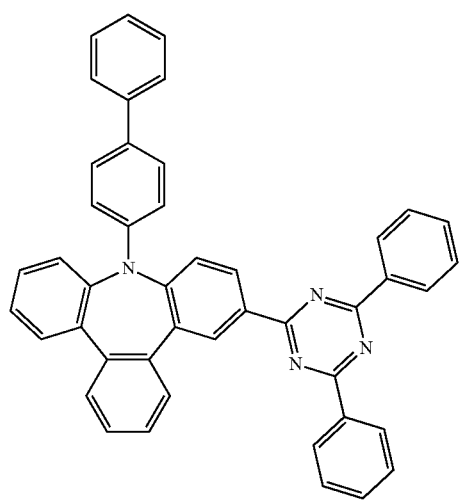
202
-continued
68
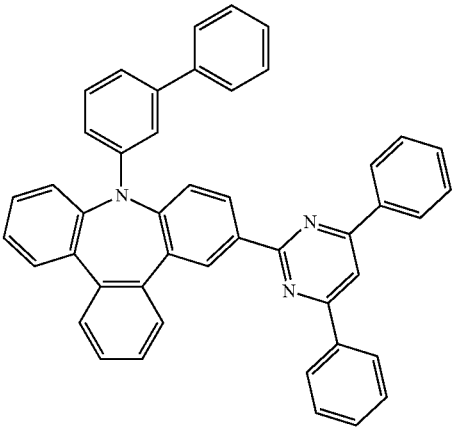
69
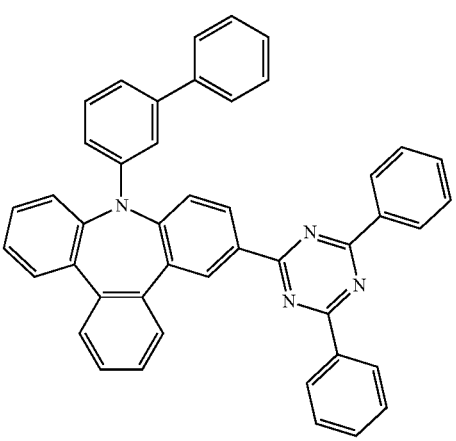
70
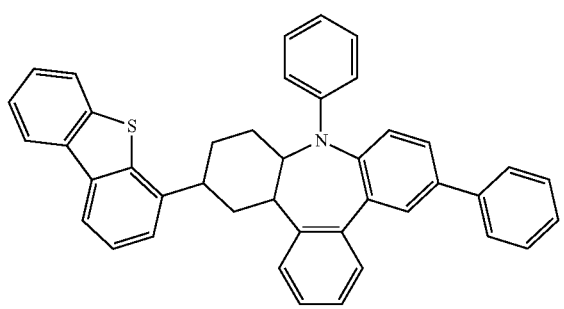
71
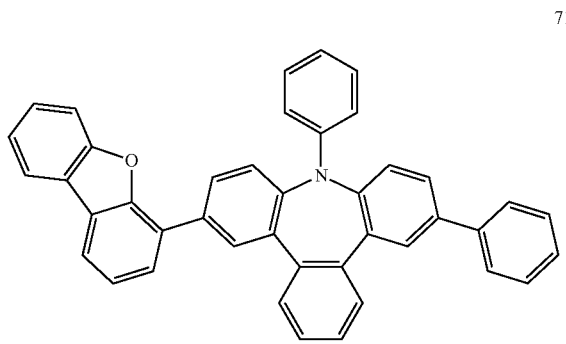

72
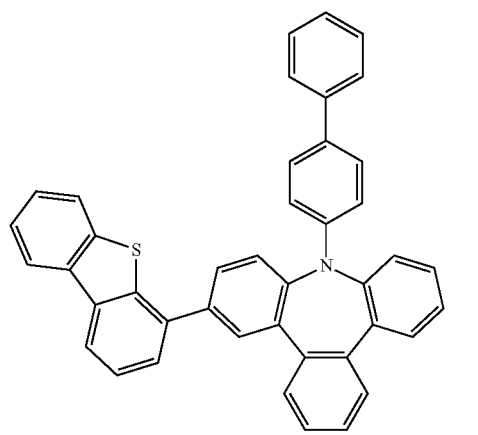
73
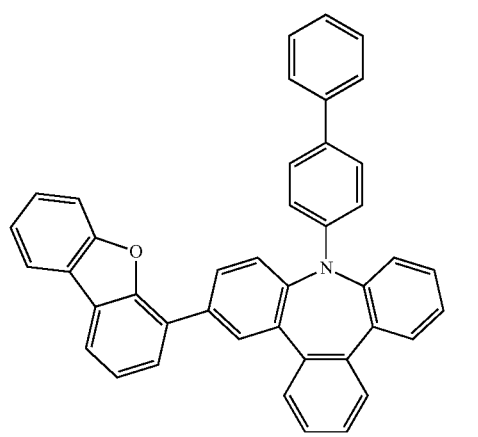
74
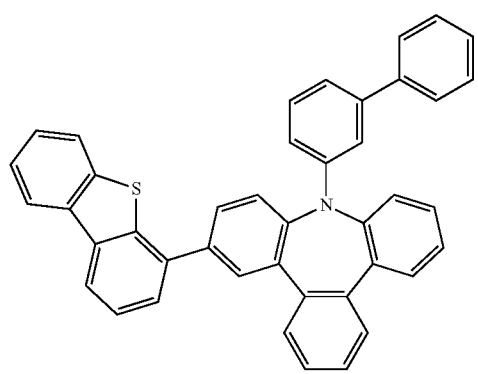
75
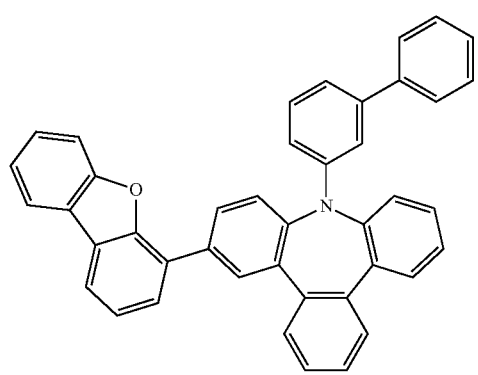
76
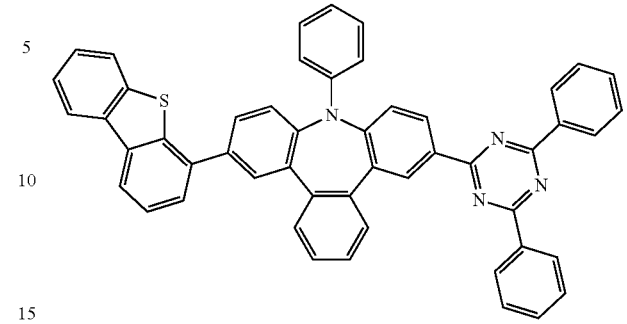
77
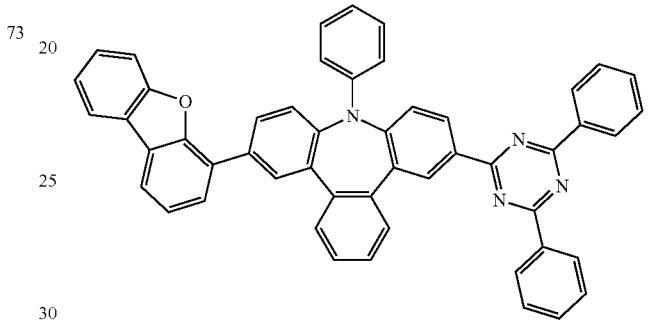
78
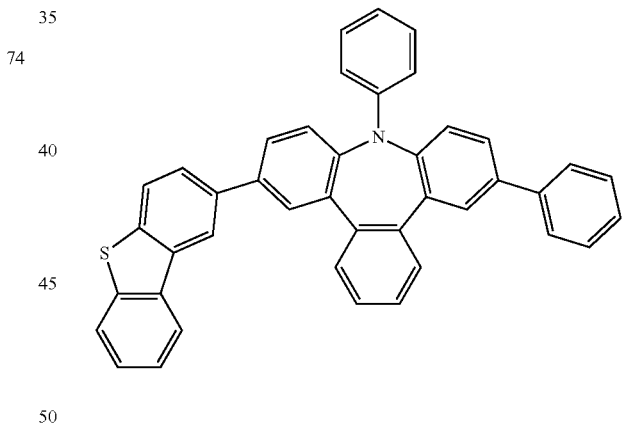
79
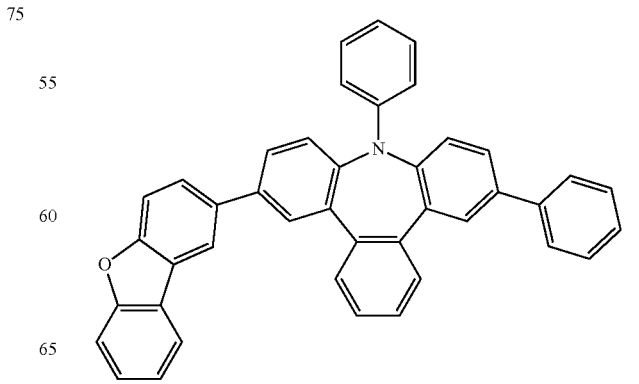

80
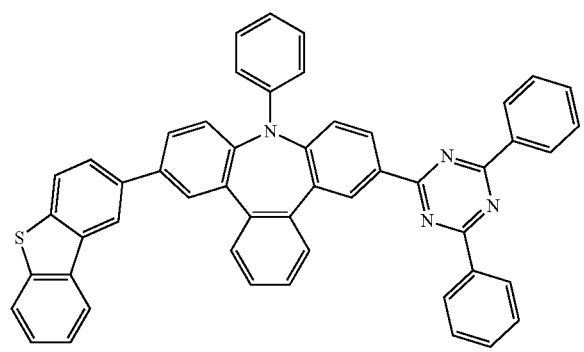
81
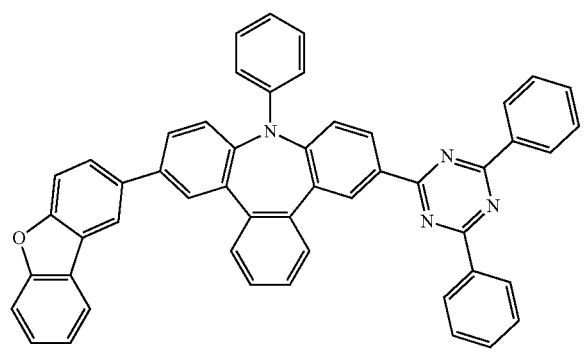
84
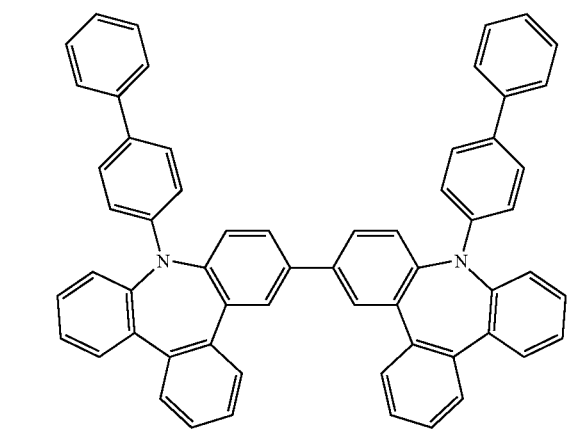
85
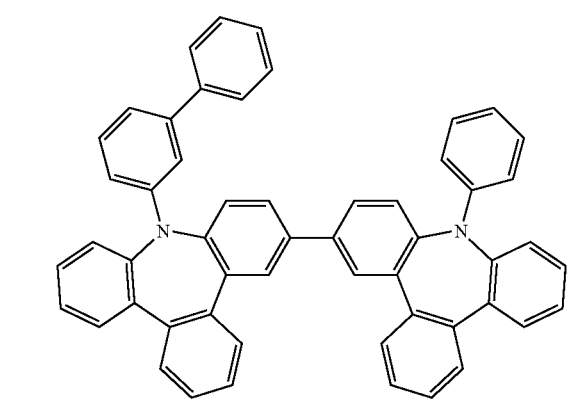
90
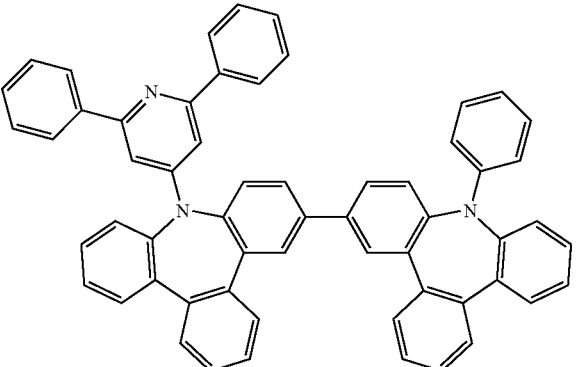
91
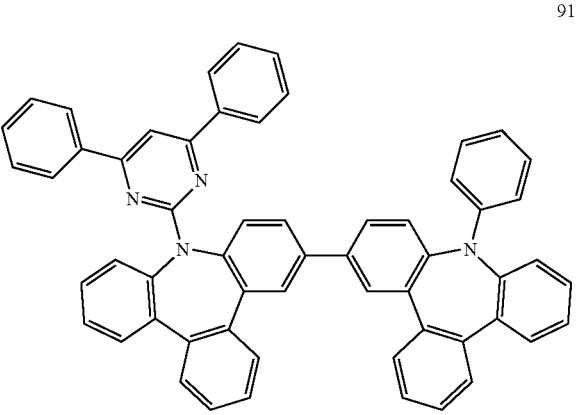 [SMILES: c1ccc(-c2cc(N3c4ccccc4-c4ccccc4-c4cc(-c5ccc6c(c5)-c5ccccc5-c5ccccc5N6c5ccccc5)ccc43)cc(-c3ccccc3)n2)cc1]
92
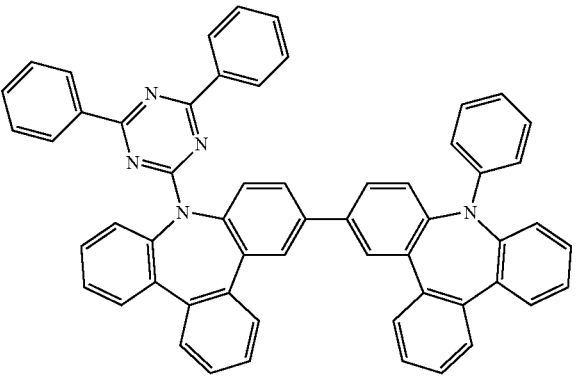
93
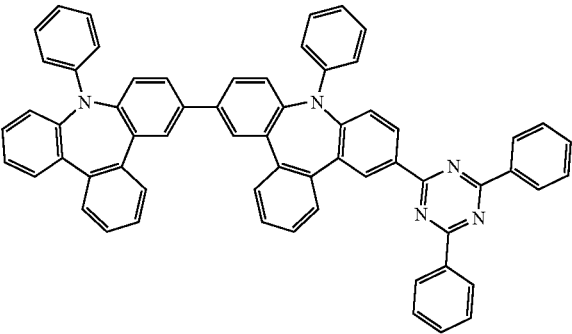

94
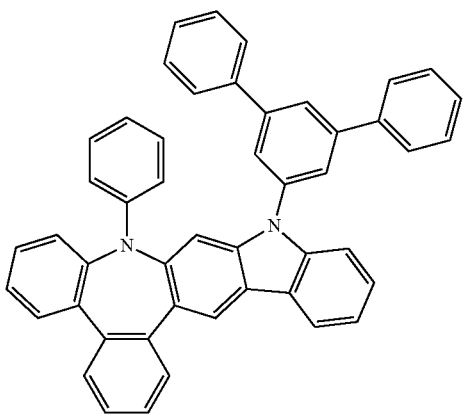
95
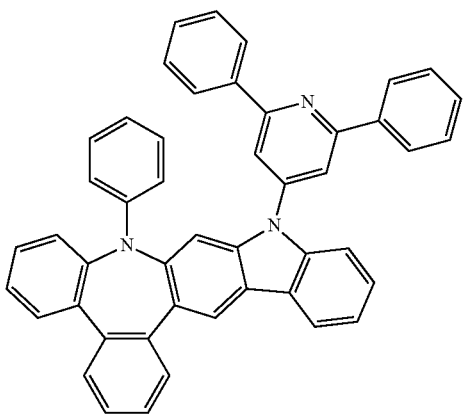
96
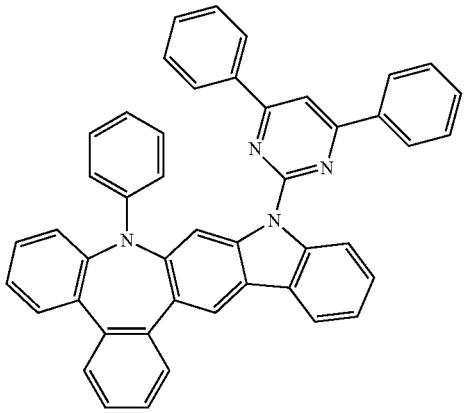
97
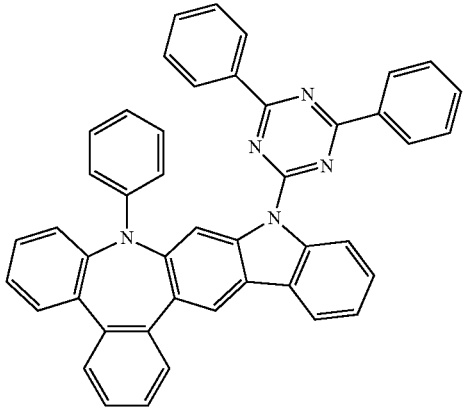
98
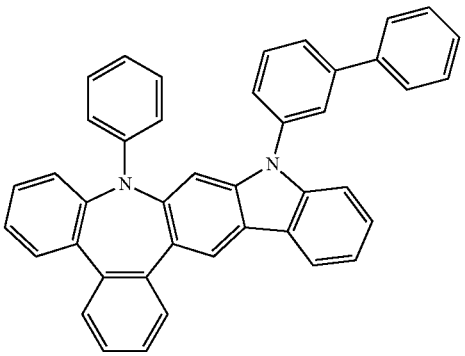
99
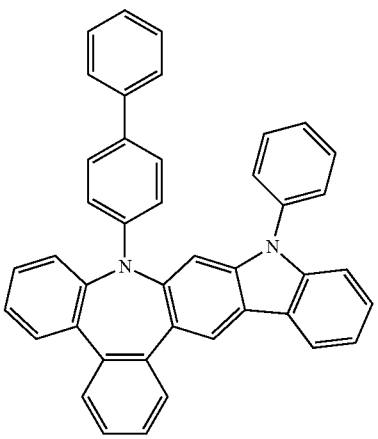
100
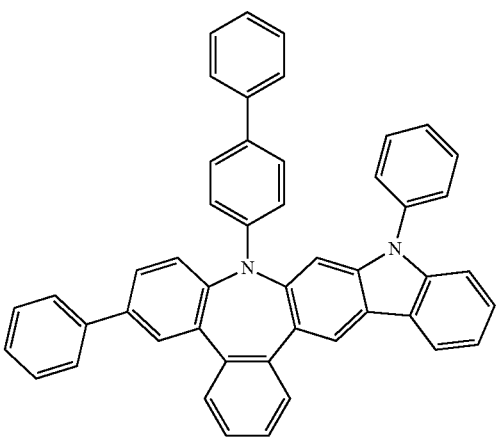
101
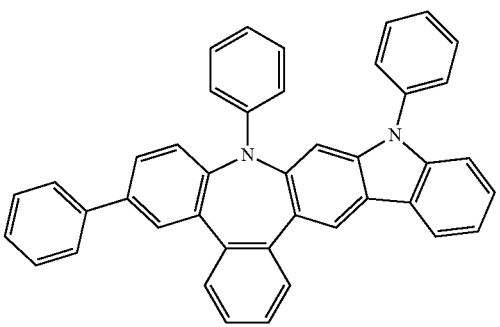

-continued
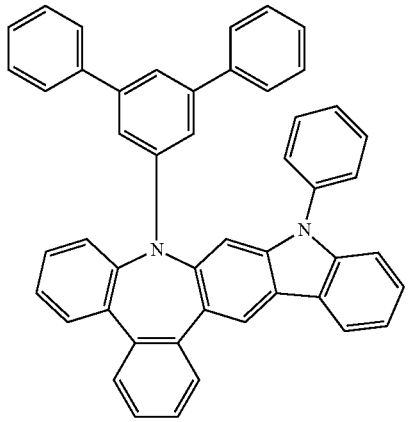
102
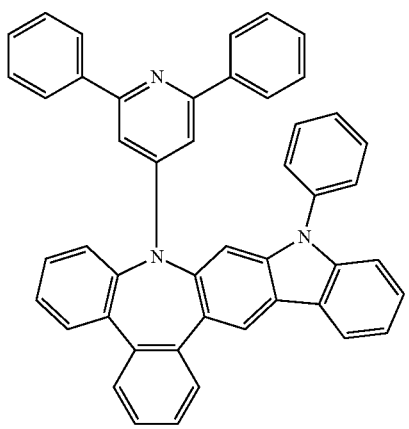
103
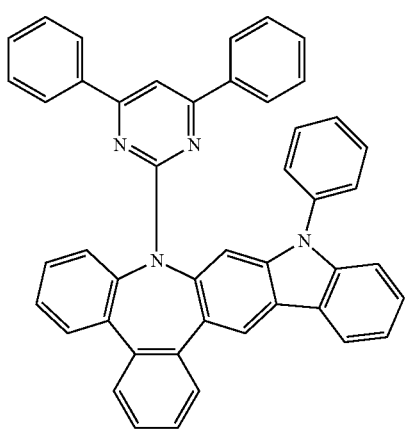
104
-continued
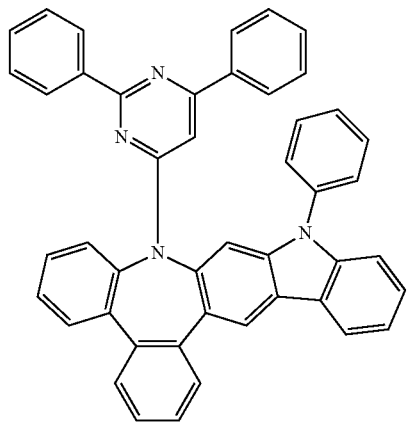
105
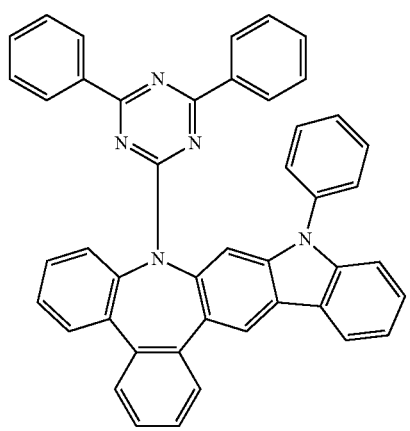
106
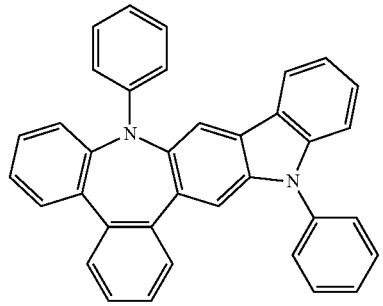
107
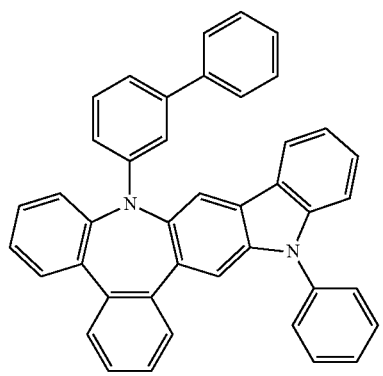
108

211
-continued
109
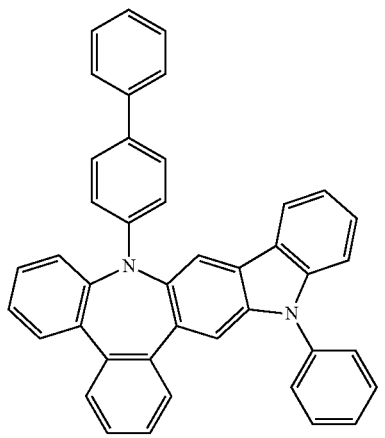
110
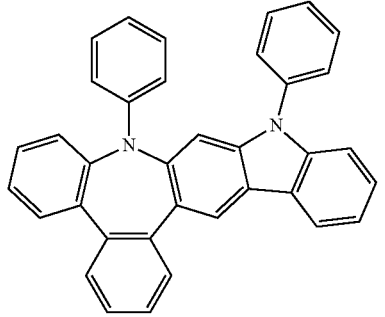
111
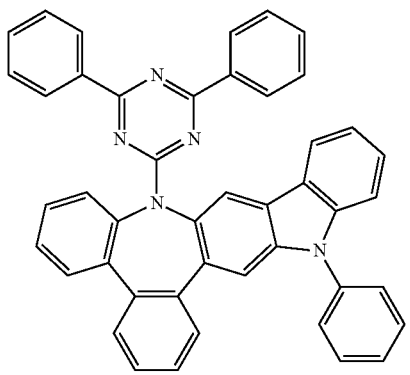
112
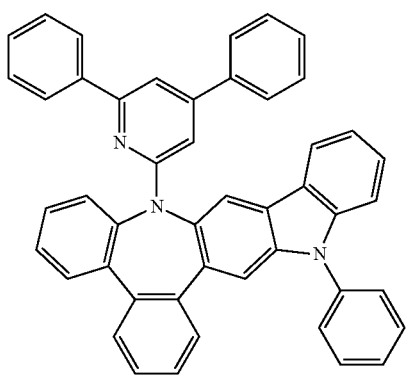
212
-continued
113
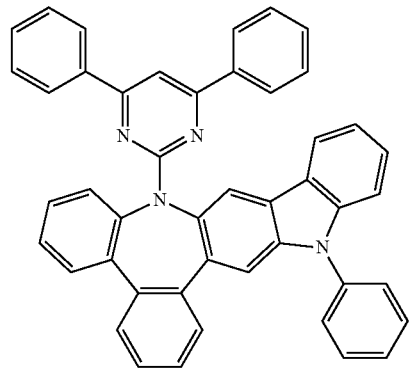
114
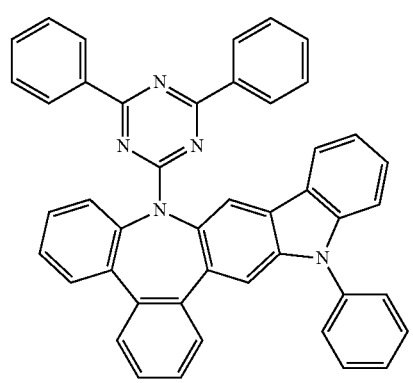
115
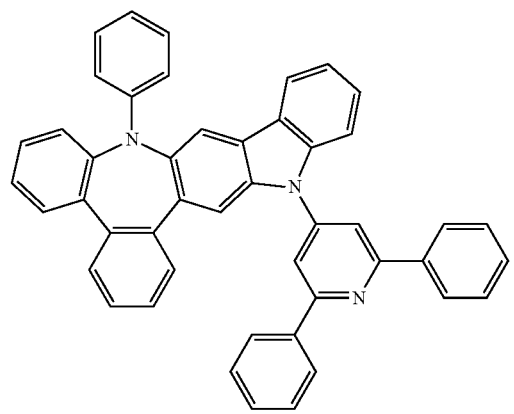
116
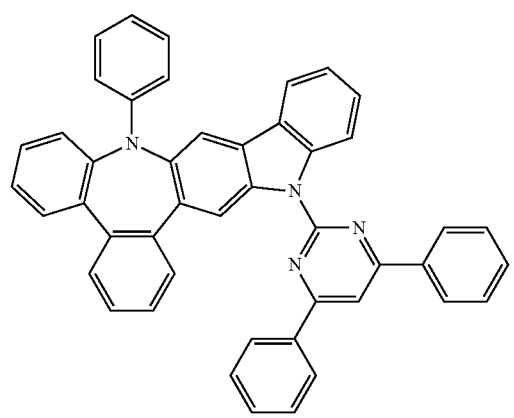

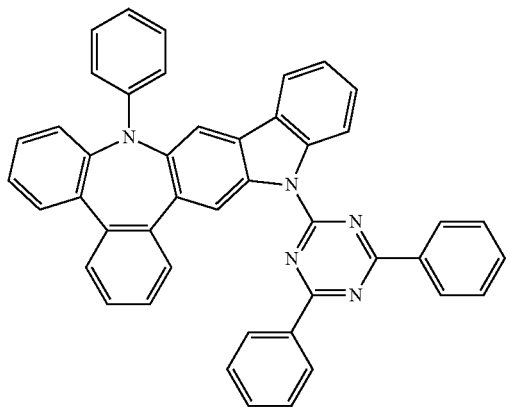

117

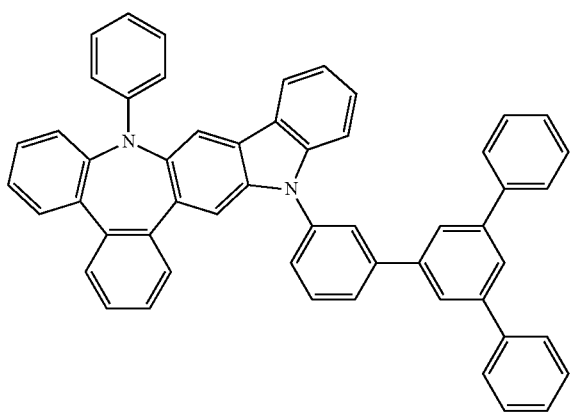

118

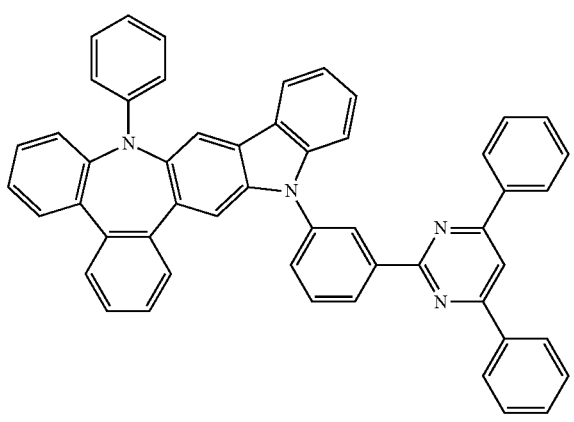

119

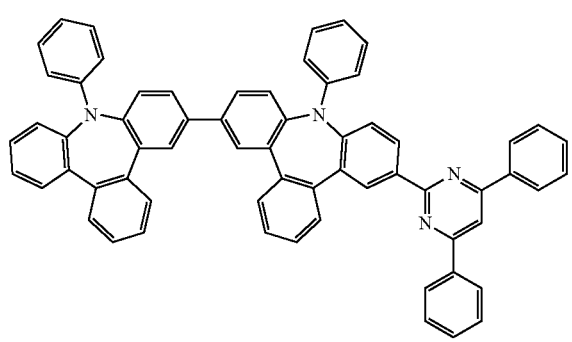

120

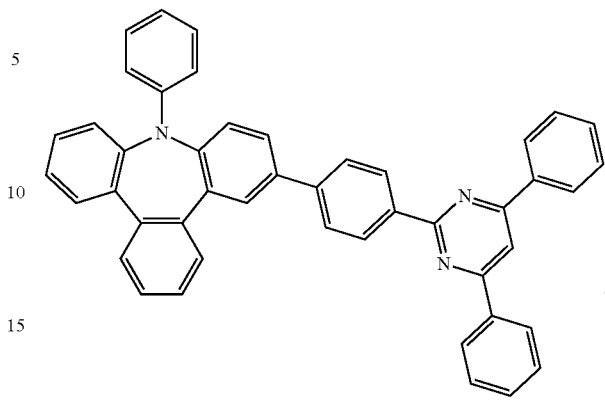

121

11. An organic light-emitting device comprising:
a first electrode;
a second electrode; and
an organic layer disposed between the first electrode and the second electrode,
wherein the organic layer comprises an emission layer and at least one of the condensed cyclic compound represented by one of Formulae 1A to 1D of claim 1.

12. The organic light-emitting device of claim 11, wherein the first electrode is an anode,
the second electrode is a cathode, and
the organic layer comprises
i) a hole transport region disposed between the first electrode and the emission layer,
wherein the hole transport region comprises at least one layer selected from a hole injection layer, a hole transport layer, an electron blocking layer, and a hole transport buffer layer, and
ii) an electron transport region disposed between the emission layer and the second electrode,
wherein the electron transport region comprises at least one layer selected from a hole blocking layer, an electron transport layer, and an electron injection layer.

13. The organic light-emitting device of claim 11, wherein the emission layer comprises at least one of the condensed cyclic compound represented by one of Formulae 1A to 1D.

14. The organic light-emitting device of claim 13, wherein the emission layer further comprises a dopant, and the condensed cyclic compound is a host.

15. The organic light-emitting device of claim 12, wherein the hole transport region comprises at least one of the condensed cyclic compound represented by one of Formulae 1A to 1D.

16. The organic light-emitting device of claim 15, wherein the hole transport region comprises a hole transport layer and a hole transport buffer layer,
the hole transport buffer layer is disposed between the hole transport layer and the emission layer, and
the hole transport buffer layer comprises the condensed cyclic compound.

* * * * *